United States Patent [19]

Loucks et al.

[11] Patent Number: 5,828,576
[45] Date of Patent: Oct. 27, 1998

[54] POWER MONITOR APPARATUS AND METHOD WITH OBJECT ORIENTED STRUCTURE

[75] Inventors: Gregory R. Loucks, Sidney; Chuen Shan Simon Ki, Victoria; Douglas S. Ransom, Victoria; Olaf O.W. Dravnieks, Victoria; David A. Chivers, Victoria; Michael E. Teachman, Victoria; Ronald G. Hart, Victoria, all of Canada

[73] Assignee: CD Power measurement Limited, Canada

[21] Appl. No.: 810,358

[22] Filed: Mar. 3, 1997

Related U.S. Application Data

[62] Division of Ser. No. 369,849, Dec. 30, 1994, Pat. No. 5,650,936.

[51] Int. Cl.$^6$ .......................... G06F 15/00; G01R 21/06
[52] U.S. Cl. .................. 364/483; 364/578; 364/488; 364/489; 395/701; 324/118; 324/119; 324/142; 340/825.06
[58] Field of Search .................. 364/483, 488, 364/489, 578, 580; 395/500, 601, 701; 324/118, 119, 142; 340/825.06

[56] References Cited

U.S. PATENT DOCUMENTS

| | | | |
|---|---|---|---|
| Re. 31,774 | 12/1984 | Fletcher et al. | 324/94 |
| 4,077,061 | 2/1978 | Johnston et al. | 324/76.11 |
| 4,156,280 | 5/1979 | Griess | 327/78 |
| 4,240,149 | 12/1980 | Fletcher et al. | 324/94 |
| 4,345,311 | 8/1982 | Fielden | 324/142 |
| 4,365,302 | 12/1982 | Elms | 324/76.11 |
| 4,388,611 | 6/1983 | Haferd | 327/78 |
| 4,455,612 | 6/1984 | Girgis et al. | 361/80 |
| 4,459,546 | 7/1984 | Arrington et al. | 327/356 |
| 4,463,311 | 7/1984 | Kobayashi | 327/356 |
| 4,568,934 | 2/1986 | Allgood | 340/870.05 |
| 4,612,617 | 9/1986 | Laplace, Jr. et al. | 364/492 |
| 4,642,564 | 2/1987 | Hurley | 324/111 |
| 4,663,587 | 5/1987 | Mackenzie | 324/142 |
| 4,672,555 | 6/1987 | Hart et al. | 324/142 |
| 4,715,000 | 12/1987 | Premerlani | 327/159 |
| 4,783,748 | 11/1988 | Swarztrauber et al. | 324/142 |
| 4,794,369 | 12/1988 | Haferd | 324/141 |
| 4,837,504 | 6/1989 | Baer et al. | 324/74 |
| 4,839,819 | 6/1989 | Begin et al. | 73/862.06 |
| 4,878,142 | 10/1989 | Bergman et al. | 324/509 |
| 4,878,185 | 10/1989 | Brand et al. | 327/94 |
| 4,884,021 | 11/1989 | Hammond et al. | 324/116 |
| 4,901,221 | 2/1990 | Kodosky et al. | 364/221.2 |
| 4,914,568 | 4/1990 | Kodosky et al. | 364/221.2 |
| 4,979,122 | 12/1990 | Davis et al. | 364/481 |
| 5,017,860 | 5/1991 | Germer et al. | 324/74 |
| 5,059,896 | 10/1991 | Germer et al. | 324/115 |
| 5,061,890 | 10/1991 | Longini | 324/103 R |
| 5,081,413 | 1/1992 | Yamada et al. | 324/141 |
| 5,122,735 | 6/1992 | Porter et al. | 324/103 R |
| 5,132,610 | 7/1992 | Ying-Chang | 364/483 |

(List continued on next page.)

*Primary Examiner*—Emanuel Todd Voeltz
*Assistant Examiner*—Hien Vo
*Attorney, Agent, or Firm*—Brinks Hofer Gilson & Lione

[57] ABSTRACT

An object oriented architecture is used within individual monitoring units. The monitoring devices include circuitry which receives an electrical signal and generates at least one digital signal representing the electrical signal. Objects within such individual monitoring units include modules which perform a function and registers which contain the inputs, outputs and setup information for the modules. Methods can be invoked on all objects to change or query the operation or configuration of the device. At least one of the modules receives the digital signal as an input and uses the signal to generate measured parameters. Additional modules take measured parameters as input and generate additional parameters therefrom. The module may be linked in an arbitrary manner to form arbitrary functional blocks.

18 Claims, 56 Drawing Sheets

Microfiche Appendix Included
(4 Microfiche, 302 Pages)

U.S. PATENT DOCUMENTS

| | | | |
|---|---|---|---|
| 5,151,866 | 9/1992 | Glaser et al. | 364/483 |
| 5,155,836 | 10/1992 | Jordan et al. | 364/232.3 |
| 5,212,441 | 5/1993 | McEachern et al. | 324/141 |
| 5,224,011 | 6/1993 | Yalla et al. | 361/80 |
| 5,224,054 | 6/1993 | Wallis | 364/492 |
| 5,233,538 | 8/1993 | Wallis | 364/483 |
| 5,243,536 | 9/1993 | Bradford | 324/142 |
| 5,243,537 | 9/1993 | Neumann | 324/483 |
| 5,245,275 | 9/1993 | Germer et al. | 324/74 |
| 5,247,454 | 9/1993 | Farrington et al. | 364/483 |
| 5,258,704 | 11/1993 | Germer et al. | 324/115 |
| 5,262,715 | 11/1993 | King et al. | 324/107 |
| 5,270,640 | 12/1993 | Kohler et al. | 364/551.01 |
| 5,301,121 | 4/1994 | Gaverick et al. | 324/115 |
| 5,391,983 | 2/1995 | Lusignan et al. | 326/52 |
| 5,414,812 | 5/1995 | Filip et al. | 395/601 |
| 5,426,780 | 6/1995 | Gerull et al. | 395/601 |
| 5,481,700 | 1/1996 | Thuraisingham | 395/601 |
| 5,498,956 | 3/1996 | Kinney et al. | 324/142 |
| 5,498,958 | 3/1996 | Kinney et al. | 324/207.26 |

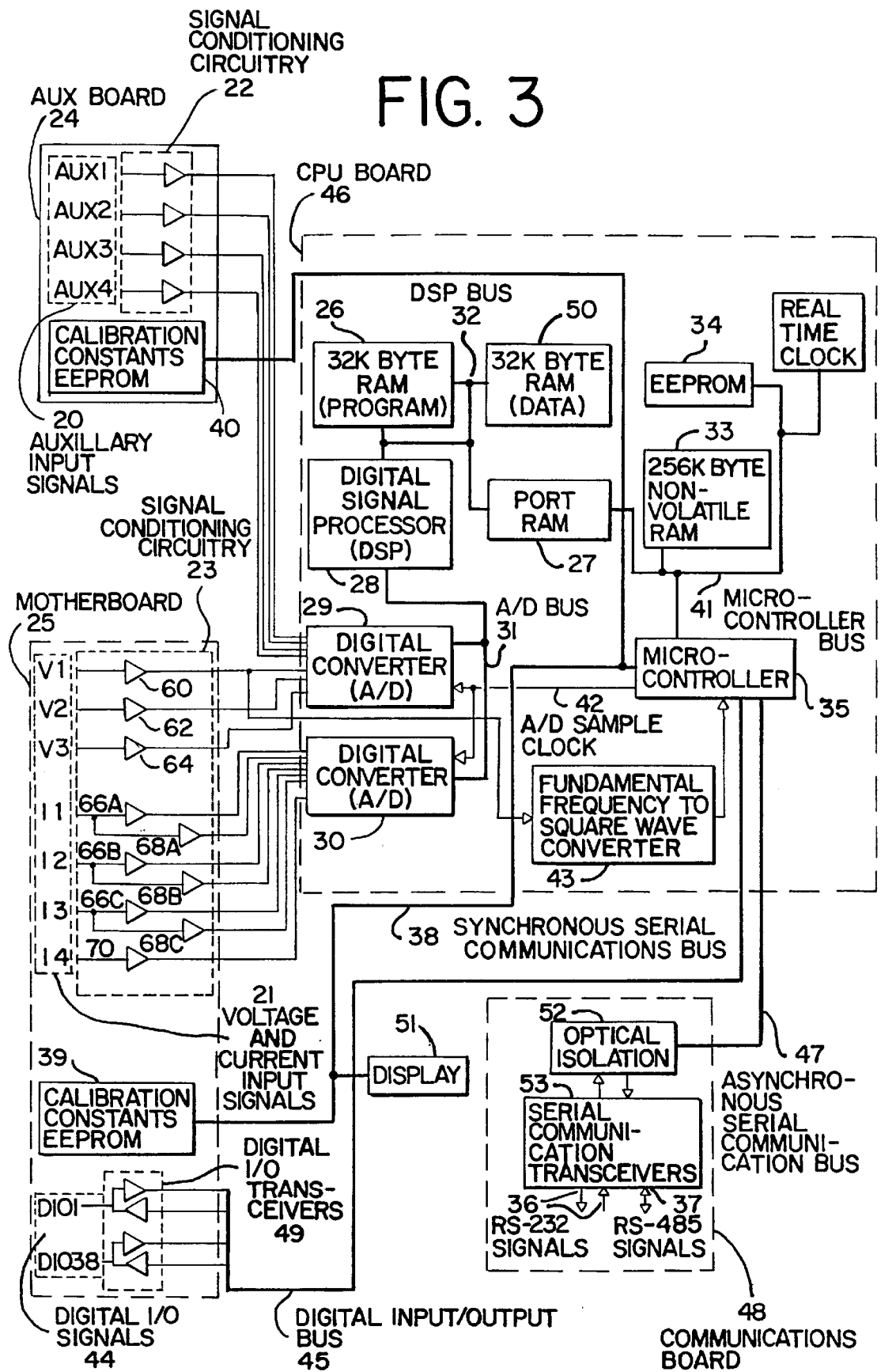

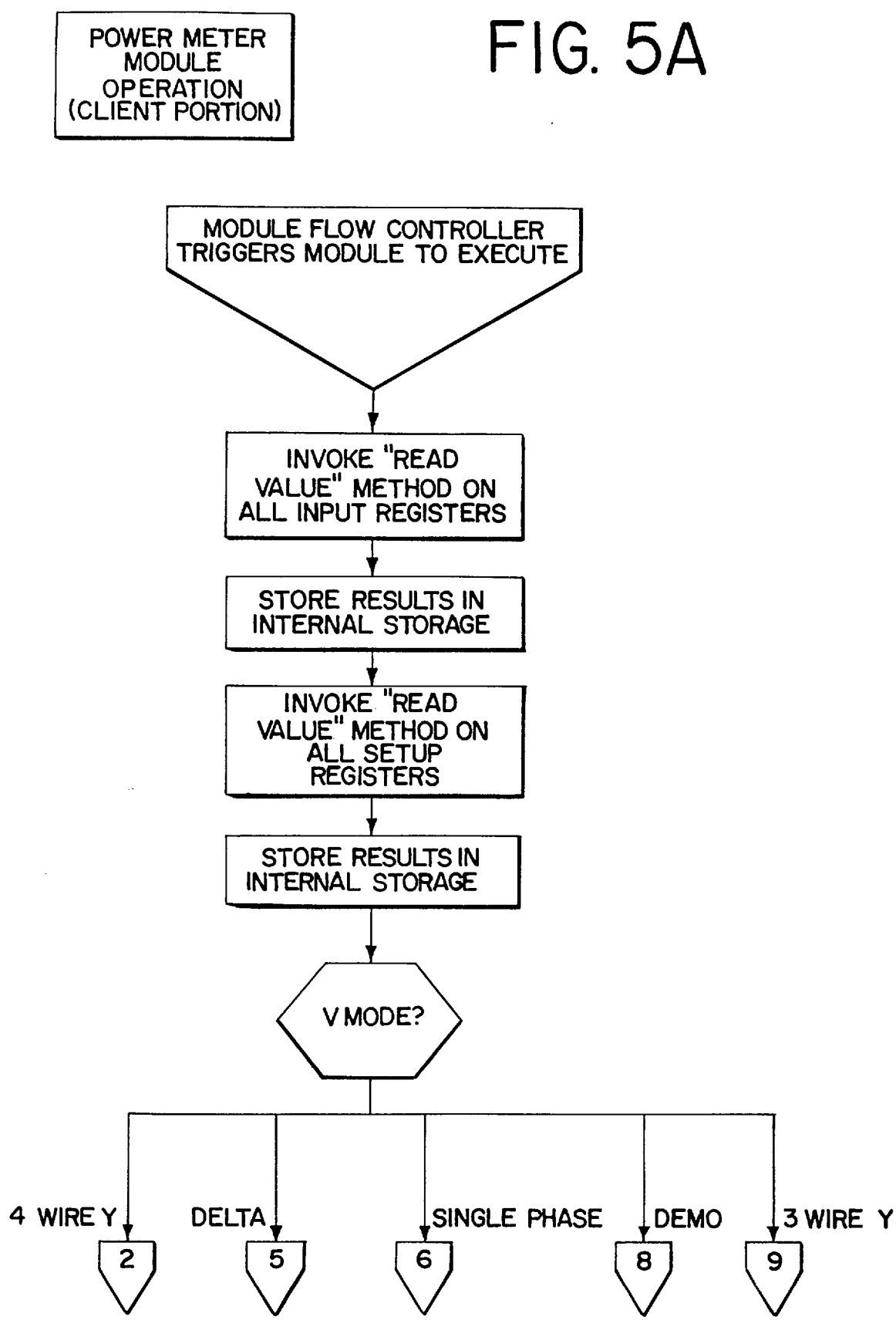

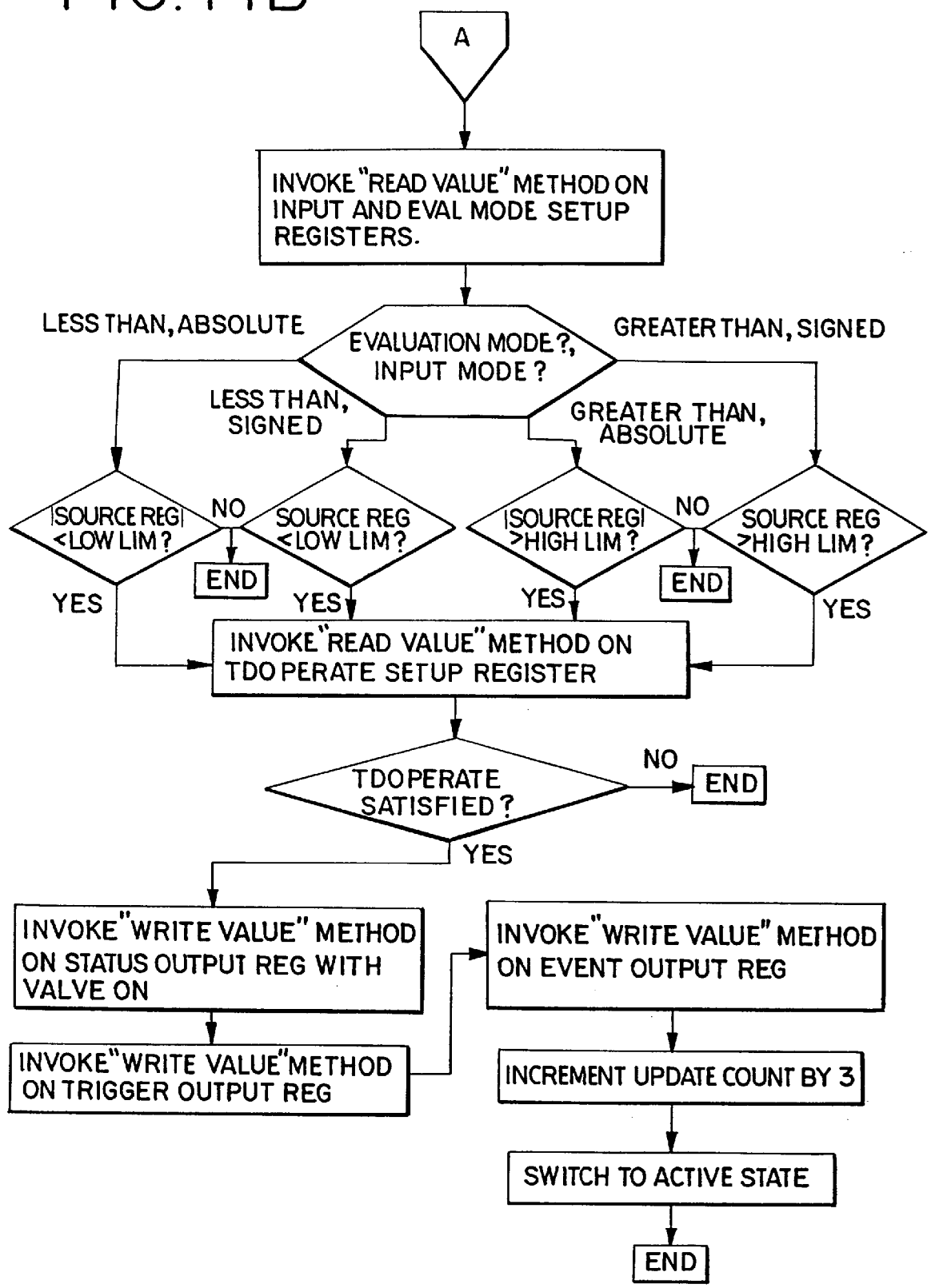

POWER MONITOR APPARATUS AND METHOD WITH OBJECT ORIENTED STRUCTURE

This application is a division of application Ser. No. 08/369,849 filed Dec. 30, 1994 now U.S. Pat. No. 5,650,936.

This application is related to U.S. Pat. application Ser. No. 08/367,534 filed concurrently with this application and entitled "High Accuracy Power Monitor and Method".

MICROFICHE APPENDICES

Included is microfiche Appendix A including three sheet having 282 total frames and microfiche Appendix B including one sheet having 20 total frames.

A portion of the disclosure of this patent document contains material which is subject to copyright protection. The copyright owner has no objection to the facsimile reproduction by any one of the patent disclosure, as it appears in the Patent and Trademark Office patent files or records, but otherwise reserves all copyright rights whatsoever.

BACKGROUND OF THE INVENTION

The present invention relates generally to digital power monitoring. More specifically, the invention relates to a digital power monitoring system using an object oriented structure. The present invention also generally relates to an improved object oriented structure.

Monitoring of electrical power, particularly the measuring and calculating of electrical parameters, provides valuable information for power utilities and their customers. Monitoring of electrical power is important to ensure that the electrical power is effectively and efficiently generated, distributed and utilized. As described in more detail below, knowledge about power parameters such as volts, amps, watts, phase relationship between waveforms, KWH, KVAR, KVARH, KVA, KVAH, power factor, frequency, etc. is of foremost concern for utilities and industrial power users.

Typically, electricity from a utility is fed from a primary substation over a distribution cable to several local substations. At the substations, the supply is transformed by distribution transformers from a relatively high voltage on the distributor cable to the lower voltage at which it is supplied to the end consumer. From the substations, the power is provided to industrial users over a distributed power network which supplies power to various loads. Such loads may be, for example, various power machines.

In such arrangements, utilities need to measure power coming out of the generating station or going into a power station. It is also important to minimize the phase relationship between the current and voltage waveforms of the power being transmitted to minimize losses. Thus, accurate measurement of these waveforms is important.

In industrial applications, it is important to continuously monitor the voltage, current and phase of the power into the machine. These parameters may vary with the machine load. With knowledge of these parameters the industrial user can better adjust, and control the loads to control machines, determine alarm conditions and/or to more efficiently use the power.

Various different arrangements are presently available for monitoring, measuring, and controlling power parameters. Typically, an individual power measuring device which measures specific power system parameters is placed on a given branch or line proximate one of the loads. Such power monitoring devices measure electrical power parameters, such as those described above.

An example of such a system is disclosed in U.S. Pat. No. 5,151,866. In the system disclosed in this patent, a power analyzer system uses discrete analog transducers to convert AC voltage and current signals from a power system to DC output signals. The values from the voltage and the current transducers are then used to calculate the various other desired power parameters.

In addition to monitoring power parameters of a certain load, power monitoring devices have a variety of other applications. For example, power monitoring devices can be used in supervisory control and data acquisition systems (SCADA), process controllers (PLC), etc.

As discussed briefly above, in industrial applications, a plurality of the power monitoring units are placed on the branches of a power distribution system near the loads. The monitoring units are connected through a communication network to at least one central computer. An example of such system is disclosed in Siemens Power Engineering & Automation VII (1085) No. 3, Pg. 169, Microprocessor—Based Station Control System For New And Existing Switchgear, Muller et al.

In fact, many other applications also use a network of devices interconnected through some sort of communication media. Often, the network is composed of a large number of slave devices with a much smaller number of master devices. A master device is any device that can query another device or change the configuration of another device. A slave device is a device that performs a function, and produces results that can be accessed by another device. It is possible for a single device to act as a master and a slave. In the power monitoring system described above, the central computer is the master device and the individual power monitoring units are the slave devices.

The architecture of the slave devices is such that they contain a large number of registers. Some of these registers contain output values from the slave device which can be read by the master and some of these registers contain setup information for the slave device which the master can read or write. The master device must know which registers contain which information for every different slave device. For instance the master device would know that a certain device measures volts and it would know that volts are stored in a particular register. Therefore, in order for the master to retrieve a reading of volts from the slave device it must send a request (communications packet) to the slave device indicating that it requires a packet containing the number in the respective register.

With this approach, the master device(s) must have a large amount of knowledge about the configuration of the remote devices. This requires large amounts of storage space on the master device(s). Also, if the characteristics of a slave device are changed, or a new type of slave device is added, the master device(s) must be reprogrammed. If the slave devices go through a large number of changes, the master device(s) must retain information about the slave devices for all intermediate versions to retain backward compatibility. This further increases the memory and processing power requirement for the master device(s).

In the configuration where the slave device is field programmable, the master device(s) must have some means of determining the slave device's current configuration. In addition the master device(s) must be able to change the slave device's configuration. This invariably means that the master device(s) must know all the possible configurations of the remote device which again increases the memory and processing power required for the master device.

Further, if there are multiple masters changing the configuration of the same slave device, it is difficult for the masters to keep track of the current configuration of the device. Each master has its own local copy of the current configuration of the slave device. When another master changes the configuration of the device, the first master's local copy is not updated. Thus, the first master may think the device is executing a function it no longer is.

If the configuration of a slave device is not configurable or if the slave device has limited configurability, the slave device may be using its available resources (memory and processing power) to perform functions that the user has no interest in. Therefore, the slave device may perform many functions that are not required, but may be missing some functions that are required by a certain user.

Systems are available which use an object oriented approach to program a computer to connect the outputs of a number of remote devices to local functions on the computer and to the inputs of other devices. U.S. Pat. Nos. 4,901,221, 4,914,568 and 5,155,836 disclose such systems where a central digital computer is connected to a number of remote devices. In the systems disclosed in these patents, however, the object oriented structure resides on the central digital computer and all information must travel through the central computer. Therefore, the speed of the system is limited to the speed of the communications channels between the computer and the remote devices and the speed of the computer. Further, although the structure on the computer can be modified through the object oriented architecture the slave devices cannot be easily modified or updated.

Systems are also available which allow reprogramming of a slave device. For example, such a system is disclosed in U.S. Pat. No. 5,155,836. The controlling logic within these devices, however, does not allow the reconfiguration of the device while other functions within the device continue to operate. The user must compile and download firmware in order to implement a different control program. The downloading process interrupts the operation of the device.

Therefore, in view of the above it is a primary object of the present invention to provide a power monitor which can be readily configured to exactly match a user's unique requirements.

It is a further object of the present invention to provide a power monitoring system where it is not necessary to change the software on a master device when a slave device is upgraded.

It is a further object of the present invention to provide a power monitoring system where the storage space memory and/or processing power required for master device(s) is minimized.

It is still a further object of the present invention to provide a power monitoring system where master device(s) can accurately and easily track changes or modifications in the configuration of individual monitoring units devices.

SUMMARY OF THE INVENTION

To achieve these and other objectives, the present invention uses an object oriented architecture within individual digital devices, such as monitoring devices. The monitoring devices include circuitry which receives an electrical signal and generates at least one digital signal representing the electrical signal. Objects within such individual monitoring units include modules which perform a function and preferably registers which contain the inputs, outputs and setup information for the modules. Methods can be invoked on all objects to change or query the operation or configuration of the device. At least one of the modules receives the digital signal as an input and uses the signal to generate measured parameters. Additional modules take measured parameters as input and generate additional parameters therefrom.

In one preferred embodiment, the monitoring device includes transducers which measure voltage and current from a power line.

In another preferred embodiment, a flow controller is used to control the operation of the modules. A feature manager provides a means for accessing the entire device.

Since, the objects reside inside the individual slave devices the communication between the different objects is limited only by the processing speed of the individual monitoring units and not by the speed of the communications media between the devices. With this arrangement the number of slave devices connected to a single master is virtually unlimited since no communication between the devices is required unless a specific request from the user is made.

The operations that the monitoring unit performs are configured by a master device executing methods which instruct the monitoring unit to connect modules to registers. The objects can be programmed and linked in totally arbitrary ways, enabling the user to build arbitrary functional blocks consisting of networks of objects.

Many modifications to the preferred embodiment will be apparent to those skilled in the art. It is the intention of this description to provide an example system using the invention. It is not the intention of this description to limit the scope of the invention.

BRIEF DESCRIPTION OF THE DRAWINGS

FIG. 3 schematically illustrates a preferred embodiment of the internal structure of a power monitoring unit of the present invention.

FIG. 5A–5L show flowcharts of a preferred embodiment of the logic for the client portion of the power meter module.

FIGS. 14A–14C show a flowchart of a preferred embodiment of the logic for the client portion of the setpoint module.

DETAILED DESCRIPTION OF THE PRESENTLY PREFERRED EMBODIMENTS

The present invention comprises a novel system with an object oriented structure. The novel system and architecture are particularly useful for configuring a power monitoring unit to perform given functions and causing the unit to execute those functions.

Figure 1:
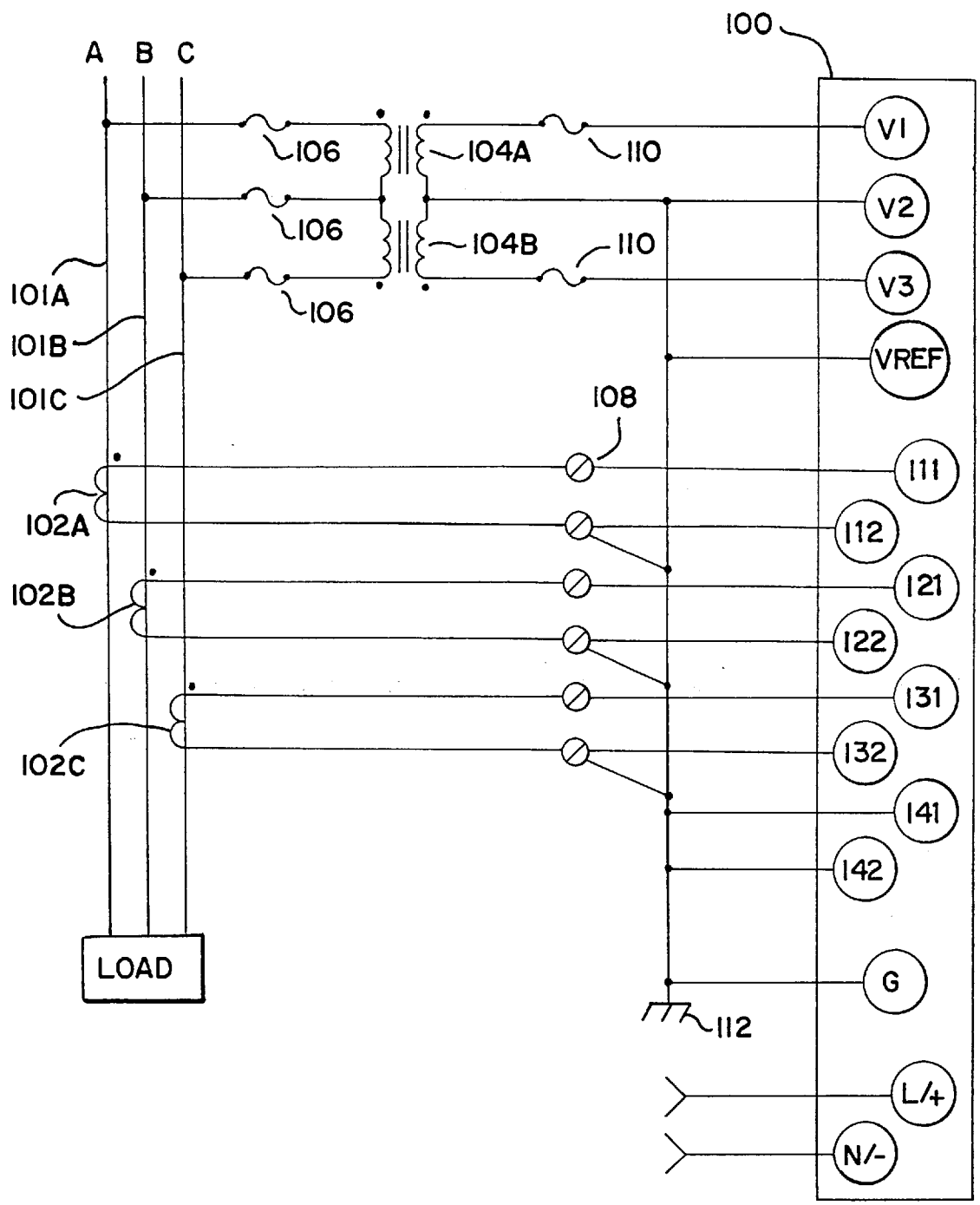
FIG. 1 schematically represents a preferred embodiment of a system using a power monitoring unit of the present invention.

FIG. 1 schematically illustrates how a power monitoring unit 100 using the present invention is connectable to a three wire power line. Three current transducers (CTs) 102A, 102B and 102C are connected to wires 101A, 101B and 101C of the power line, respectively. Potential transducers (PTs) 104A and 104B are connected between lines 101A, 101B and 101B, 101C, respectively. A plurality of fuses 106 are disposed between the lines 101A–101C and Pts 104A and 104B. Fuses 110 are connected between Pts 104A and 104B and unit 100.

The CTs 102A–102C are connected through a shorting switch or test block 108 to the power monitoring unit 100. The CTs 102A–102C provide the power monitoring unit 100 with current inputs I11–I32. The PTs 104A and 104B provide the power monitoring unit 100 with voltage inputs V1–V3. Current inputs I41 and I42, chassis ground 112 and voltage input VREF are connected to ground potential. The unit 100 is connected to a power supply, such as a standard 120 V AC supply, through power leads L and N.

Figure 2:
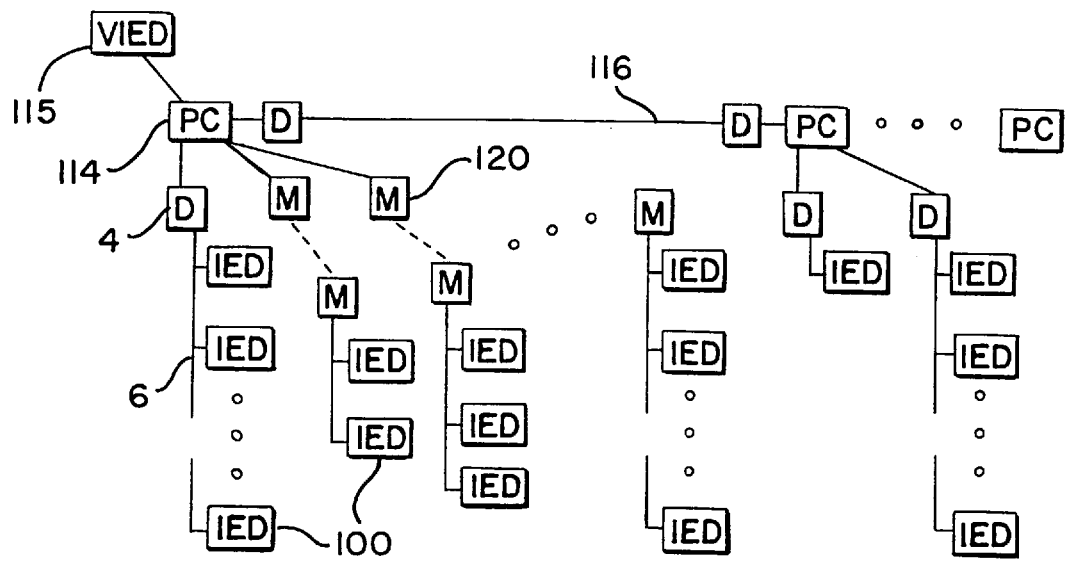
FIG. 2 schematically illustrates a preferred embodiment of a physical layout of a preferred embodiment of a system of the present invention.

FIG. 2 shows a preferred embodiment of the physical layout of a plurality of monitoring units 100 in a system using the present invention. The system comprises one or more personal computers (PCs) 114 which are used as master devices. A plurality of monitoring units 100 configured as intelligent electronic devices (IEDs) are used as slave devices. Virtual intelligent electronic devices (VIEDs) 115 which reside in software on the personal computer 114 can also serve as slave devices. All devices in the system are interconnected through a communication network 116. The network may be directly connected to devices or may connect through other communications devices such as modems 120. Preferably, the IEDs, PCs and VIEDs all have an object oriented architecture as described in detail below.

To fully appreciate the present invention, an understanding of the principals of basic object oriented structures is necessary. Therefore, a brief description of the type of architecture is given here. (A more detailed discussion of the principles of object oriented structures is given in "SMALLTALK-80 The Language And Its Implementation," Goldberg and Robson, 1983 (from which some of the following definitions are taken)). An object consists of some private memory and a set of operations. An object has state, behavior and identity. The nature of the object's operations depends on the type of component it represents. For example, objects representing numbers compute arithmetic functions, and objects representing data structures store and retrieve information. A key component of object oriented architecture is encapsulation. Encapsulation is the process of hiding all of the details of an object, as well as the implementation of its methods. In an object oriented system, in order for an object to carry out one of its operations, a request must be made which specifies which operation is desired. The request is called a "message". Importantly, because of encapsulation in object oriented architecture, the message does not specify how that operation is to be carried out. The "receiver", the object to which the message was sent, determines how to carry out the requested operation. The set of messages to which an object can respond is called its "interface" with the rest of the system. The only way to interact with an object is through its interface. A crucial property of an object is that its private memory can be manipulated only by its own operations. Messages are the only way to invoke an object's operations. These properties ensure that the implementation of one object cannot depend on the internal details of other objects, only on the messages to which they respond.

Messages ensure the modularity of the system because they specify the type of operation desired, but not how the operation should be accomplished.

Other important components of object oriented architecture are "classes" and "instances". A class describes the implementation of a set of objects that all represent the same kind of component. The individual objects described by a class are called its instances. A class describes the form of its instances' private memories and it describes how they carry out their operations. Even an object that represents a unique component is implemented as a single instance of a class. The instances of a class are similar in both their public and private properties. An object's public properties are the messages that make up its interface. All instances of a class have the same message interface since they represent the same kind of component. An object's private properties are a set of instance variables that make up its private memory and a set of methods that describe how to carry out its operations. The instance variables and methods are not directly available to other objects. The instances of a class all use the same set of methods to describe their operation.

Each method in a class tells how to perform the operation requested by a particular type of message. When that type of message is sent to any instance of the class, the method is executed. A class includes a method for each type of operation its instances can perform. The method may specify some changes to the object's private memory and/or some other messages to be sent. A method also specifies a value that should be returned. An object's methods can access the object's own instance variables, but not those of any other objects.

Another important aspect of the objects within the device is that they are independent or autonomous. In other words, any change in the configuration of one object on a slave by a master device does not affect the operation of the other objects on the slave device (or any objects on the master device).

Referring now to FIG. 3, a preferred embodiment of the internal structure of an IED 100 is illustrated.

As described in more detail below, the IED's 100 are run by an object oriented structure. The electrical signals (i.e. the voltage and current) from the power lines are used by a detector to generate digital signals which represent the electrical signals. In the illustrated embodiment, the detector is comprised of the CTs 102, PTs 104, conditioning circuitry and A/D converters, as described more fully below. Three-phase voltage and current input signals V1–V3 and I1–I4 from electric power lines enter the motherboard 25 and are converted to voltage levels compatible with the analog to digital converters (A/Ds) 29 and 30 by signal conditioning circuitry 23. In an exemplary embodiment a suitable A/D convertor is a 13 bit, 7 input one available from National Semiconductor as model No. LM12458. A suitable voltage to the A/D's 29 and 30 ranges from 0 to 5 Volts depending on what part of the AC signal the sample is taken at and the level of the AC signal.

In the illustrated embodiment, the signal conditioning circuitry comprises operational amplifiers (op amps) 60, 62 and 64 and associated circuitry which amplify V1, V2 and V3 respectively. The currents I1, I2, and I3 are amplified by two different scales to provide greater dynamic range. The amplification to the two different scales is implemented using the conditioning circuitry 23. Op amps 66A, 66B and 66C amplify input current signals I1, I2 and I3, respectively, to a first scale. For example, a current of 5 Amperes AC creates a voltage of 4 Volts AC to the A/D converter. Op amps 68A, 68B and 68C amplify input current signals I1, I2 and I3, respectively to a second scale. For example, a current of 100 Amperes AC creates a voltage of 4 Volts AC to the A/D converter. The voltage and current signals enter separate A/Ds 29 and 30 so that the voltage and current on a particular phase can be simultaneously sampled. Auxiliary Input Signals 20 on the AUX board 24 also pass through signal conditioning circuitry 22 and to A/D 29. Auxiliary inputs allow the user to sample additional signals in addition to the three-phase voltage and current. For example, the auxiliary inputs may be 0 to 10 Volts DC outputs from a temperature transducer.

A digital signal processor (DSP) 28 reads the samples from the A/D converters 29, 30 through the A/D Bus 31. The signals are preferably sampled at the rate of 128 samples per line frequency cycle. The DSP performs a Fast Fourier Transform (FFT) on the samples to determine the frequency components of the signal in a manner known in the art. It also calculates Root Mean Square (RMS) voltage and/or current for each input signal. This data is then transferred through dual port RAM 27 to the microcontroller 35. A suitable DSP is a 4K byte RAM available as a TMS320C25 available from Texas Instruments.

The microcontroller 35 performs many functions within the IED. The fundamental frequency to square wave converter 43 provides a square wave at the fundamental frequency of the incoming voltage signals. A suitable fundamental frequency to square wave converter is an LM311D available from National Semiconductor configured in a manner known in the art. A time processing unit (TPU) within the microcontroller 35 measures this frequency and multiplies it by a predetermined value, such as 128. The TPU creates an A/D sample clock 42 at this new frequency so that the A/Ds sample at 128 samples per cycle. A suitable microcontroller is a MC68332ACFC16 available from Motorola.

Different AUX boards 24 and motherboards 25 can be exchanged with different CPU Boards 46. This, however presents a calibration problem. In the system of the present invention, the calibration information for the circuitry 22, 23 of each AUX or motherboard is preferably stored on the individual board. A suitable EEPROM in a 93LC56 available from Microchip. This is implemented by storing the information in calibration constants EEPROM 39, 40 on each individual board. The microcontroller 35 then reads the information using the synchronous serial communications bus 38 before performing calculations on the values received through the dual port RAM 27 from the DSP 28. The synchronous serial communications bus 38 is also used to communicate with the display 51. Results of all calculations and control functions of the microcontroller 35 can be displayed on the display.

The IED 100 connects to the network 116 through the communications board 48. The microcontroller 35 sends and receives information over the serial communications bus 47.

A further description of a preferred embodiment of the present invention and its operation is given in U.S. Pat. application Ser. No. 08/367,534 filed concurrently with this application and entitled "High Accuracy Power Monitor and Method" which is incorporated herein by reference.

FIGS. 4, 5, 6, 7, 8 and 9 show how the auxiliary input signals 20, the voltage and current input signals 21, and the digital I/O signals 44 may be represented in the object oriented structure of this invention. In an exemplary embodiment, in the IED 100 the logic or code is implemented in firmware and in the PC the code is implemented in software. It will, of course, be recognized by those skilled in the art that the logic for the IED 100 can also be implemented in software and that the logic in the PC can be implemented in firmware. In the present embodiment, the firmware is implemented using a 512 K byte flash EEPROM 34 available from Intel as a 28F010 EEPROM. In an exemplary embodiment, the software is written in the C programming language. An exemplary embodiment of the logic for the object oriented architecture of the present invention in object code is given in microfiche Appendix A which is incorporated herein by reference. The object code is presented in Srecord format which is defined in the M68332BUG Debug Monitor User's Manual (Motorola 1990) which is incorporated herein by reference. More detailed schematics for the presently preferred embodiment are given in microfiche Appendix B which is incorporated herein by reference.

Figure 10:
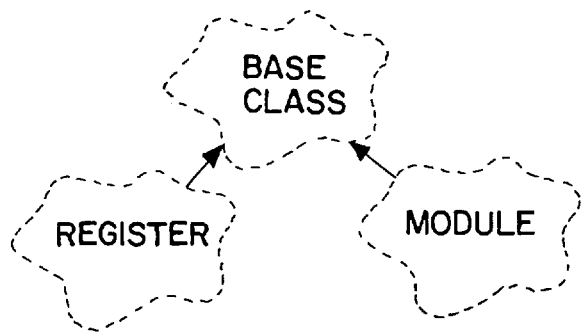
FIG. 10 schematically illustrates the inheritance of the registers and modules.
Figure 10A:
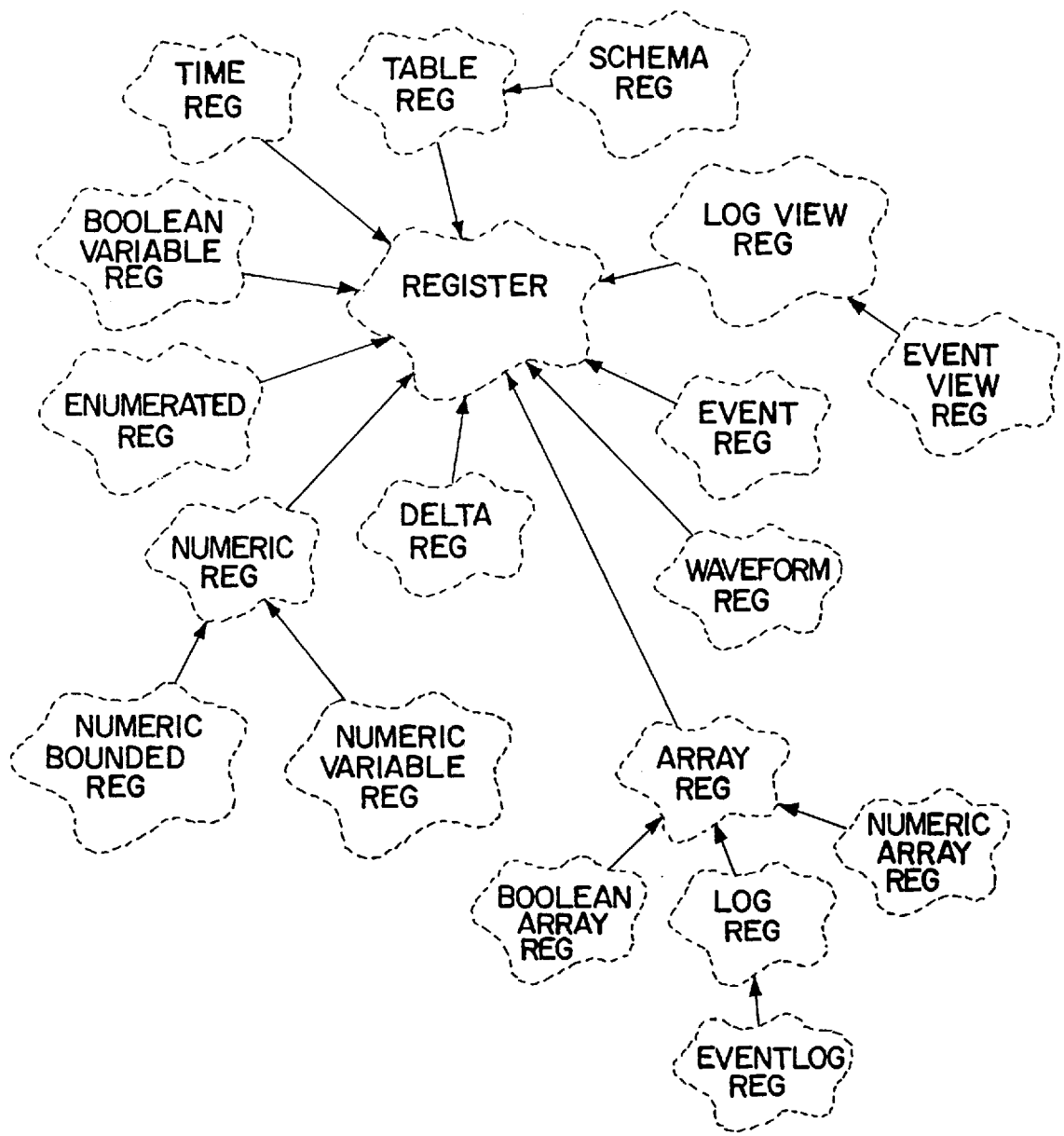
FIG. 10A schematically illustrates the inheritance of some of the registers.
Figure 10B:
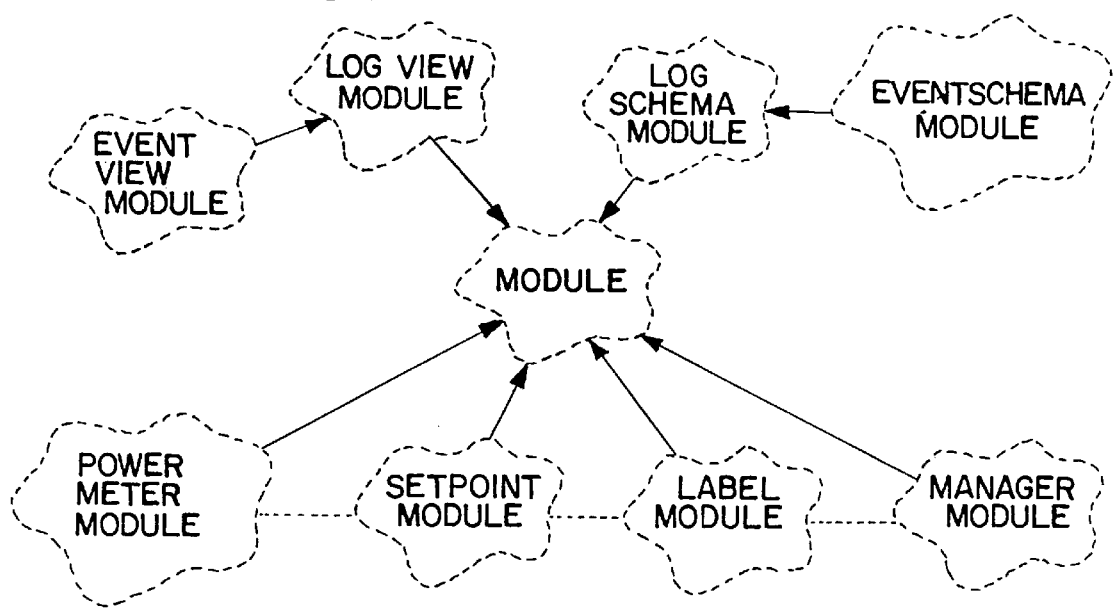
FIG. 10B schematically illustrates the inheritance of some of the modules.

In the system of the present invention, two fundamental classes exist for objects: 1) registers and 2) modules. Both the registers and modules are derived from a common base class (class=1). The registers are passive data storage objects containing a single value, an array or structure. Registers behave only as "servers" in the architecture. A "server" is defined as an entity which can respond to method invocations. A "client", on the other hand, is an entity which can invoke a method on a server. Modules behave both as client and server. The client portion of the module contains the active components that perform the various tasks within the device. The inheritance of the registers and modules is shown in FIG. 10. An inheritance diagram for some of the registers is shown in FIG. 10A. An inheritance diagram for some of the modules is shown in FIG. 10B. Data passing between objects is accomplished using method invocation using "types," where types define the semantics for passing data between objects. A method is invoked by a "client" sending a message to another object. This message contains a "method" and may contain a "value". Every method in an object has a security level. Any methods which are invoked with a level less than the security level for that method will fail. The system also has the following set of rules of operation which must be followed by objects:

1. All data passed to or from an object must have a Type.
2. Modules must be owned by a module, with the exception of the root module, which has no owner.
3. Registers must be owned by a module.
4. Behavior of servers will be consistent for multiple clients.
5. A server portion of a object cannot access the server portion of another object.
6. A client portion of an object cannot access the client portion of another object.
7. Any register or module cannot be destroyed if it is owned by any module.

Figure 10C:
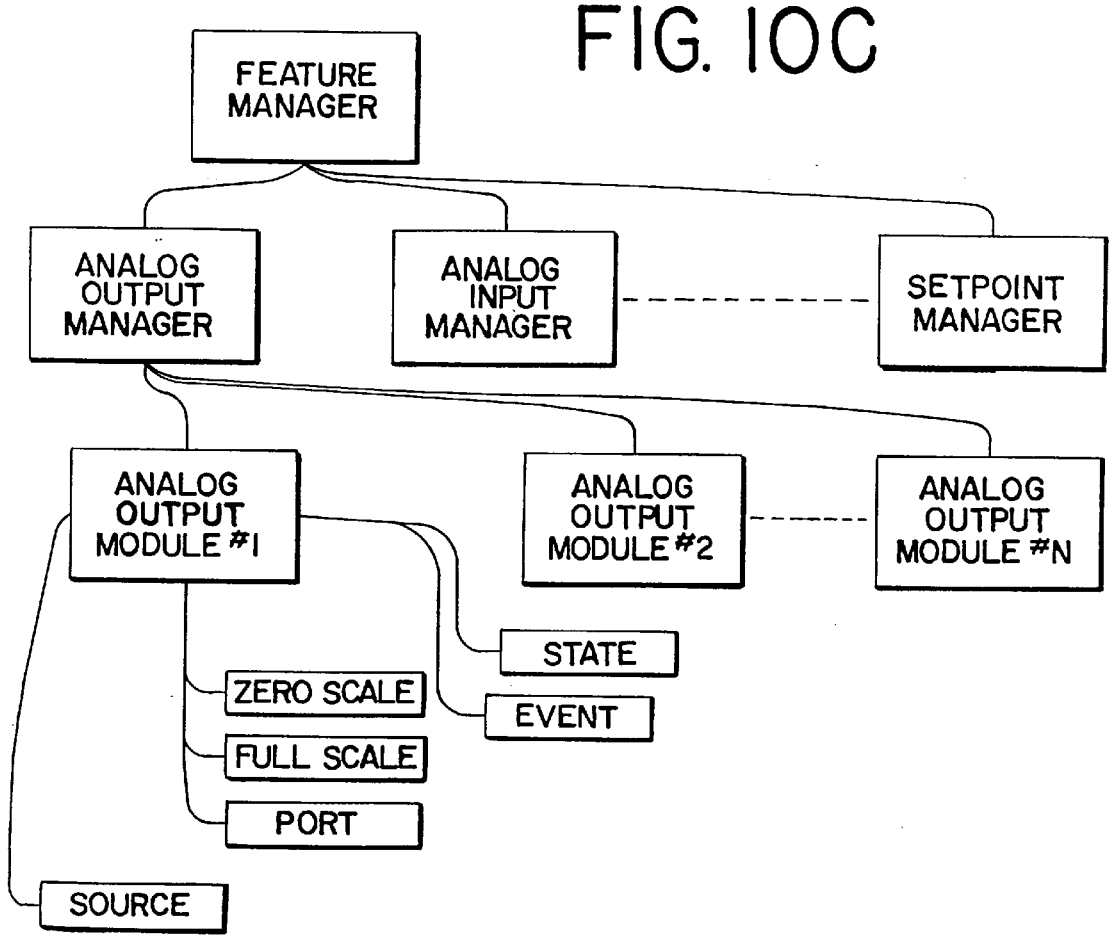
FIG. 10C illustrates a hierarchical structure.

The system also has a hierarchy. As used herein a hierarchy means that every manager, module and register can be accessed by starting at the top of the hierarchy. This concept can be seen pictorially by referring to FIG. 10C. In this figure modules or registers that appear as setup registers are connected to the bottom of the modules or managers with a line. Registers that appear as output registers are connected with lines to the right side of the modules and registers that appear as input registers are connected with lines to the left of the modules.

Certain semantics are needed for passing information to and from modules and registers. Here these semantics are defined by "Types". Table A provides the Types defined in the presently preferred embodiment.

TABLE A

The Types describe the semantics for passing information to and from modules and registers.

| Type Name | Type equivalence | Restrictions | Description |
| --- | --- | --- | --- |
| VoidType | fundamental Type | | Has no semantic value. |
| SignedType | fundamental Type | Maximum size = 32 bits. | Defines a signed value. |
| UnsignedType | fundamental Type | Maximum size = 32 bits | Defines an unsigned value. |
| CharType | fundamental Type | Maximum size = 32 bits. | Defines a character value. Supports wide characters as well as ASCII. |
| BooleanType | fundamental Type | Size = 1 bit. | Defines a Boolean value. Value may be TRUE or FALSE. |
| FixedPointType | fundamental Type | Maximum size = 64 bits. | Defines a fixed point value. |
| FloatType | fundamental Type | Size = 32, 64, or 80 bits. | Defines a floating point value. |
| ComplexType | fundamental Type | Maximum size = TBA. | Defines a complex value. |
| DeltaType | fundamental Type | Size = 0 bits. | The value represents a |

TABLE A-continued

The Types describe the semantics for passing information to and from modules and registers.

| Type Name | Type equivalence | Restrictions | Description |
|---|---|---|---|
| | | | delta-function pulse. |
| RealType | define union RealType = <br> SignedType \| <br> UnsignedType \| <br> CharType \| <br> BooleanType \| <br> FloatType \| <br> FixedPointType. | | Defines a real value. |
| NumericType | define union <br> NumericType = <br> RealType \| <br> ComplexType. | | Defines a numeric value. |
| SignedArrayType | define array <br> SignedArrayType = <br> {SignedType 'value$_i$'}. | | Defines an array of signed values. |
| UnsignedArrayType | define array <br> UnsignedArrayType = <br> {UnsignedType 'value$_i$'}. | | Defines an array of unsigned values. |
| CharArrayType | define array CharArrayType = <br> {CharType 'char$_i$'} | | Defines an array of characters. |
| BooleanArrayType | define array <br> BooleanArrayType = <br> {BooleanType 'value$_i$'}. | | Defines an array of Boolean values. |
| FixedPointArrayType | define array <br> FixedPointArrayType = <br> {FixedPointType 'value$_i$'}. | | Defines an array of fixed point values. |
| FloatArrayType | define array FloatArrayType = <br> {FloatType 'value$_i$'}. | | Defines an array of floating point values. |
| ComplexArrayType | define array <br> ComplexArrayType = <br> {ComplexType 'value$_i$'}. | | Defines an array of complex values. |
| NumericArrayType | define union <br> NumericArrayType = <br> SignedArrayType \| <br> UnsignedArrayType \| <br> CharArrayType \| <br> BooleanArrayType \| <br> FixedPointArrayType \| <br> FloatPointArrayType \| <br> ComplexArrayType. | | Defines an array of numeric values. |
| ArrayUnsignedArrayType | define structure <br> ArrayUnsignedArrayType = <br> {UnsignedArrayType <br> 'us_array$_i$'}. | | Structure defines an array of UnsignedArrayTypes. |
| StringType | define StringType = <br> CharArrayType. | must be null terminated. | Defines a character string (null-terminated). |
| StringArrayType | define structure <br> StringArrayType = <br> {CharArrayType 'string$_i$'}. | | Defines an array of strings. |
| SizeType | define SizeType = <br> UnsignedType. | | An unsigned integral value which is used for defining a size parameter (e.g. size of array, #records). |
| CounterType | define CounterType = <br> UnsignedType. | | An unsigned integral value which can be incremented (by 1 or more), decremented (by 1 or more), and cleared to 0. |
| IndexType | define IndexType = <br> UnsignedType. | | An unsigned integral value which is used to index arrays. |
| TimeType | define TimeType = <br> NumericType. | | Universal Time (GMT) in seconds. |
| ReasonType | define ReasonType = <br> CharArrayType. | | The reason for an exception. |
| ExceptionType | define structure ExceptionType = <br> UnsignedType <br> exception_cause. <br> Type <br> 'exception_value' <br> [ReasonType 'reason']. | | An exception returns a code and value. A reason string is optional. <br> The valid codes are: <br> 0 = underflow <br> 1 = overflow |

TABLE A-continued

The Types describe the semantics for passing information to and from modules and registers.

| Type Name | Type equivalence | Restrictions | Description |
|---|---|---|---|
| | | | 2 = not_valid<br>3 = not_supported<br>4 = not_available<br>5 = invalid_method<br>6 = loss_of_precision.<br>7 = internal_error |
| MethodType | define<br>MethodType = UnsignedType. | | The value represents (numerically) the particular method of an Object. |
| ClassType | define ClassType =<br>UnsignedType. | | The value represents (numerically) a particular class (such as Numeric Register or PowerMeter Module). |
| NodeHandleType | define union NodeHandleType =<br>   StringType  |<br>   UnsignedType. | | An address to a remote IED site. |
| ExtendedHandleType | define structure<br>   ExtendedHandleType =<br>   [NodeHandleType'node']<br>   UnsignedType  'handle'. | | Defines a handle used to reference an object on another IED. |
| HandleType | define union HandleType =<br>   UnsignedType  |<br>   ExtendedHandleType. | | The value represents the address of an object. |
| ExtendedHandleArrayType | define structure_array<br>   ExtendedHandleArrayType =<br>   (ExtendedHandle 'value$_i$'}. | | The value is an array of Extended Handles. |
| HandleArrayType | define union HandleArrayType=<br>   ExtendedHandleArrayType  |<br>   UnsignedArrayType. | | The value is an array of handle values. |
| PriorityType | define<br>PriorityType = UnsignedType. | Priorities range from 0 to 255 | The value represents an priority. Guidelines for priorities are as follows:<br>Urgent   192 to 255<br>High   128 to 191<br>Medium   64 to 127<br>Low   0 to 63 |
| RangeType | define structure RangeType=<br>   IndexType<br>   'range_start'<br>   IndexType<br>   'range_end'. | | defines a range of values that starts at index range_start and ends at index range_end. This is useful in log situations. |
| EventType | define structure EventType =<br>   PriorityType  'priority'<br>   UnsignedType<br>   'event_state'<br>   HandleType<br>   'cause_handle'<br>   IONType<br>   'cause_value'<br>   HandleType<br>   'effect_handle'<br>   IONType<br>   'effect_value'. | | Defines a structure for an event.<br>Values for event_state are:<br>0 = unary state event.<br>1 = Active transition for bi-state event.<br>2 = Inactive transition for bi-state event.<br>3 = Label change event. |
| LogHeaderType | define<br>LogHeaderType = HandleArrayType. | | Structure defines the header for a general purpose log record. |
| LogRecordType | define structure LogRecordType =<br>   IndexType  'position'<br>   TimeType<br>   'timestamp'<br>   {Type  'value$_i$'}. | | Structure defines the data values in a general purpose log record. |
| LogArrayType | define structure_array<br>   LogArrayType =<br>   (LogRecordType 'logrec$_i$'}. | | Array of log records. |
| WaveformType | define structure<br>   WaveformType =<br>   NumericType<br>   'sampling_frequency'<br>   NumericType  'offset'<br>   NumericType  'scale'<br>   TimeType<br>   'time_of_first_point'. | | Defines a structure for a waveform.<br>Note:<br>plotted value = (data point + offset) * scale. |

TABLE A-continued

The Types describe the semantics for passing information to and from modules and registers.

| Type Name | Type equivalence | Restrictions | Description |
| --- | --- | --- | --- |
| AlarmType | NumericArray 'points'.<br>define structure AlarmType =<br>HandleType<br>'effect_handle'<br>CounterType<br>'transitions'<br>PriorityType 'priority'. | | Structure for alarms:<br>When parameter<br>Transitions is odd the<br>alarm is active. |
| AlarmArrayType | define structure_array<br>AlarmArrayType =<br>(AlarmType 'alarm$_i$'}. | | Array of alarms. |
| SecurityType | define<br>SecurityType - UnsignedType. | | Value represents a<br>security level.<br>The following security<br>levels are defined:<br>1 = no_access<br>16 = user (R/O)<br>32 = user (R/W)<br>48 = configurer (can<br>create/destroy<br>modules)<br>64 = system<br>administration (can<br>change security<br>levels).<br>80 = highest level<br>(factory—i.e. cal<br>constants) |
| MethodSecurityType | define structure<br>MethodSecurityType =<br>MethodType 'method'<br>SecurityType 'security'. | | Assigns a security level<br>to a method. |
| MethodSecurityArray<br>Type | define structure_array<br>MethodSecurityArrayType =<br>{MethodSecurityType<br>'methsec$_i$'}. | | Array of method<br>security. |
| CompositeLogRecord | define structure<br>CompositeLogRecord =<br>UnsignedType<br>'record_type'<br>HandleType 'handle'<br>LogHeaderType 'header'<br>[StringArrayType 'labels']<br>LogArrayType 'records'. | | This is the complete<br>description of a log<br>record.<br>Note :- the position field<br>of the log record type is<br>the record ID.<br>RecordType is currently<br>always zero. |
| CompositeLogArray | define structure_array<br>CompositeLogArray =<br>{CompositeLogRecord<br>'record$_i$'}. | | An array to<br>CompositeLogRecords |
| CompositeEventRecord | define structure<br>CompositeEventRecord =<br>UnsignedType<br>'record_type'<br>HandleType 'handle'<br>LogHeaderType 'header'<br>[StringArrayType 'labels']<br>LogArrayType 'records'<br>TimeType<br>'acknowledge_time'<br>PriorityType 'priority'. | | This is a complete<br>description of a single<br>event (either unary<br>event or half of a<br>binary event). The<br>header consists of two<br>handles cause_handle<br>and effect_handle (in<br>this order).<br>The records field<br>always has two<br>elements, cause_value<br>and effect_value.<br>RecordType is 0 for<br>unary events, 1 for<br>binary active events, 2<br>for binary inactive<br>events, and 3 for label<br>change events. |
| CompositeEventArray | define structure<br>CompositeEventArray =<br>{CompositeEventRecord<br>'record$_i$'}. | | An array of<br>CompositeEventRecords |
| PredicateOperator<br>Type | define PredicateOperatorType =<br>UnsignedType 'operator'. | | Defines some SOL<br>predicate operators<br>0 = AND<br>3 = OR<br>1 = IN |

TABLE A-continued

The Types describe the semantics for passing information to and from modules and registers.

| Type Name | Type equivalence | Restrictions | Description |
|---|---|---|---|
| PredicateOperandType | define PredicateOperandType = Type 'operand'. | | 4 = XOR<br>2 = BETWEEN<br>A predicate for an SOL-type query is formed from a list of PredicateOperandType (see SearchCriteria type). |
| SortOrderType | define structure SortOrderType =<br>   UnsignedType 'order'<br>   StringType 'key'. | | order is<br>0 = Ascending order<br>1 = Descending order.<br>key names a key field of a table. |
| SortOrderArray | define structure_array<br>   SortOrderArray =<br>   {SortOrderType<br>   'order$_i$'}. | | |
| SearchCriteria | define structure SearchCriteria =<br>   {PredicateOperandType<br>   'operand$_i$'}<br>   SortOrderArray 'order'. | | Defines a query on a LogSchemaRegister The list of operands form a predicate in postfix (reverse Polish) notation. |
| Type | define union Type =<br>   \|* type all types here *\| | | All Types. |

Note:
Arrays of fundamental Types are defined as "array" but arrays of non-fundamental Types are defined as "structure-array." This distinction improves communication throughput in the system.

Table 1 lists a set of methods which presently defined for the base class. All of these base class methods are inherited by the registers and modules.

TABLE 1

| # | Method | Return-type | Description |
|---|---|---|---|
| 1 | read_class() | ClassType | Causes a manager, module or register to return a number indicating what type of manager, module or register it is. |
| 2 | read_name() | StringType | Causes a manager, module or register to return a string containing the name of the manager, module or register. |
| 3 | read_label() | StringType | Causes a manager, module or register to return a string containing the label for the manager, module or register. A label differs from a name in that it can be programmed by executing a Write Label method on the manager, module or register. If no label is programmed the object name will be returned. |
| 128 | write_label(StringType) | BooleanType | Write the programmable object label. If a null-string is written, the Label is destroyed. |
| 129 | read_security_level (MethodType) | SecurityType | Is executed to determine whether a method can be executed on a particular manager, module or register. Not all methods are available on all devices. The master device can determine whether it will receive a valid result by first executing this method. Another method, Read All Security Levels returns a list which corresponds to the security levels of all the methods that can be executed on a manager or module. |
| 130 | read_all_security_levels() | MethodSecurityArrayType | Read the security levels for all methods of a given object. Only methods valid for the object's class are included. |
| 131 | read_parent_handle | HandleType | Returns a handle of the parent of a manager, module or register. For instance, executing this method on an analog output module will return the handle of the analog output manager. Executing this method on the analog output manager will return a handle to the feature manager. Executing this method on an analog output's output register returns the analog output module. |
| 132 | read_owners() | HandleArrayType | Returns a list of handles for all the modules that own the object this method is executed on. This will |

TABLE 1-continued

| # | Method | Return-type | Description |
|---|--------|-------------|-------------|
| | | | include a list of modules if the method is invoked on a register or a manager if it is invoked on a module. |
| 133 | IsA(ClassType) | BooleanType | Returns a value indicating whether or not an object is derived from the class given as an argument. |
| 134 | check_sanity() | BooleanType | Checks to see if the manager, module or register is operating correctly. I.e., determines whether the software that implements the object is operating correctly. Returns True if object is sane. |

If a method invocation is unsuccessful, an ExceptionType will be returned rather than the normal Return-type.

In the current implementation a module performs a function using registers. Input registers provide the information a module is operating on. Setup registers permit modification of the operation of the module. Output registers contain the results of the module's operation. The output registers of one module can be used as input registers for another. The module keeps track of which registers are to be used for its input, output and setup. The links to the input registers can be modified, but those to the output and setup registers are fixed. A module is said to "own" all the registers it is linked to. Methods may also be executed on registers once the handle to a register is known. The handle of a register or module is a number which is unique for each register and module on a device. When a method is invoked, a handle is supplied which indicates which module or register the method is to be invoked upon.

In most instances, the methods that can be invoked on the different types of registers depend on what type of register is involved. Table 2 lists a set of methods which are presently defined for all registers (all register classes are inherited from the register class).

TABLE 2

Register Class (R) – class = 20

| # | Method | Return-type | Description |
|---|--------|-------------|-------------|
| 20 | read_time() | TimeType | Read the time of last update. |
| 21 | read_value() | VoidType | Read the value of the object |
| 22 | write_value(VoidType) | BooleanType | Write the value of the object |

TABLES 3–19 list methods which are supported for the indicated register classes. (In Tables 3–19, "*" indicates that the method is inherited from the parent class and "+" indicates that the method is re-defined from the parent class.)

TABLE 3

BooleanVariableRegister (BVR) – class = 21
This class defines a Boolean variable storage location.

| # | Method | Return-type | Description |
|---|--------|-------------|-------------|
| 20 | read_time()* | TimeType | Read the time of last update |
| 21 | read_value()+ | BooleanType | Read the value of the register. |
| 22 | write_value(BooleanType)+ | BooleanType | Write the value of the register |
| 30 | read_ON_label() | StringType | Read the ON label. |

TABLE 3-continued

BooleanVariableRegister (BVR) – class = 21
This class defines a Boolean variable storage location.

| # | Method | Return-type | Description |
|---|--------|-------------|-------------|
| 500 | write_ON_label(StringType) | BooleanType | Write the ON label. |
| 31 | read_OFF_label() | StringType | Read the OFF label. |
| 501 | write_OFF_label(StringType) | BooleanType | Write the OFF label. |
| 32 | read_current_state_label() | StringType | Returns the ON label if register value = True and OFF label if register value = False. |

TABLE 4

EnumeratedRegister (ENR) – class = 22
This class defines a register that can store one instance of an enumerated list.

| # | Method | Return-type | Description |
|---|--------|-------------|-------------|
| 20 | read_time()* | TimeType | Read the time of last update |
| 21 | read_value()+ | StringType | Read the value of the register. |
| 22 | write_value(StringType)+ | BooleanType | Write the value of the register. The string must be one of the strings provided by the read_enumerations() method—otherwise the method will fail. |
| 520 | read_enumerations() | StringArrayType | Read the enumeration list. This list contains ALL possible register values. |

TABLE 5

NumericRegister (NR) – class = 23
This is the parent class for Numeric Registers.

| # | Method | Return-type | Description |
|---|--------|-------------|-------------|
| 20 | read_time()* | TimeType | Read the time of last update |
| 21 | read_value()+ | NumericType | Read the value of the register |

TABLE 5-continued

NumericRegister (NR) – class = 23
This is the parent class for Numeric Registers.

| # | Method | Return-type | Description |
|---|---|---|---|
| 22 | write_value(NumericType)+ | BooleanType | Write the value of the register |

TABLE 6

NumericBoundedRegister (NBR) – class = 24
This defines a numeric value bounded by two values.

| # | Method | Return-type | Description |
|---|---|---|---|
| 20 | read_time()* | TimeType | Read the time of last update |
| 21 | read_value()* | NumericType | Read the value of the register |
| 22 | write_value(NumericType)* | BooleanType | Write the value of the register. If the value is outside the prescribed bounds, no value will be written and an exception will be returned. |
| 540 | read_bounds() | NumericArrayType | Read the bounds of the register. The numeric array will have two elements. |
| 541 | write_bounds(NumericArrayType) | Boolean Type | Write the bounds of the register. The first array element will be the low bound and the second will be the high bound. |

TABLE 7

NumericVariableRegister (NVR) – class = 25
This defines a numeric storage location.

| # | Method | Return-type | Description |
|---|---|---|---|
| 20 | read_time()* | TimeType | Read the time of last update |
| 21 | read_value()* | NumericType | Read the value of the register |
| 22 | write_value(NumericType)* | BooleanType | Write the value of the register |

TABLE 8

DeltaRegister (DR) – class = 26
This defines a delta-function value.

| # | Method | Return-type | Description |
|---|---|---|---|
| 20 | read_time()* | TimeType | Read the time of last update |
| 21 | read_value()+ | VoidType | Read the delta value |
| 22 | write_value(VoidType)* | Boolean Type | Output a delta-pulse |

TABLE 9

ArrayRegister (AR) – class = 27
This is the parent class for all registers containing arrays.

| # | Method | Return-type | Description |
|---|---|---|---|
| 20 | read_time()* | TimeType | Read the time of last update |
| 21 | read_value(Range Type)+ | VoidType | Read a range of values. |
| 22 | write_value(IndexType, VoidType)+ | BooleanType | Write values at index |
| 35 | read_depth() | SizeType | Read the depth of the array |
| 36 | write_depth(SizeType) | BooleanType | Write the depth of the array |
| 37 | read_rollover() | UnsignedType | Read rollover value—value is the highest count that can be reached before rollover to 0. |

TABLE 10

BooleanArrayRegister (BAR) – class = 28
This class defines a non-circular array of Boolean values.

| # | Method | Return-type | Description |
|---|---|---|---|
| 20 | read_time()* | TimeType | Read the time of last update |
| 21 | read_value(RangeType)+ | BooleanArrayType | Read a range of values. |
| 22 | write_value(IndexType, BooleanArrayType)+ | BooleanType | Write values at index |
| 35 | read_depth()* | SizeType | Read the depth of the array |
| 36 | write_depth(SizeType)* | BooleanType | Write the depth of the array |
| 37 | read_rollover()* | UnsignedType | Read rollover value. |

TABLE 11

NumericArrayRegister (NAR) – class = 29
This class defines a non-circular array of numeric values.

| # | Method | Return-type | Description |
|---|---|---|---|
| 20 | read_time()* | TimeType | Read the time of last update |
| 21 | read_value(RangeType)+ | NumericArrayType | Read a range of values. |
| 22 | write_value(IndexType, NumericArrayType)+ | BooleanType | Write values at index |
| 35 | read_depth()* | SizeType | Read the depth of the array |
| 36 | write-depth(SizeType)* | BooleanType | Write the depth of the array |
| 37 | read_rollover()* | UnsignedType | Read rollover value. |

TABLE 12

LogRegister (LR) – class = 30
This class defines a circular array of log-type structures. This class is intended for the implementation of any kind of historic log.

| # | Method | Return-type | Description |
|---|---|---|---|
| 20 | read_time()* | TimeType | Read the time of last update |
| 21 | read_value(RangeType)+ | LogArrayType | Read a range of records. |

TABLE 12-continued

LogRegister (LR) – class = 30
This class defines a circular array of log-type structures. This class is intended for the implementation of any kind of historic log.

| # | Method | Return-type | Description |
|---|---|---|---|
| 22 | write_value(IndexType, LogArrayType)+ | BooleanType | Write the records at index |
| 35 | read_depth()+ | BooleanType | NotSupported |
| 36 | write_depth()+ | BooleanType | NotSupported |
| 37 | read_rollover()* | UnsignedType | Read rollover value. |
| 40 | read_position() | IndexType | Read the present position. Note: Upon leaving the factory, the position = 0 (i.e. the first record will be written into position 0). The position always indicates where the next record will be written. |
| 41 | write_position(IndexType) | BooleanType | Write the present position |

TABLE 13

EventLogRegister (ELR) – class = 31
This class defines a circular array of event structures and a non-circular array of alarms. It is derived from the LogRegister class. The following methods are supported.

| # | Method | Return-type | Description |
|---|---|---|---|
| 20 | read_time()* | TimeType | Read the time of last update |
| 21 | read_value(RangeType)* | LogArrayType | Read range of events |
| 22 | write_value(IndexType, LogArrayType)* | BooleanType | Write range of events |
| 35 | read_depth()+ | BooleanType | NotSupported |
| 36 | write_depth()+ | BooleanType | NotSupported |
| 37 | read_rollover()* | Unsigned Type | Read rollover value. |
| 40 | read_position()* | IndexType | Read the present position. |
| 41 | write_position(IndexType)* | BooleanType | Write the present position |
| 45 | read_alarms() | AlarmArrayType | Read entire alarm array. |
| 46 | write_alarms (AlarmArrayType) | BooleanType | Write entire alarm array. |
| 560 | read_alarm_count_rollover() | UnsignedType | Read rollover value of alarm counters in the AlarmArray—value is the highest count that can be reached before rollover to 0. |

TABLE 14

SchemaRegister (DSR) – class = 39
This is derived from TableRegister. A SchemaRegister loosely represents of a database schema, a collection of related database tables. In the current embodiment, the tables are not accessible via methods. These registers are used primarily as inputs to specialized modules that allow indirect access to the tables.

| # | Method | Return-type | Description |
|---|---|---|---|
| 20 | read_time()* | TimeType | Read the time of the last update. |
| 21 | read_value()+ | BooleanType | NotSupported. |
| 22 | write_value()+ | BooleanType | NotSupported. |

TABLE 15

Log View Register (LVR) – class = 40
The Log View Register class is derived from Register. In database terminology, a view is a database table that is derived from queries on other database tables. Here a "view" is extended to mean a specialized representation of table or group of tables. A Log View Register is used to access data stored in the Table Registers associated with the creator module (see Log View Module). Data retrieved from the tables is re-formatted and returned as Composite Log Records.

| # | Method | Return-type | Description |
|---|---|---|---|
| 20 | read_time()* | TimeType | Read the time of the last update. |
| 21 | read_value ( SearchCriteria )+. | CompositeLogArray | Returns all records that match SearchCriteria. |
| 22 | write_value()+ | BooleanType | Not supported. |
| 583 | read_updates ( SearchCriteria ) | CompositeLogArray | The first time this method is invoked (for a particular program), all records that match the SearchCriteria are returned. Subsequently only the newest matching records are returned. |

TABLE 16

EventViewRegister (EVR) – class = 41
The EventViewRegister class is a LogViewRegister that specializes the in storage of CompositeEventRecords. It also allows these records to be marked as acknowledged and sends prioritized alarm messages to registered clients.

| # | Method | Return-type | Description |
|---|---|---|---|
| 20 | read time()* | TimeType | Read the time of the last update. |
| 21 | read_value ( SearchCriteria )+ | CompositeEventArray | Returns all records that match SearchCriteria. |
| 22 | write_value()* | BooleanType | Not supported. |
| 583 | read_updates ( SearchCriteria )+ | CompositeEventArray | See LogViewRegister |
| 584 | acknowledge (UnsignedArrayType) | BooleanType | Marks the specified event records as acknowledged. The argument is an array of recordIDs. |

TABLE 17

WaveformRegister (WR) – Class = 32
This class defines an array of points defining a waveform.

| # | Method | Return-type | Description |
|---|---|---|---|
| 20 | read_time()* | TimeType | Read the time of last update |
| 21 | read_value()+ | WaveformType | Read the present value of the register |
| 22 | write_value (WaveformType)+ | BooleanType | Write the present value of the register |

TABLE 18

EventRegister (ER) – Class = 33
This class defines a register which holds an event.

| # | Method | Return-type | Description |
|---|---|---|---|
| 20 | read_time()* | TimeType | Read the time of last update |
| 21 | read_value()+ | EventType | Read the present value of the register |
| 22 | write_value(EventType)+ | BooleanType | Write the present value of the register |

TABLE 19

TimeRegister(TR) – class = 34
This class defines a register which holds unformatted time.

| # | Method | Return-type | Description |
|---|---|---|---|
| 20 | read_time()* | TimeType | Read the time of last update |
| 21 | read_value()+ | TimeType | Read the present value of the register |
| 22 | write_value(TimeType)+ | BooleanType | Write the present value of the register |

It is also contemplated that a TableRegisterClass will be defined. The TableRegisterClass represents a database table, rows of data organized into distinct columns. It is presently envisioned that the database tables will not be accessible using methods. These registers may be used permanently as inputs to specialized modules that allow indirect access to the tables.

Figure 20A:
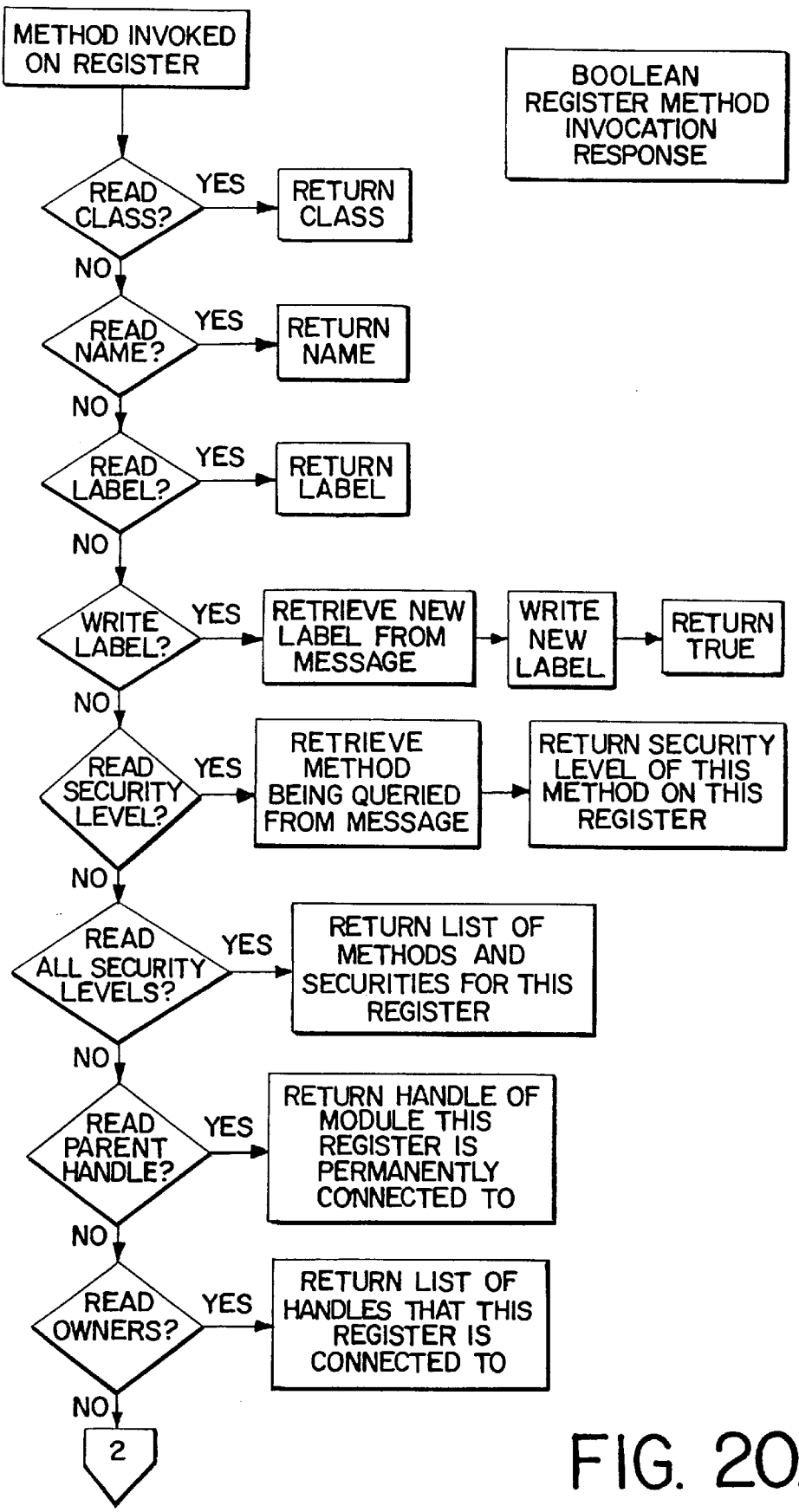
FIGS. 20A–20C show a flowchart of a preferred embodiment of the logic for the operation of a boolean register.
Figure 20B:
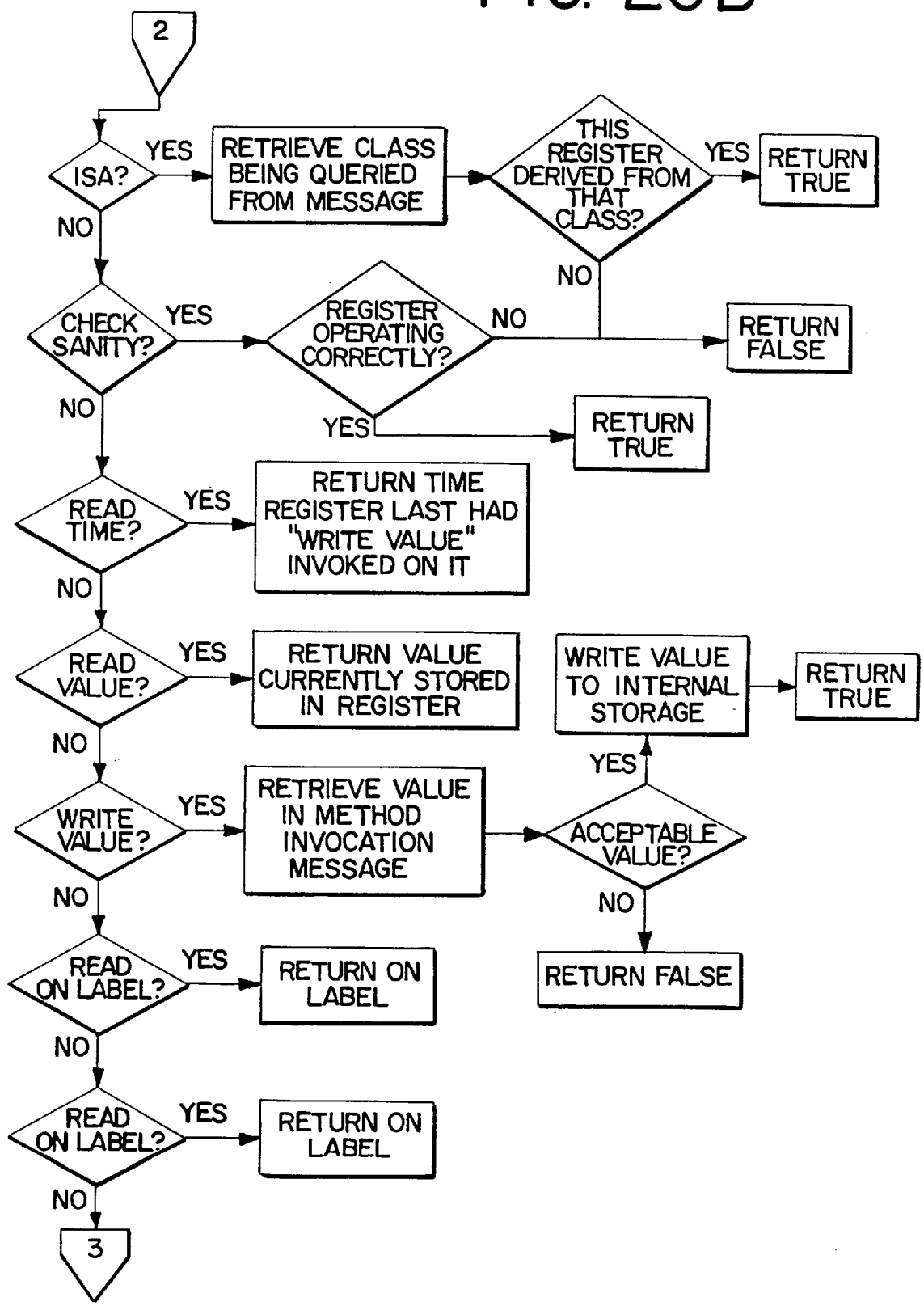
Figure 20C:
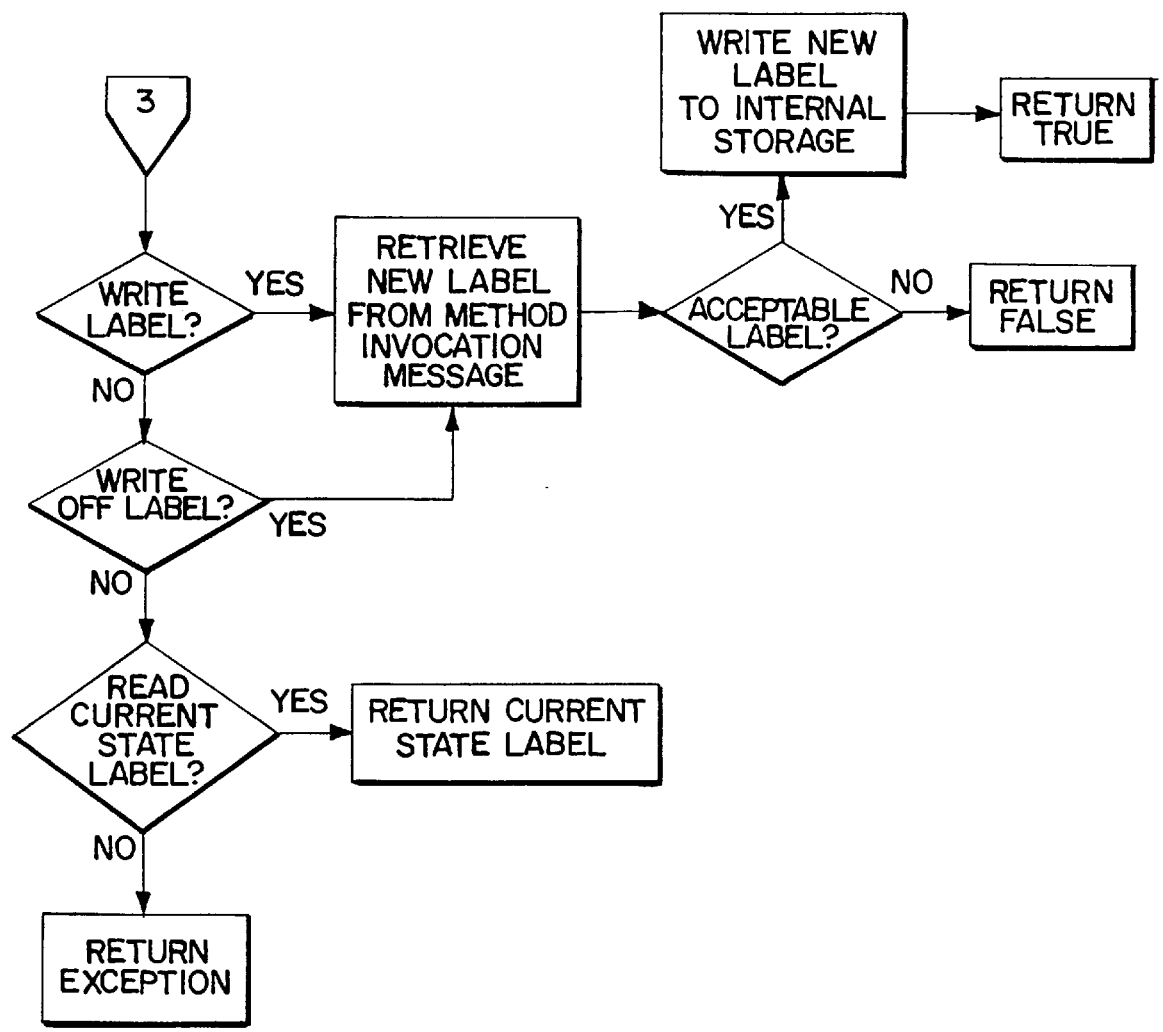
Figure 21A:
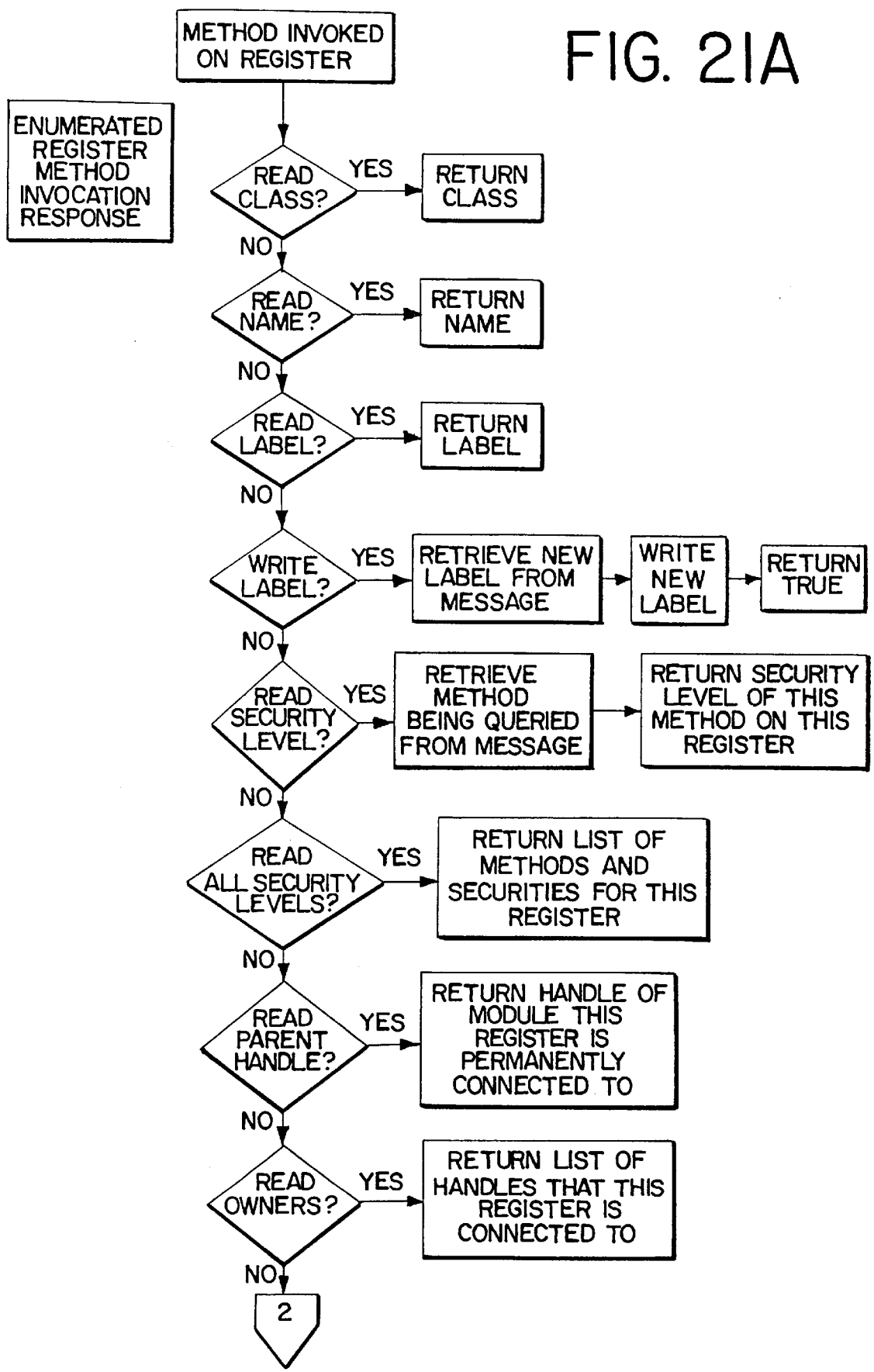
FIGS. 21A–21B show a flowchart of a preferred embodiment of the logic for the operation of an enumerated register.
Figure 21B:
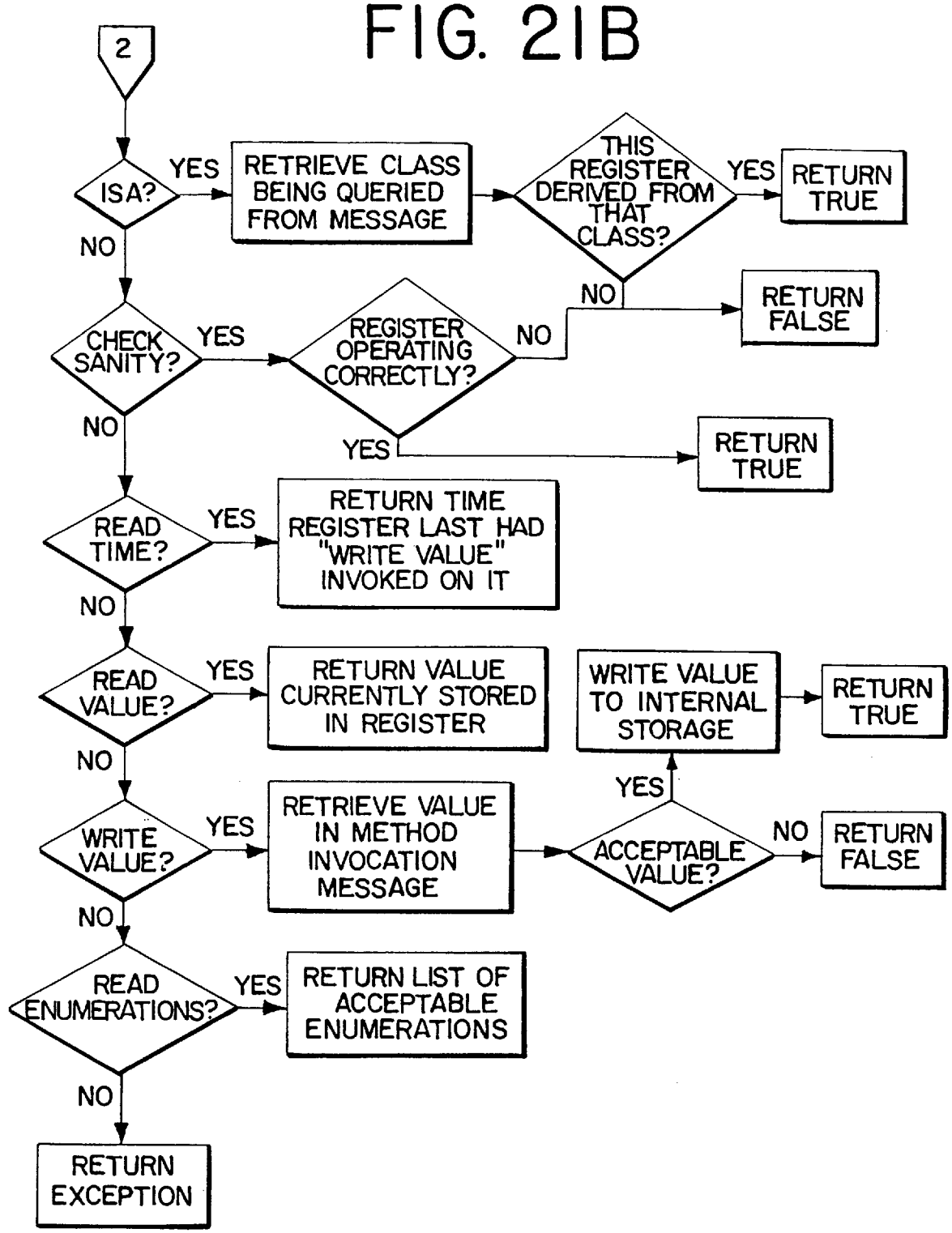
Figure 22A:
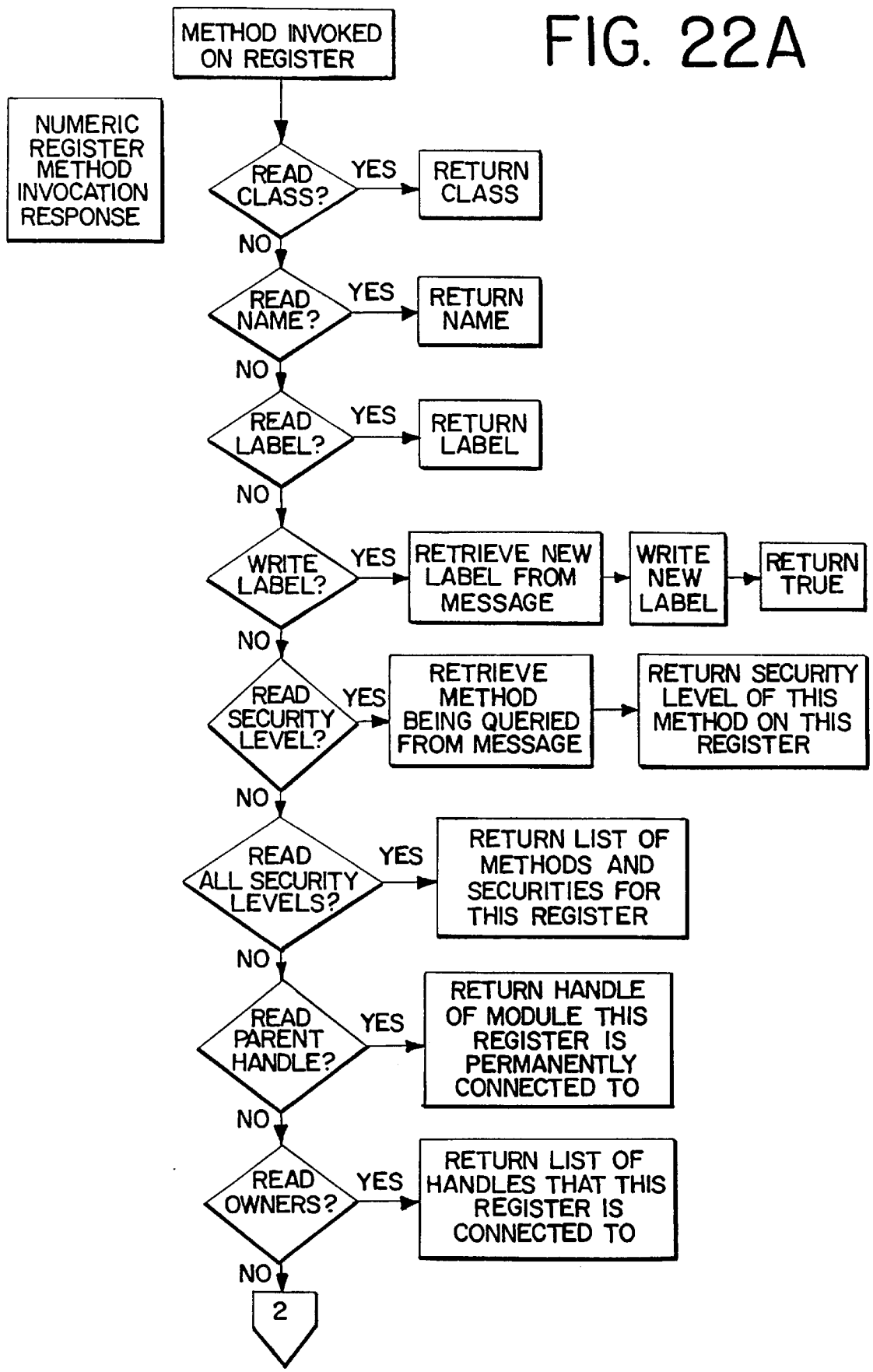
FIGS. 22A–22B show a flowchart of a preferred embodiment of the logic for the operation of a numeric register.
Figure 22B:
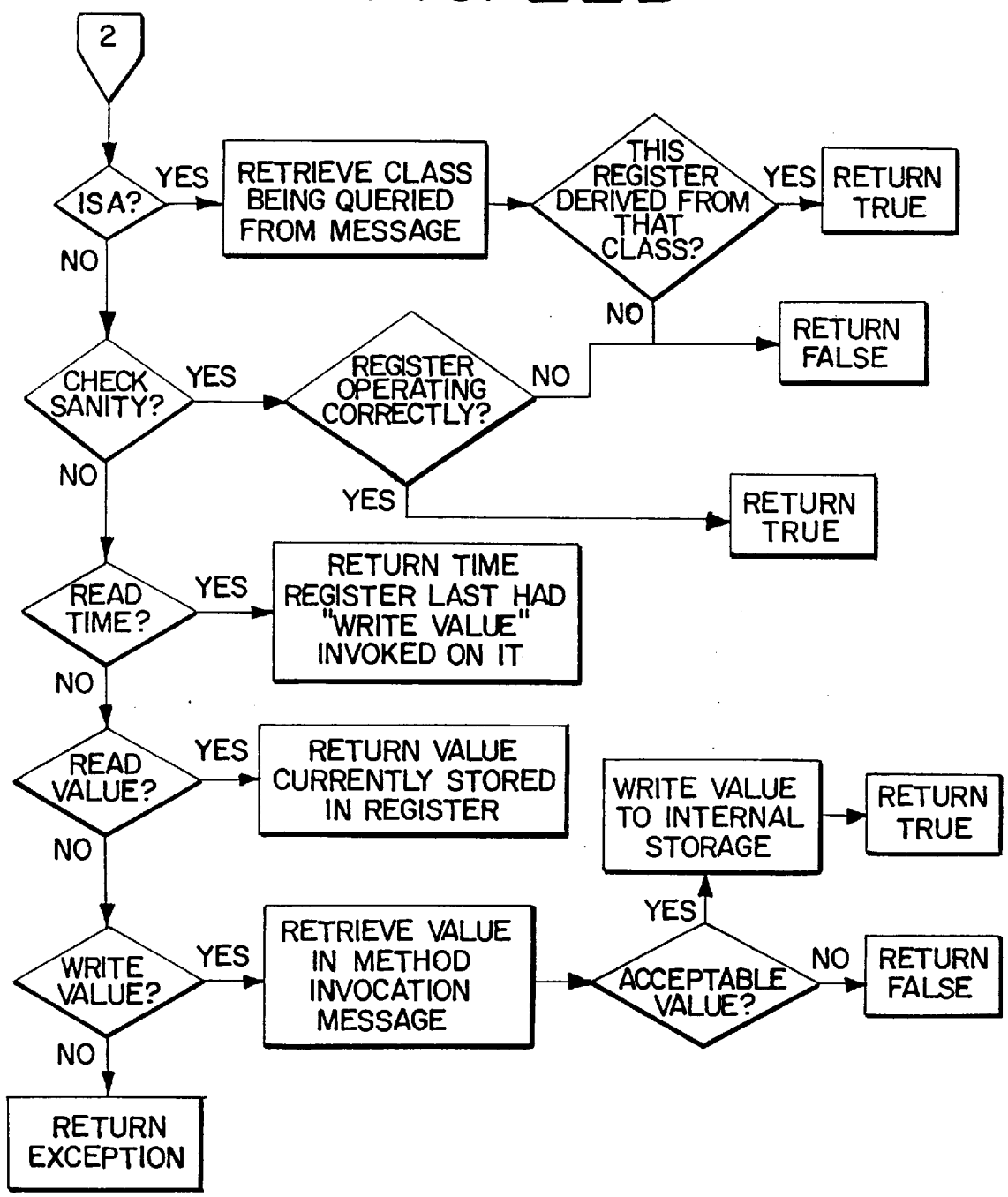
Figure 23A:
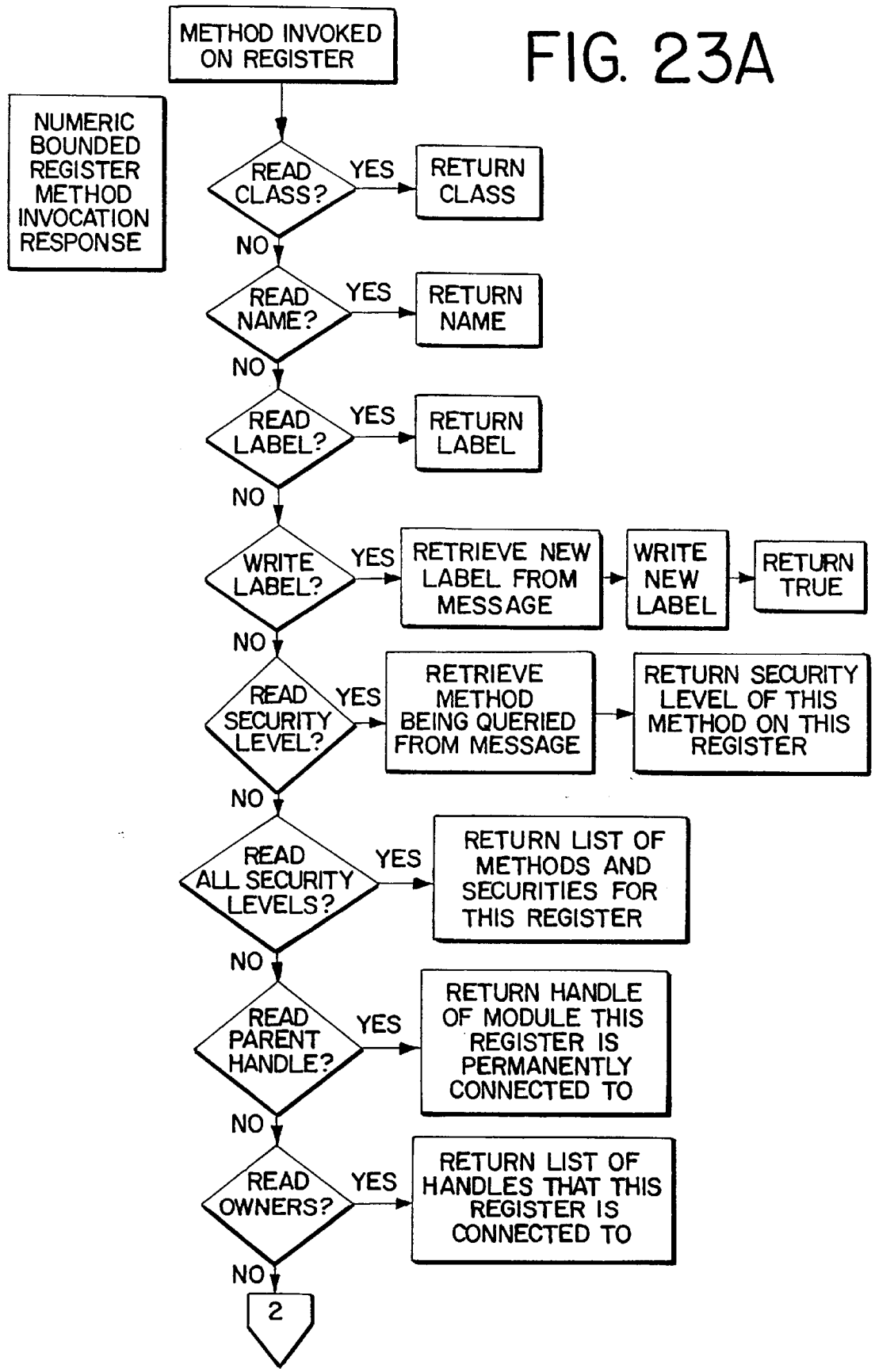
FIGS. 23A–23B show a flowchart of a preferred embodiment of the logic for the operation of a numeric bounded register.
Figure 23B:
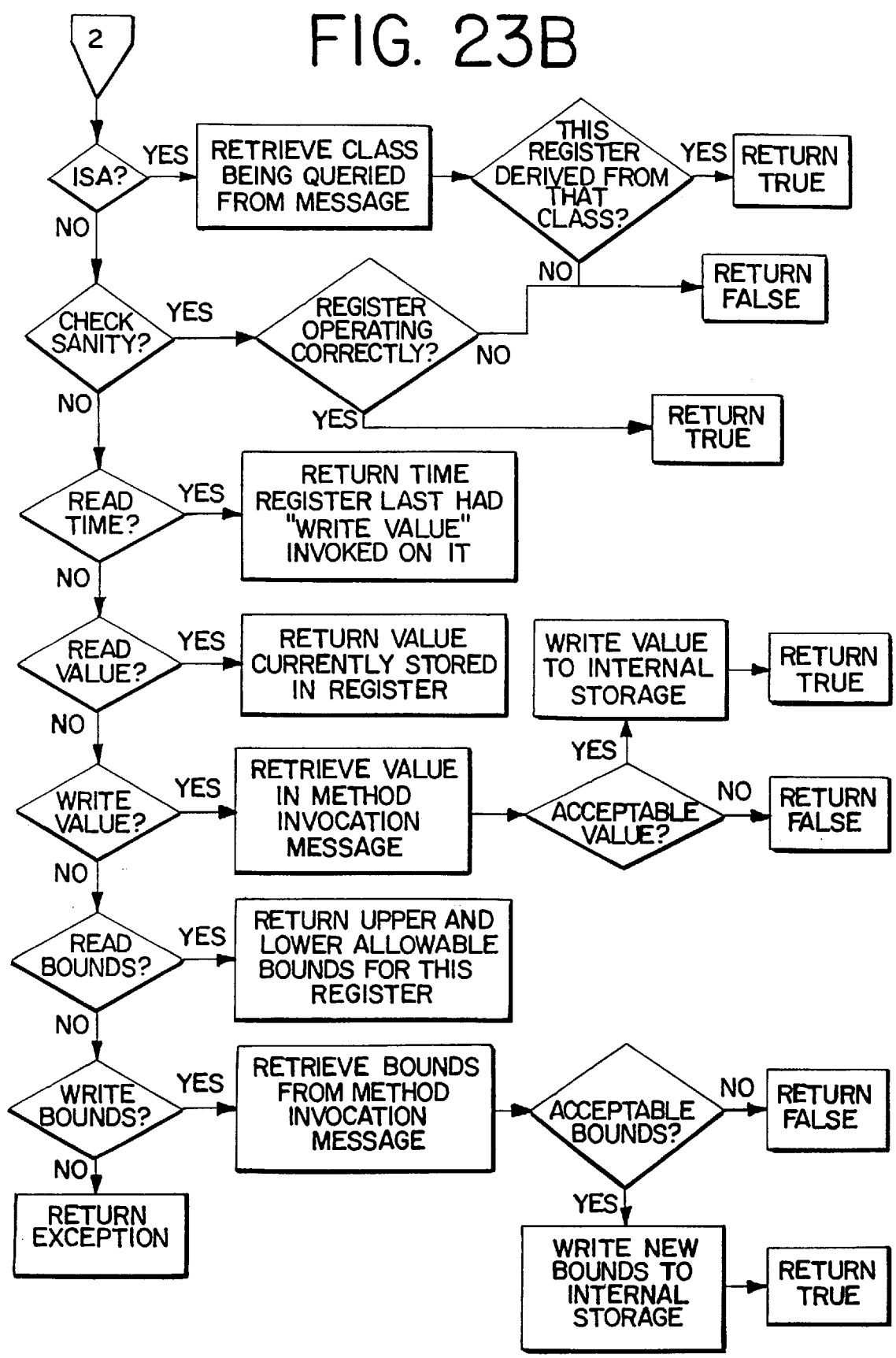

Registers operate only as servers in the architecture. In other words they only respond to method invocations. Some of the most commonly used registers in the preferred embodiment are boolean registers, enumerated registers, numeric registers and numeric bounded registers. A flow chart for the server operation of a boolean register is shown in FIGS. 20A–20C. A flow chart for the server operation of an enumerated register is shown in FIGS. 21A–21B. A flow chart for the server operation of a numeric register is shown in FIGS. 22A–22B. A flow chart for the server operation of a numeric bounded register is shown in FIGS. 23A–23B.

It will be recognized by those skilled in the art that the registers' functionality can be embedded within the modules.

Figure 11:
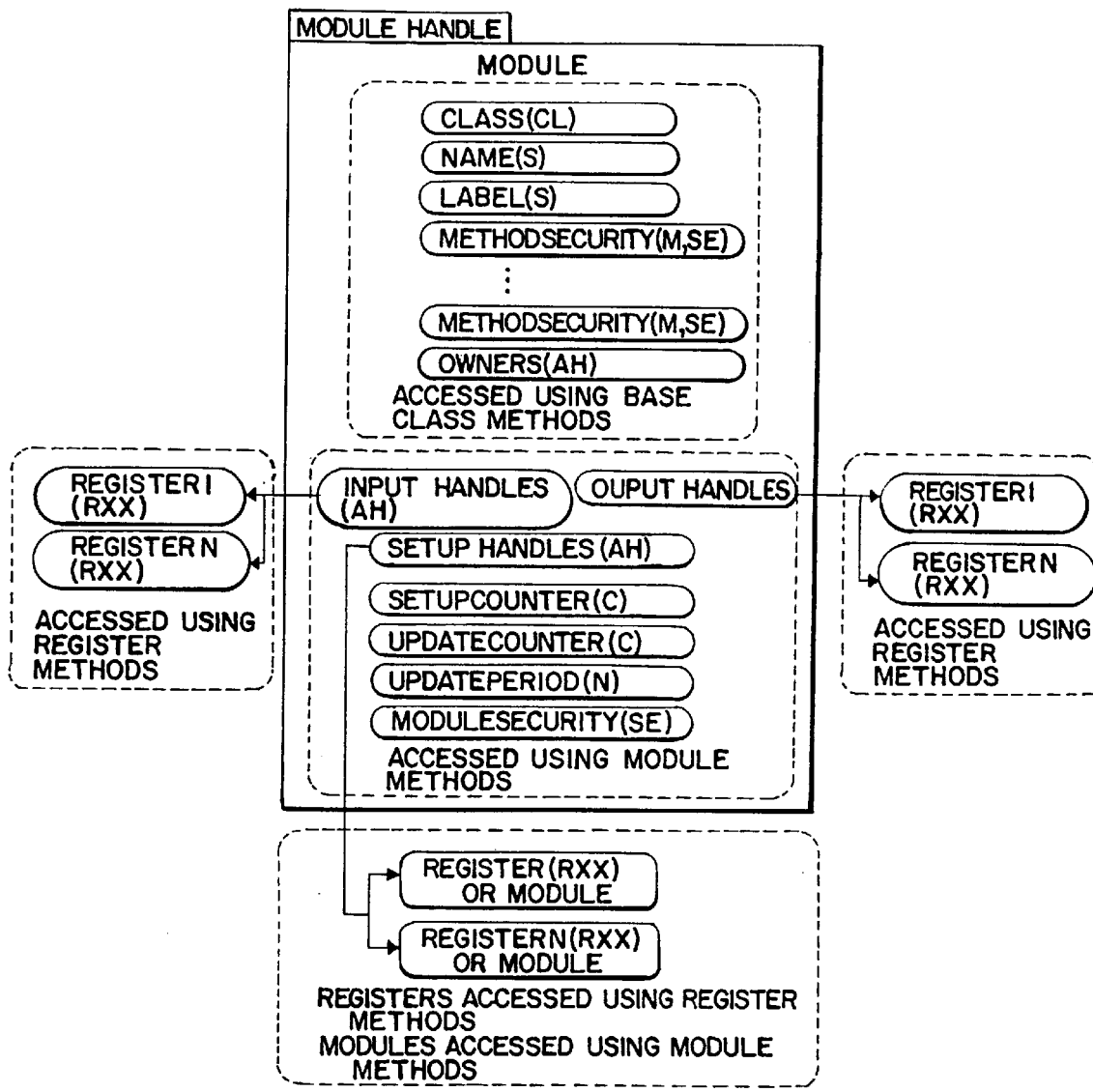
FIG. 11 schematically illustrates a preferred embodiment of the properties of the modules.
Figure 12:
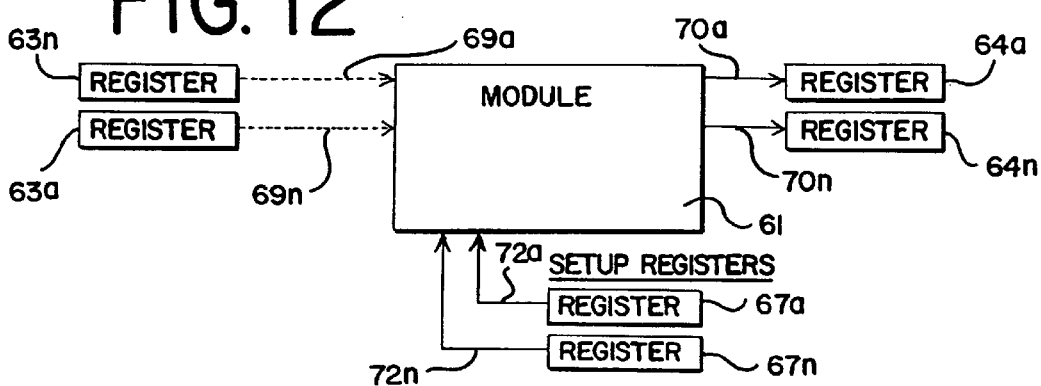
FIG. 12 schematically illustrates a preferred embodiment of the data flow for a module.

The modules provide the IED the functionality in the architecture. FIG. 11 schematically illustrates a preferred embodiment of the properties of the modules. The modules can be considered as "black boxes" that read data at the inputs, manipulate the data in some fashion, and write the result to outputs. Input data is read from registers and output data is written to registers. For all types of modules, the links to input registers can be programmed, but the links to output registers are fixed. Most modules have links to registers which contain setup information these links are also fixed, and the module can only read them. FIG. 12 illustrates the data flow for a module. A module 61 is linked to input registers 63a–63n through programmable links 69a–69n. Setup registers 67a–67n are linked to module 61 through links 72a–72n which are not programmable. Output registers 64a–64n are linked to module 61 through links 70a–70n which also are not programmable.

In the preferred embodiment, the modules have the following properties

An array of handles (input handles) point to the input registers. The module has shared ownership of these registers. The module reads a register using the Read_Value method.

Module setup data (such as scaling information) is stored in registers. An array of handles (setup handles) point to these Registers. There is one exception: For a manager module these Handles point to other modules rather than registers. The module has shared ownership of these objects.

The module uses the input data and setup data to produce output data according to the function of the module which is described by the module behavior.

An array of handles (output handles) point to the output registers. The module has shared ownership of these registers. A module writes these registers using the Write_Value method.

UpdatePeriod contains the period at which the module updates the output registers.

ModuleSecurity contains the security level which the module uses when invoking methods on other objects.

The module has a class which is unique to that type of module. (e.g. All setpoint modules would have the same class).

The module has a name. This name is fixed (read only) and is different in every module.

The module has a label which can be programmed.

A method security level is defined for every method which can be invoked on a module. Thus, there is a security parameter for every method which can be invoked on the module.

The module has owners which are listed in an array of Handles. This array lists all the module(s) that have shared ownership of the module.

A module is created by a manager using the Create_Module( ) method. When the module is created all output registers and setup registers are also created. However, input registers are not created when a module is created. Often, a manager will have a fixed number of modules and the Create_Module( ) method will not be supported.

The module class (class=500) is derived from the base class. The methods listed below in Table 20 are common to all module classes (all module classes are inherited from this module class).

TABLE 20

| # | Method | Return-type | Description |
|---|---|---|---|
| 1000 | read_input_handles() | Handle Array | Returns a list of the handles to the registers |

TABLE 20-continued

| # | Method | Return-type | Description |
|---|---|---|---|
| | | Type | that are connected as inputs to the manager or module. (In the current embodiment, managers do not have inputs.) |
| 1001 | write_input_handles (HandleArrayType) | Boolean Type | Accepts a list of handles and attempts to link a module or manager to these input registers. (In the current embodiment, managers do not have inputs.) The handle order is defined in the module definitions. If one of the handles is incorrect the method will fail and NO handles will be written (i.e. all or nothing). |
| 1002 | read_input_classes() | ArrayUnsigned ArrayType | Reads the allowed register classes for the write_input_handles method. The returned array has the same number of elements as the HandleArray used in the write_input_handles method. If the returned array has an element that contains a Null rather than a class this indicates that this input element cannot be programmed. |
| 1003 | read_output_handles() | HandleArray Type | Returns a list of handles to the output registers of a module or manager. (In the current embodiment, managers do not have outputs.) The handle order is defined in the module definitions. |
| 1004 | read_setup_handles() | HandleArray Type | Returns a list of handles to the setup register of a module or a list of handles to modules for a manager. The handle order is defined in the module definitions. |
| 80 | read_setup_counter() | CounterType | Returns a number indicating how many times the module or manager has had its configuration changed. A master device can keep a local copy of this number. If another master device changes the setup of the slave device, the first manager can detect the change by comparing its count with the current count. |
| 81 | read_update_counter() | CounterType | Returns a number indicating how many times the module or manager has successfully invoked a method to write a new value to its output registers. A master device can then determine if it is necessary to read the output from the module or manager. (In the current embodiment, managers have no outputs.) |
| 1005 | read_update_period() | StringType | Returns a number indicating the minimum amount of time there will between the module or manager updating its output registers. (In the current embodiment, managers have no outputs.) Typical response is one of: "one cycle" "one second" "two cycles" |
| 1006 | read_module_security() | SecurityType | Returns a number indicating the security access a module has. Other modules or registers may refuse to execute a method invoked by a module which does not have a high enough security level. |

Table 21 below lists the behavior details for the module parameters.

TABLE 21

| Module Parameter | Behavior |
|---|---|
| update_counter | will be incremented every time a write_value() method is successfully invoked on one of the registers identified by the output handles. Note: by default the update counter will be incremented every time an module writes an event register. |
| setup_counter | will be incremented every time a write_value() method is successfully invoked on one of the system registers identified by the setup handles and every time the write_input_handles() method is successfully invoked. |

Table 22 below provides a list of the modules (including the corresponding input, output and setup registers) presently supported by the presently preferred embodiment.

TABLE 22

| # | Module Name | Input Registers | Output Registers | Setup Registers | Module Description |
|---|---|---|---|---|---|
| 501 | Power Meter | V1(NAR)<br>V2(NAR)<br>V3(NAR) | Vabc*(NVR)[1]<br>VIIabc*(NVR)<br>Iabc*(NVR) | ode(ENR)<br>PT Pri Volts(NBR)<br>PT Sec Volts(NBR) | Basic 3-phase power met<br>met meter.<br>PhaseOrder: |
| | | I1(NAR)<br>I2(NAR)<br>I3(NAR) | KWabc*(NVR)<br>KVARabc*(NVR)<br>KVAabc*(NVR) | CT Pri I(NBR)<br>CT Sec I(NBR)<br>I4 CT Pri I(NBR) | "ABC"<br>"ACB"<br>NormFreq: |
| | | I4(NAR) | PFSIGNabc*(NVR)<br>PFLEADabc*(NVR)<br>PFLAGabc*(NVR)<br>Vunbal(NVR) | I4 CT Sec I(NBR)<br>I1 Polarity(ENR)<br>I2 Polarity(ENR)<br>I3 Polarity(ENR) | "50"<br>"60"<br>"400"<br>PhaseLabels: |
| | | | Iunbal(NVR)<br>I4(NVR)<br>Iresidual(NVR)<br>PhaseRev(BVR)<br>LineFreq(NVR)<br>Event(ER) | PhaseOrder(ENR)<br>NormFreq(ENR)<br>PhaseLabels<br>(ENR) | "ABC"<br>"RST"<br>"XY2"<br>"RYB" |

[1]The method read_output_handles() will return handle in the order given here. This also applied to the methods read_input_handles and read_setup_handles() for all modules defined in this document.

In the following description reference is made to "managers". It will be noted that managers are just a specific type of module which have additional functionality. The purpose of the managers is to manage modules. One manager is needed for each practical group of modules, such as setpoint modules and min modules.

Table 23 below provides a list of the methods which are added specifically for the manager class. (All class and module class methods are inherited by the manager class but are not shown here for reasons of brevity.)

Every system has a "root" manager module called the feature manager. The feature manager has setup handles to all the other managers. Importantly, the feature manager handle is identical for all systems. The handle for the feature manager is 2. Starting with this handle, it is possible to determine the entire system configuration.

As was mentioned previously, modules act as both clients and servers in the object oriented architecture. In the present embodiment, the client and server portion of the modules operate separately. The server portion of the modules

TABLE 23

Figure 12A:
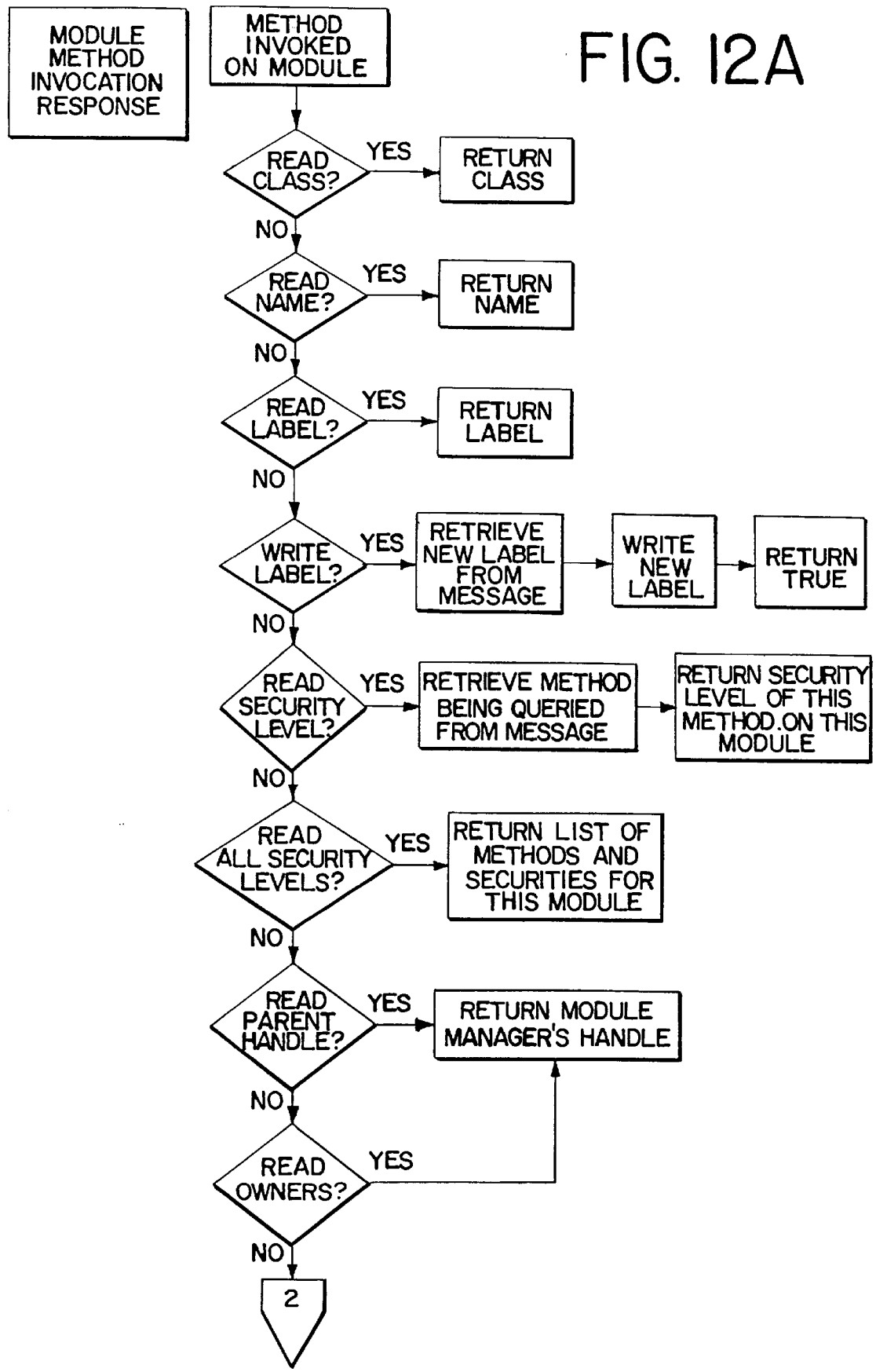
FIGS. 12A–12C show a flowchart of a preferred embodiment of the logic for the module operation.
Figure 12B:
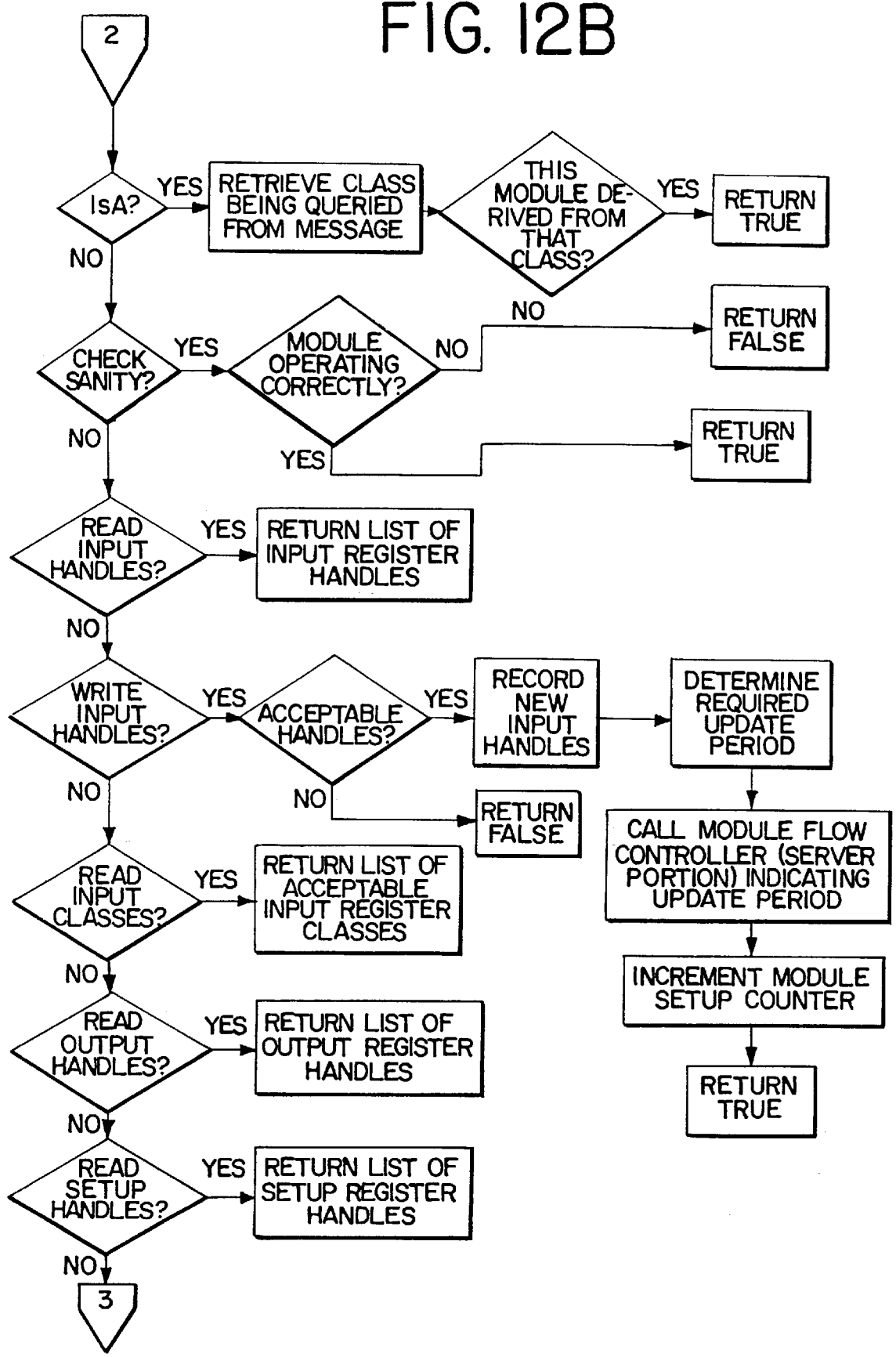
Figure 12C:
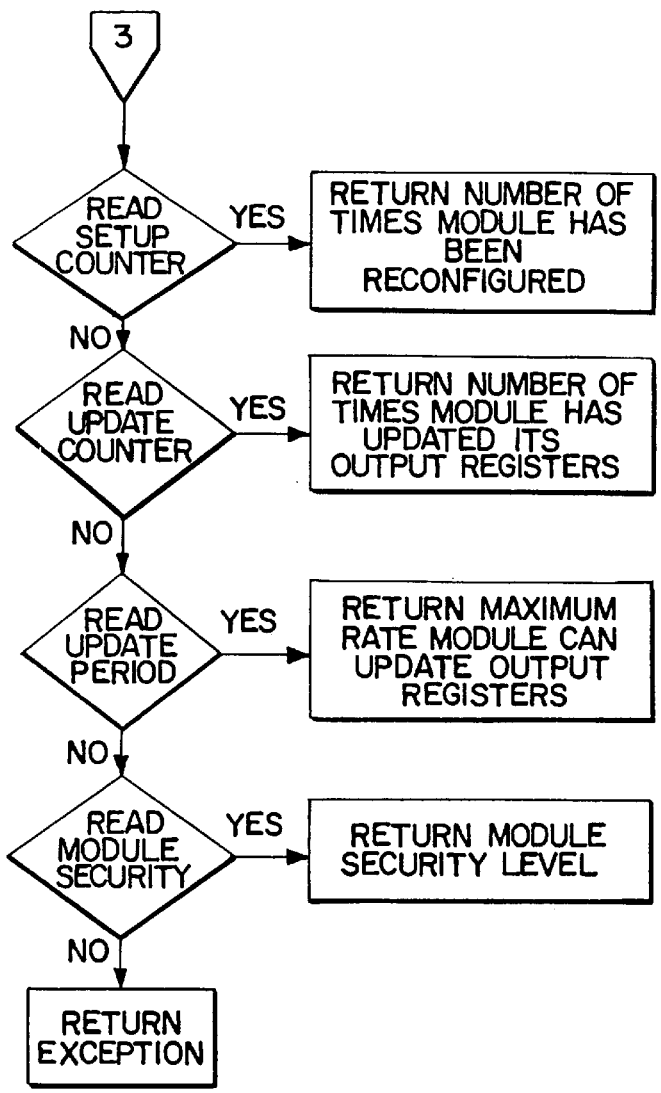

| # | Method | Return-type | Description |
|---|---|---|---|
| 100 | read_module_setups_counter() | CounterType | Returns a number indicating how many times the setup registers of the modules below a manager have been changed. The master device can keep a local count of this number in order to determine if another master device has successfully invoked a method to change the setup of the device. For instance, if a master device keeps this count for the feature manager, it can tell if any setup register on the device has been changed without going to each individual module. |
| 101 | read_module_updates_counter() | CounterType | Returns a number indicating how many times the ouput registers of the modules and managers beneath a certain manager have been updated. Used in the same fashion as Read Module Setups Counter, the Read Module Updates Counter is used to determine if any of the modules beneath the manager have successfully invoked a method to update their output registers. (In the current embodiment, managers have no outputs.) |
| 1500 | create_module(ClassType) | HandleType | Creates a module and stores the module handle in the setup handles array; return handle to module. The method read_managed_class indicates which class of module can be created. |
| 1501 | destroy_module(HandleType) | BooleanType | Destroys a module. Handle must be one of setup handles or an exception will be returned and the method will fail. The resources for that module are then available to perform other functions on the device. |
| 1502 | read_managed_class() | ClassType | Returns the class of module which can be created with the create_module method. | respond to method invocations. The server portion follows the same logic for all modules (except the managers) on the device. A flow chart of the logic for the server portion of a module is shown in FIGS. 12a–12c.

Figure 4:
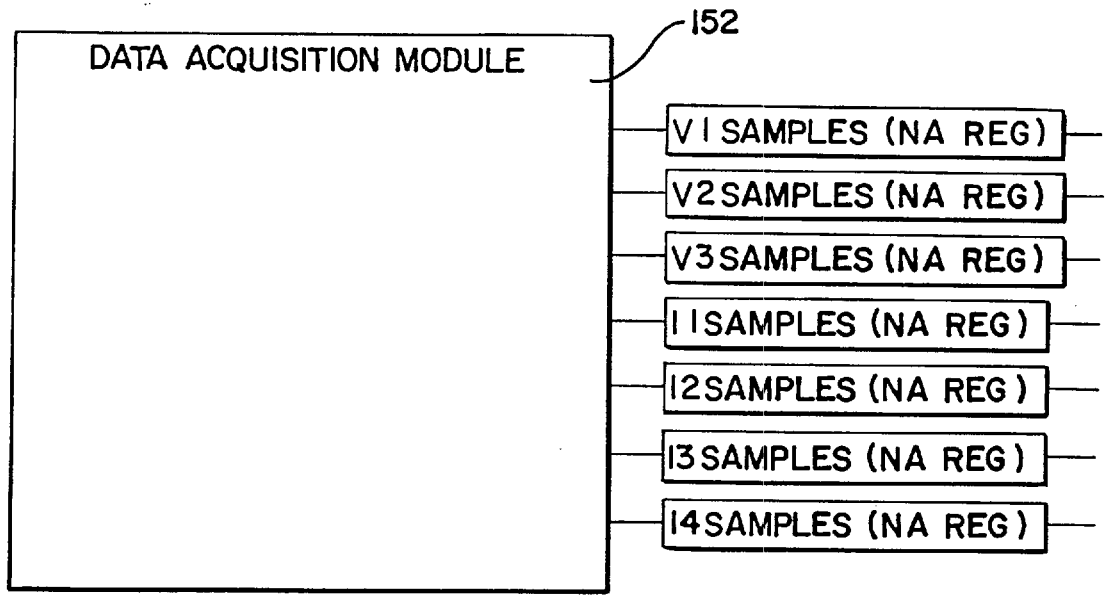
FIG. 4 schematically illustrates a preferred embodiment of the data acquisition module and its respective registers.
Figure 4A:
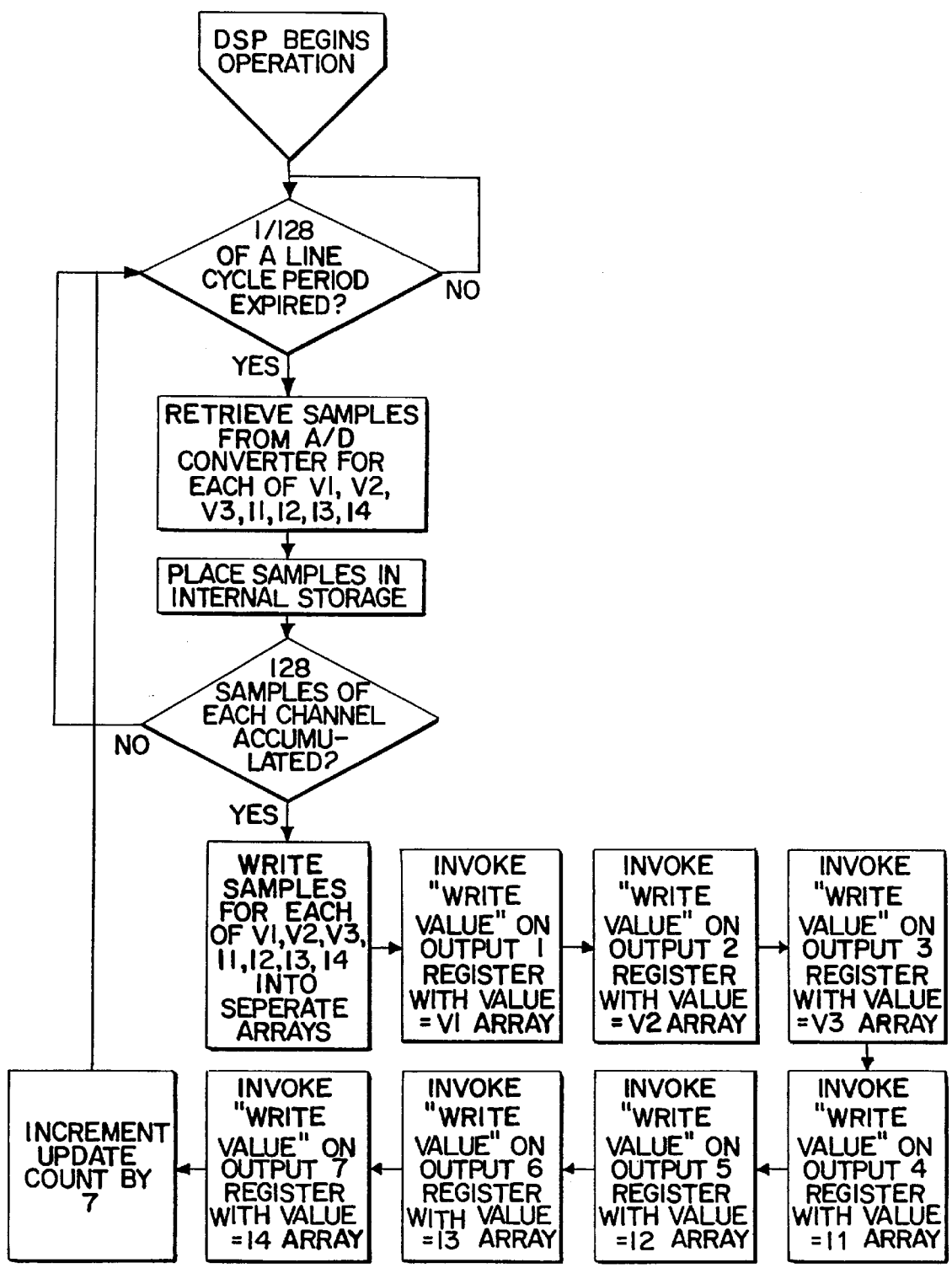
FIG. 4A shows a flowchart of a preferred embodiment of the logic for the client portion of the data acquisition module.
Figure 5:
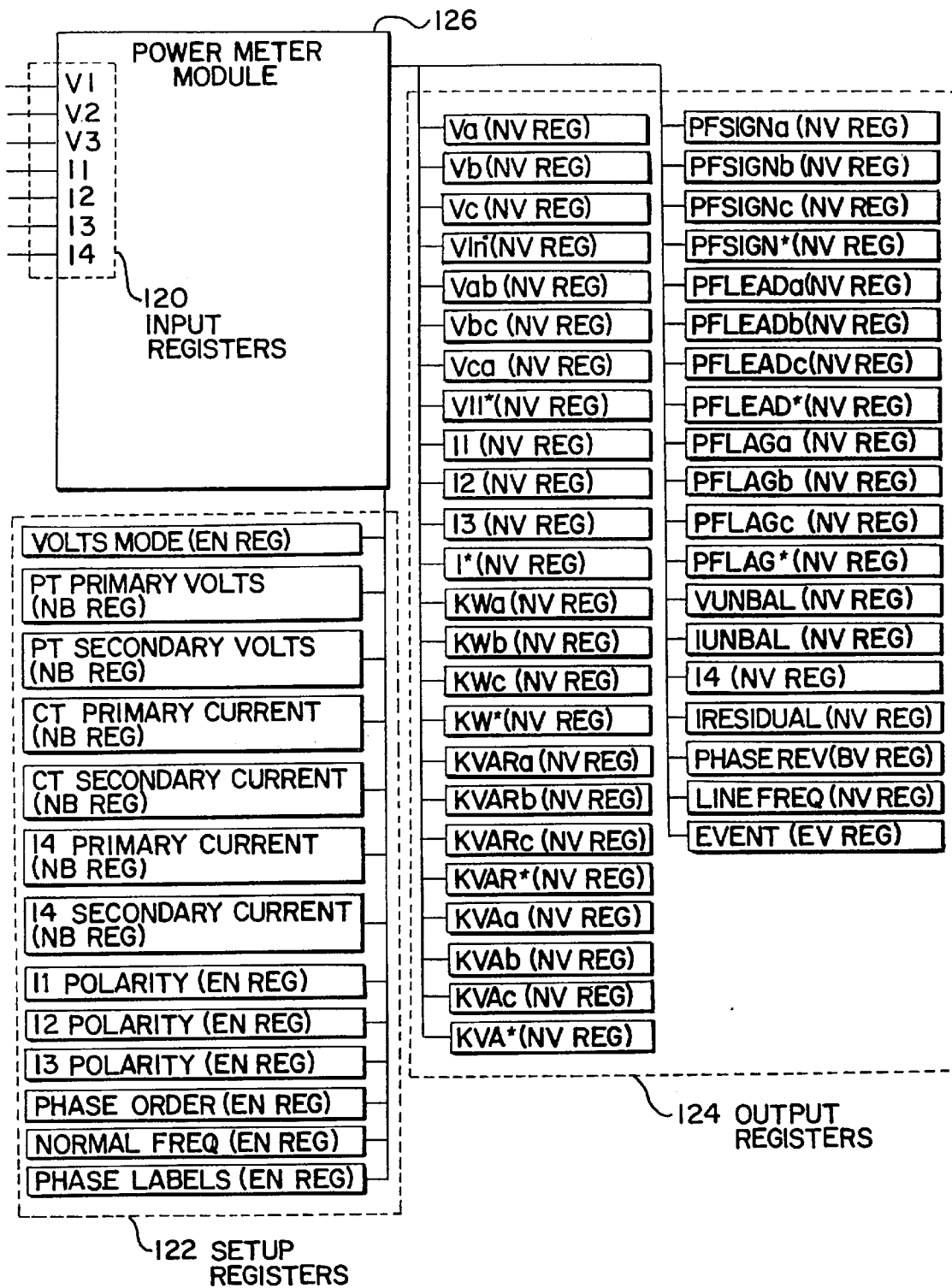
FIG. 5 schematically illustrates a preferred embodiment of the power meter module and its respective registers.
Figure 5B:
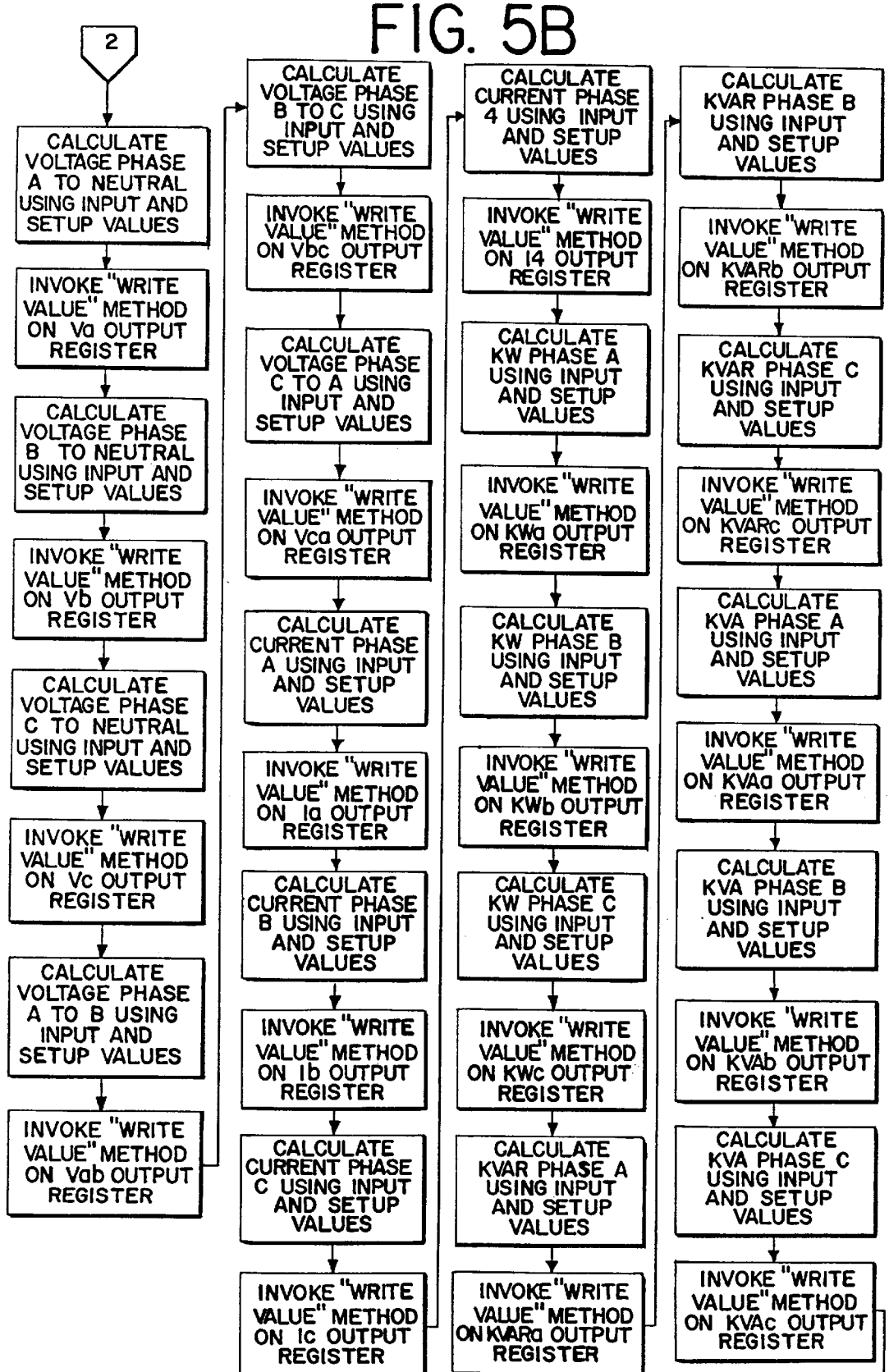
Figure 5C:
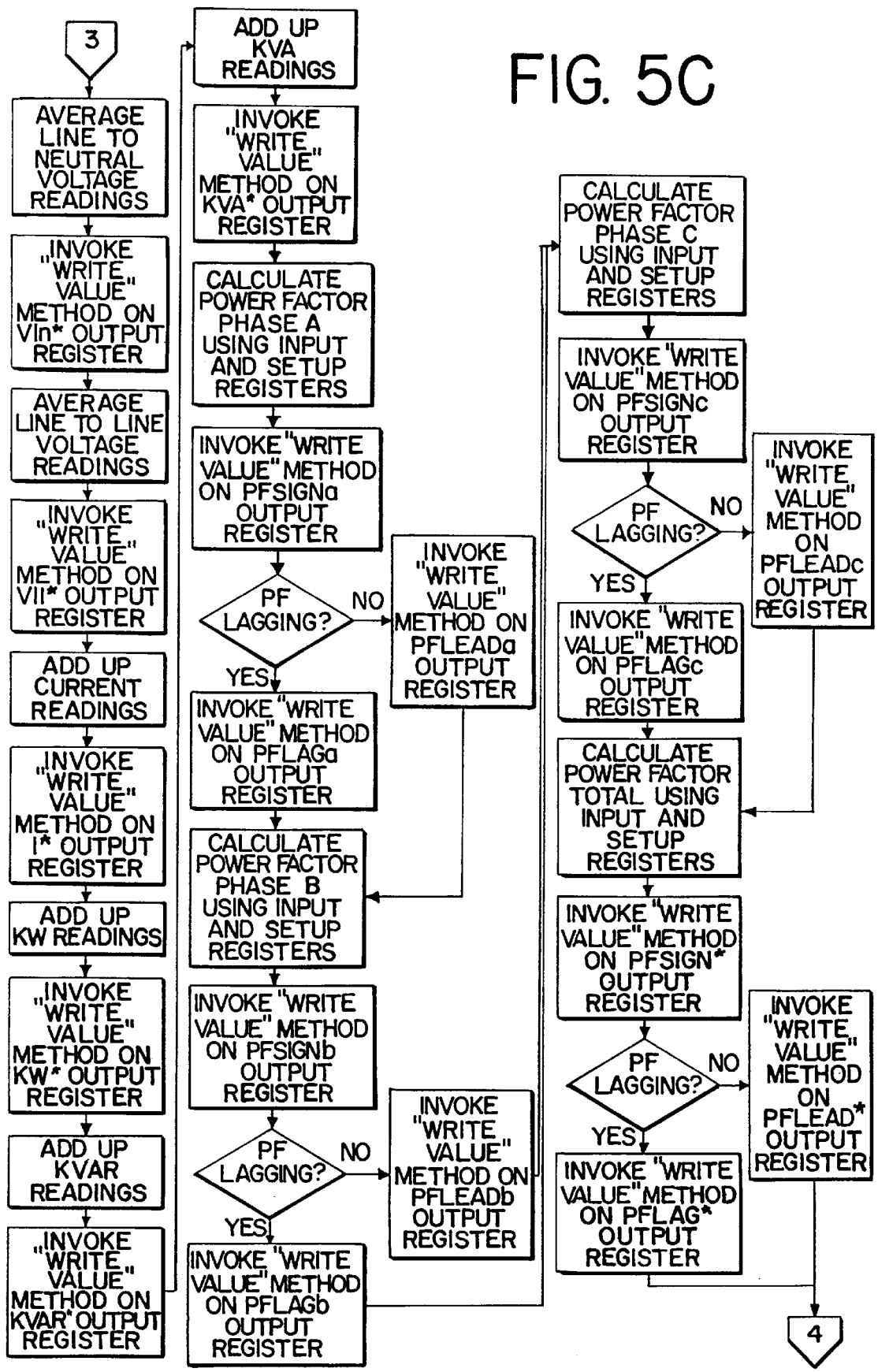
Figure 5D:
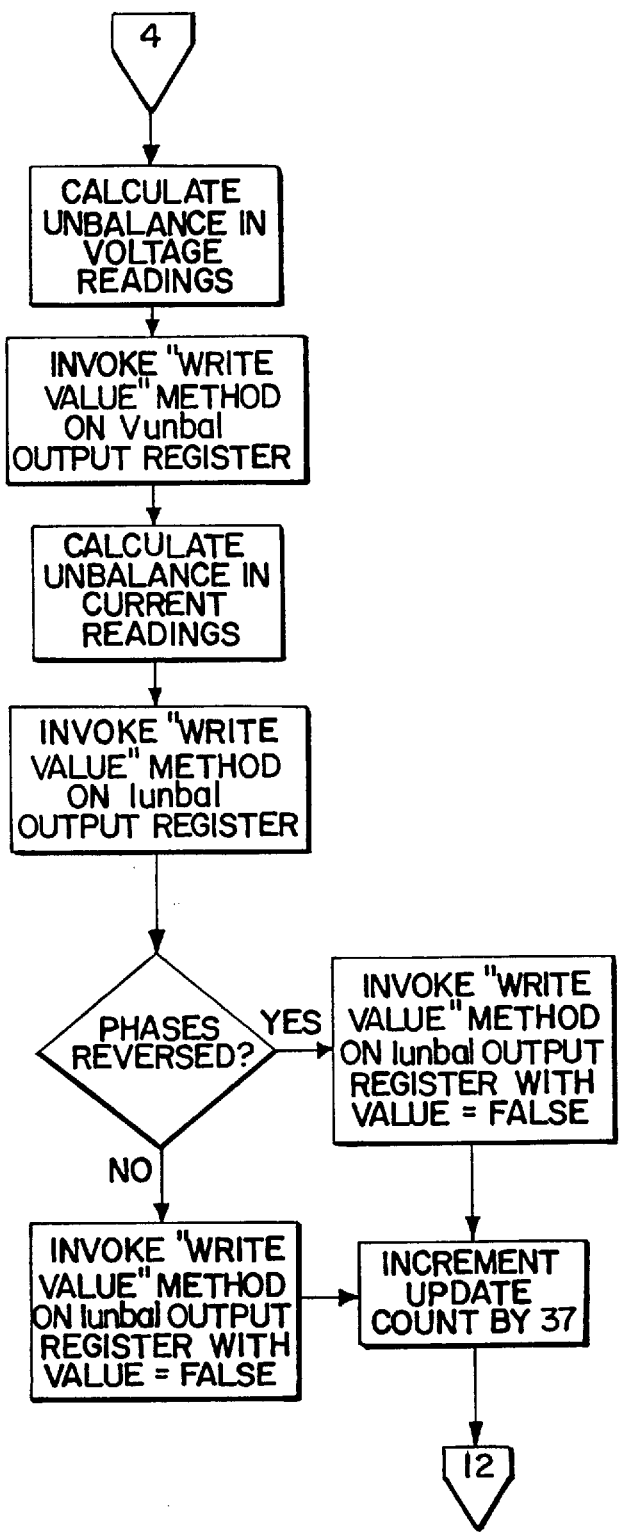
Figure 5H:
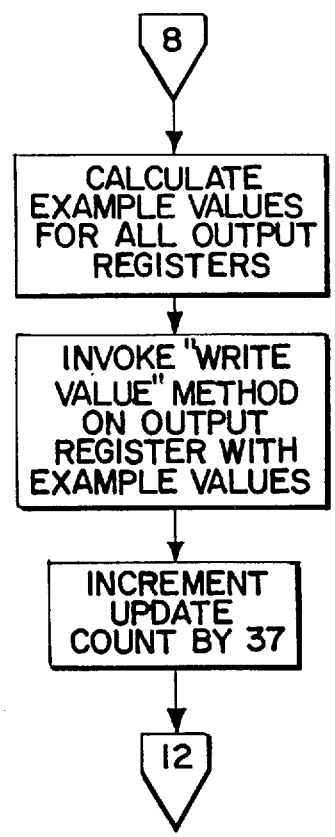
Figure 5E:
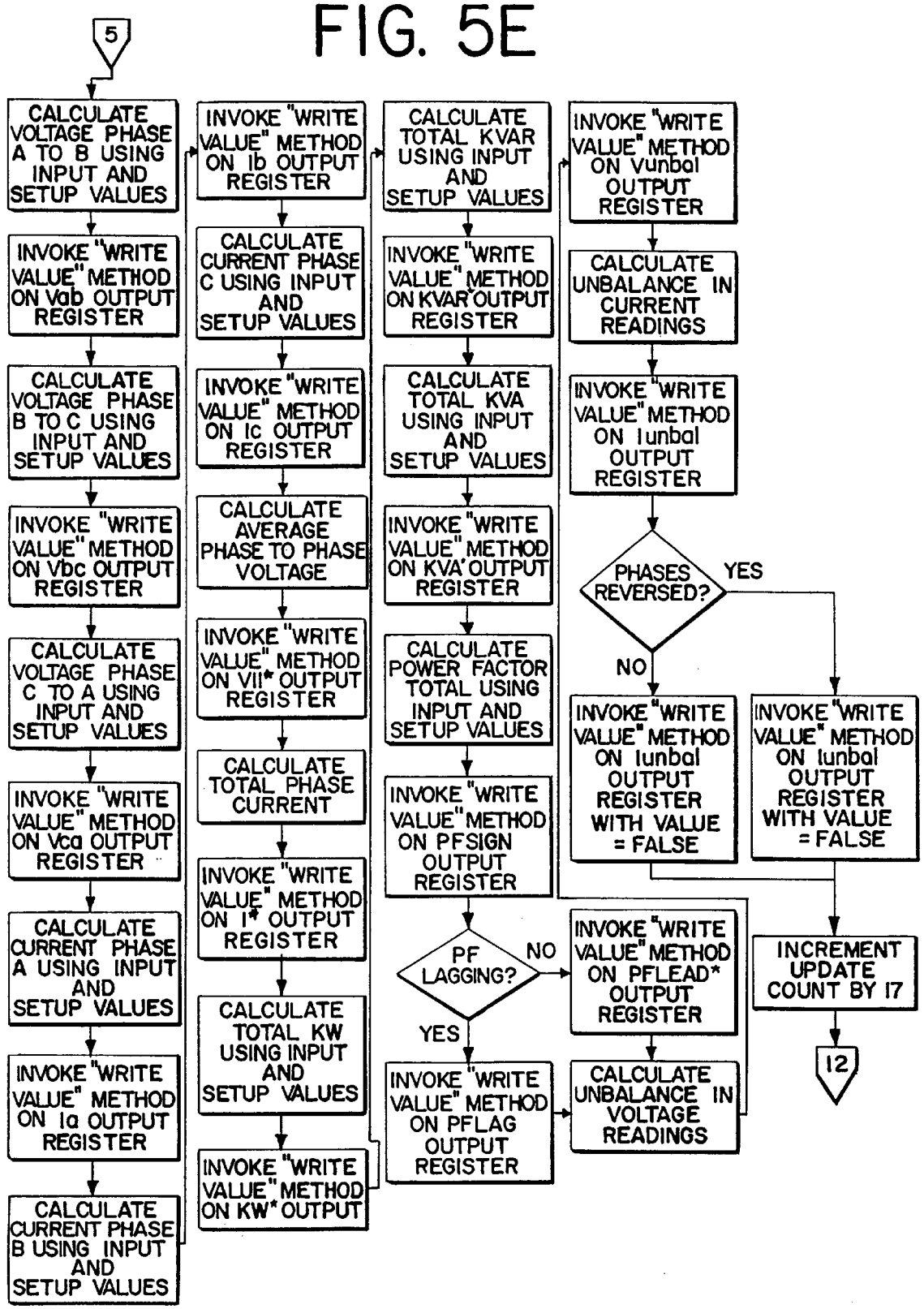
Figure 5F:
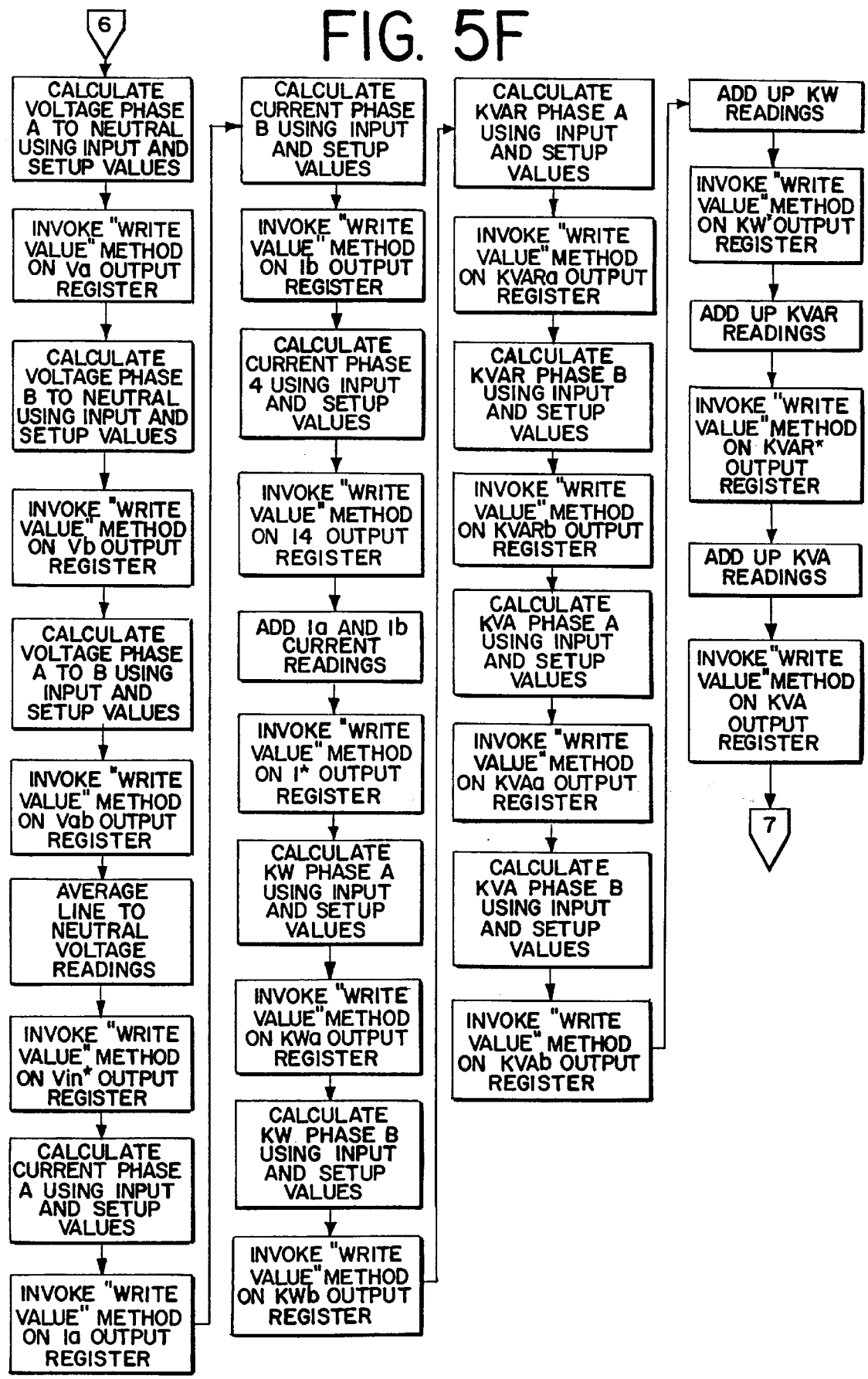
Figure 5G:
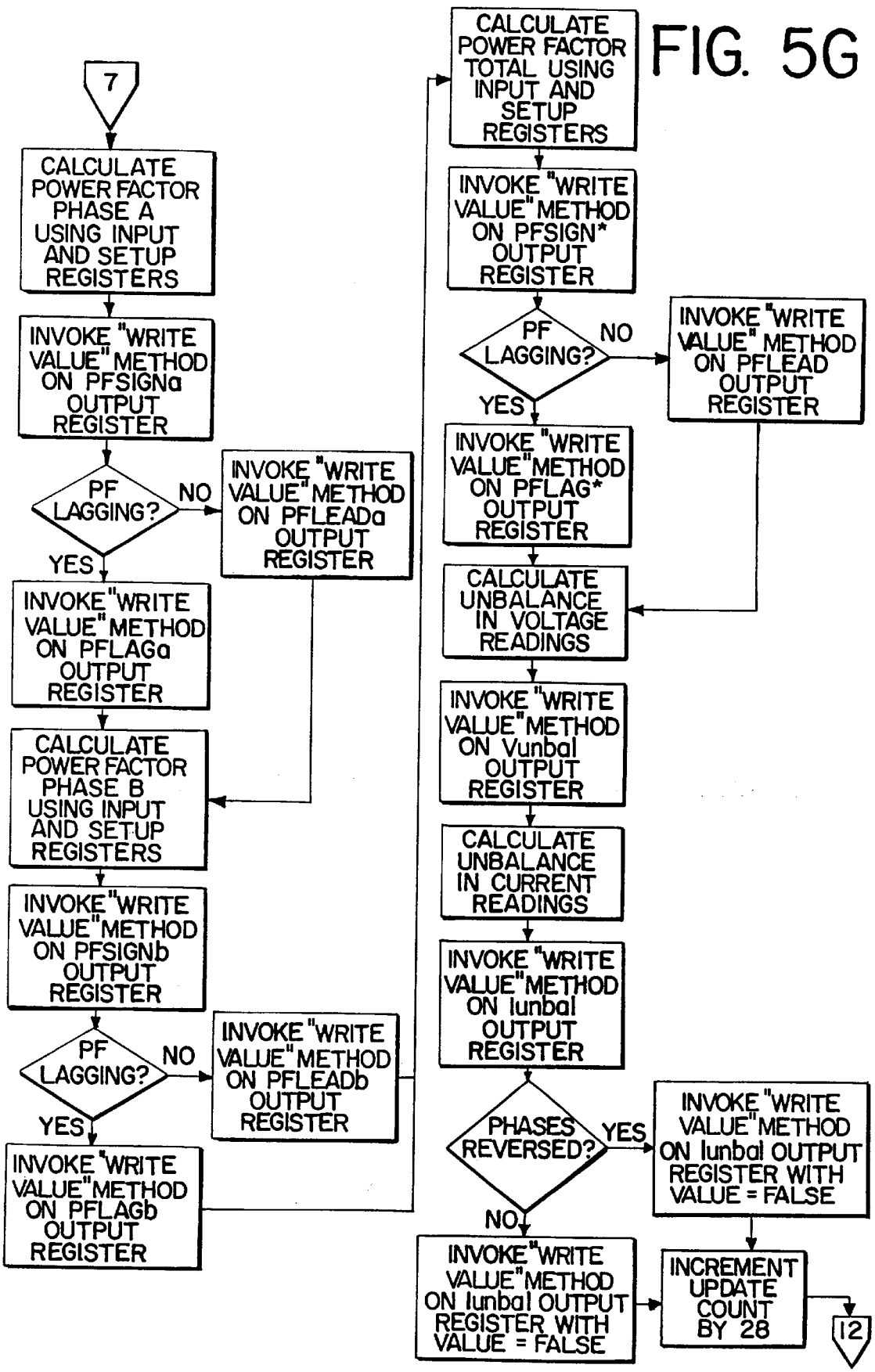
Figure 51:
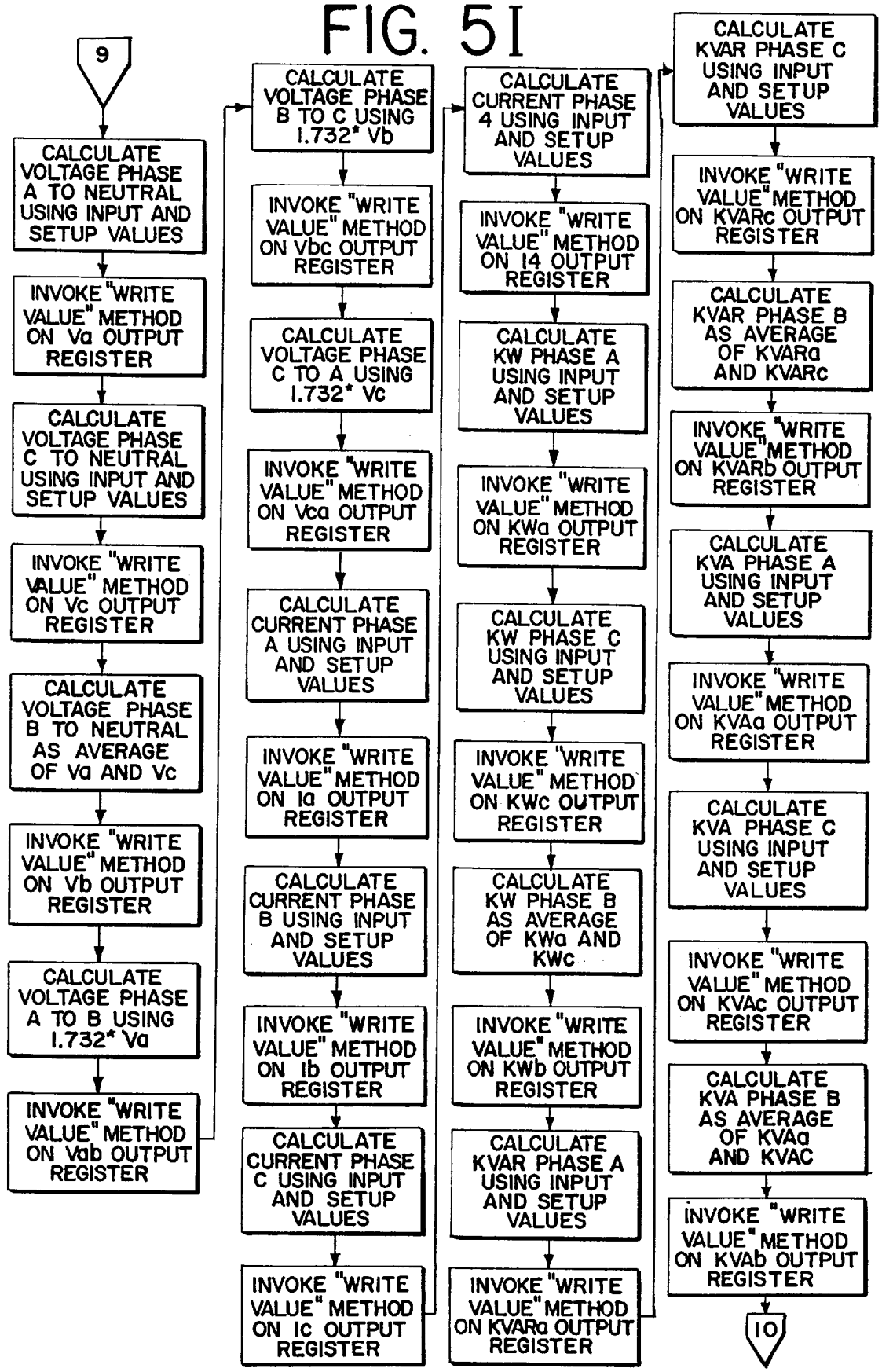
Figure 5J:
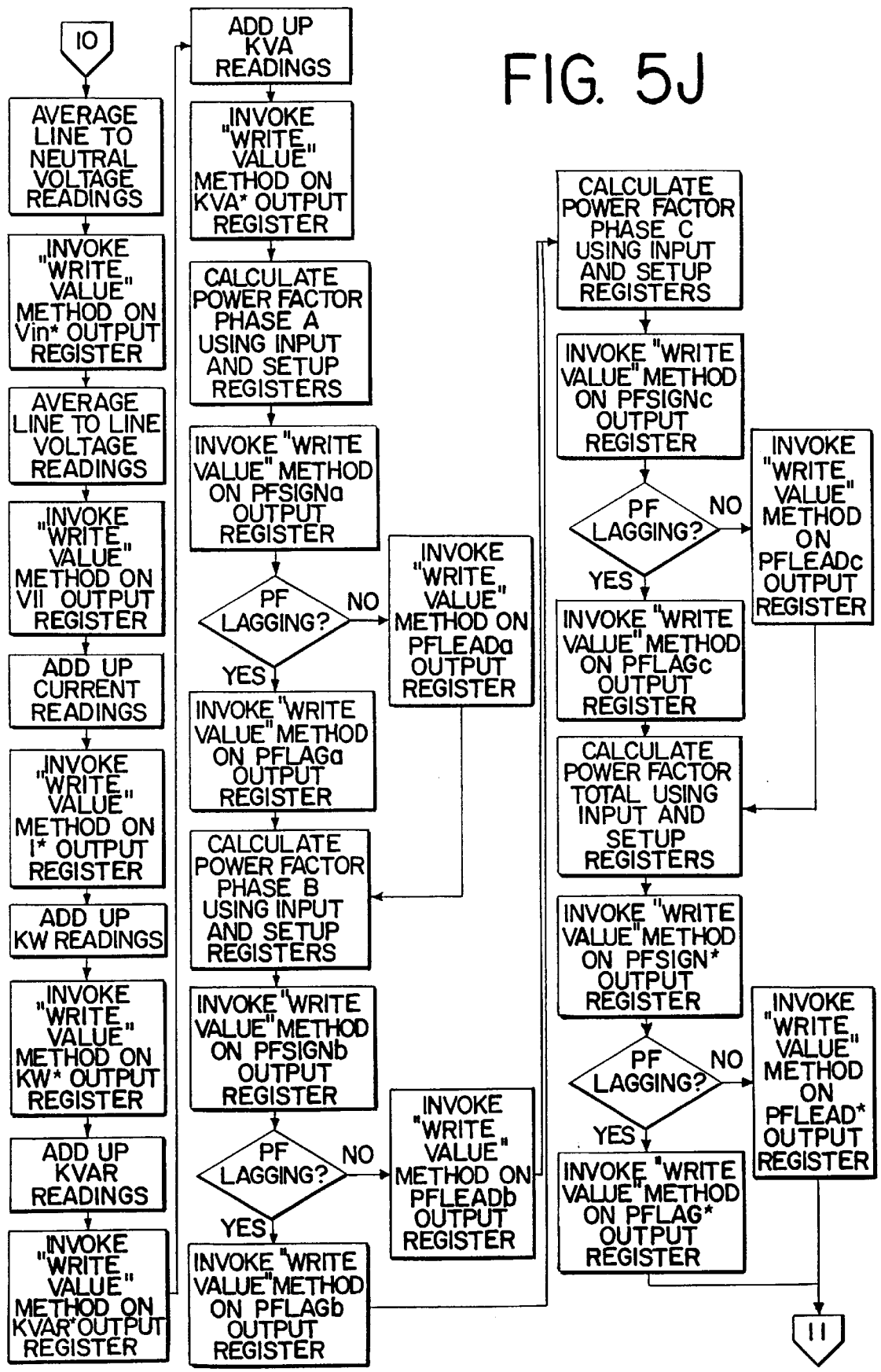
Figure 5K:
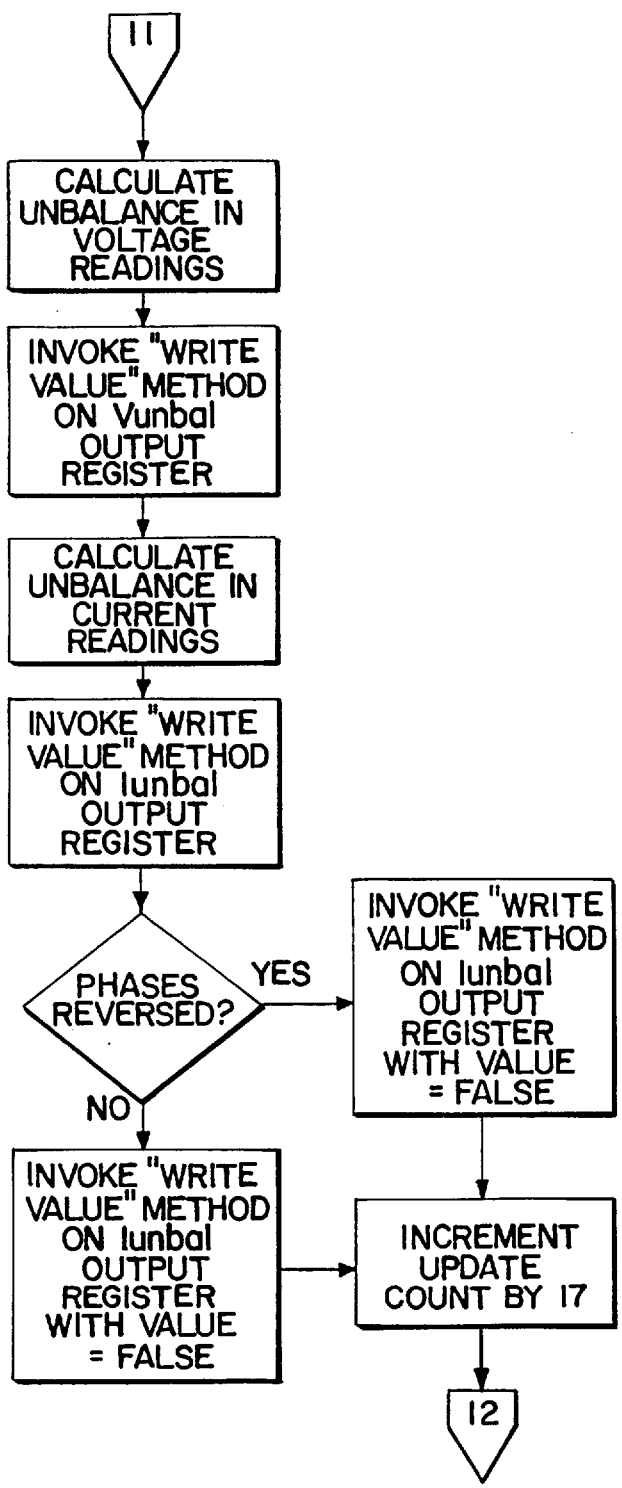
Figure 5L:
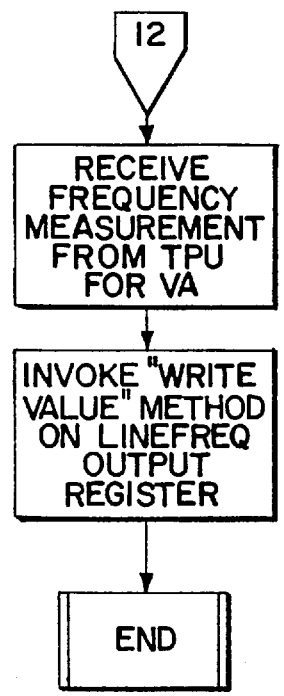

A description is now given of how the modules described above are used in the system of FIGS. 1–3. In the preferred embodiment the output registers from the data acquisition module 152 (FIG. 4) (which are digital signals representing the samples of the voltage and current) are permanently connected as input registers 120 of a module called the power meter module 126 (FIG. 5). Conceptually, the data acquisition module encompasses signal conditioning circuitry 60, 62, 64, 66A, 66B, 66C, 68A, 68B, 68C, 70, the A/D converters 29, 30 and software in the DSP 28. The interface between the data acquisition module and the power meter module includes the dual port RAM 27. A flow chart for the logic of the client portion of the data acquisition module 152 is shown in FIG. 4A. The power meter module 126 owns setup registers 122 which modify the operation of the power meter module 126 and output registers 124 which contain the results of the calculations that the power meter module does and can be connected to other modules. A flow chart of the logic for the power meter module 126 is shown in FIGS. 5A–5L.

Figure 6:
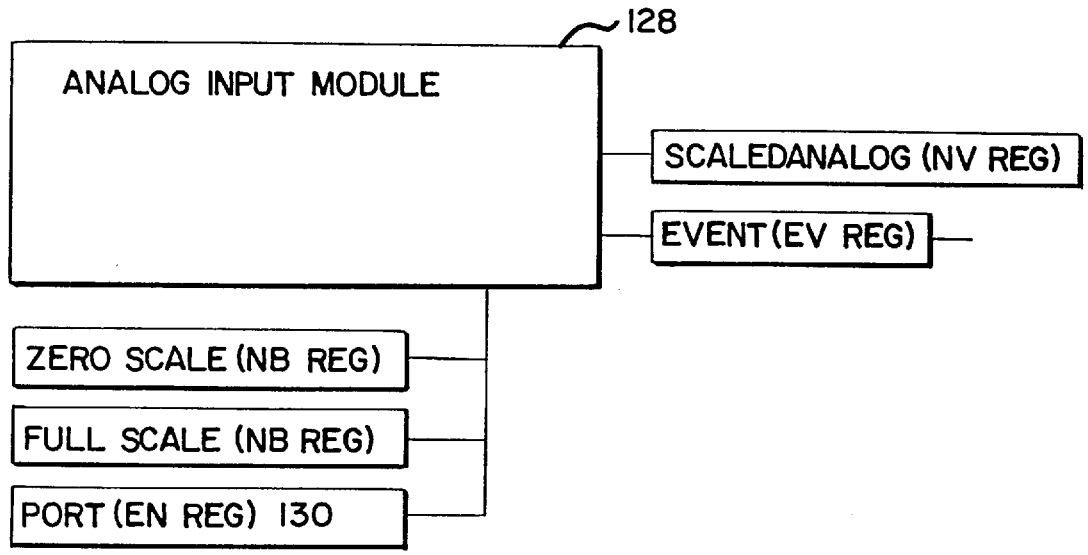
FIG. 6 schematically illustrates a preferred embodiment of the analog input module and its respective registers.
Figure 7:
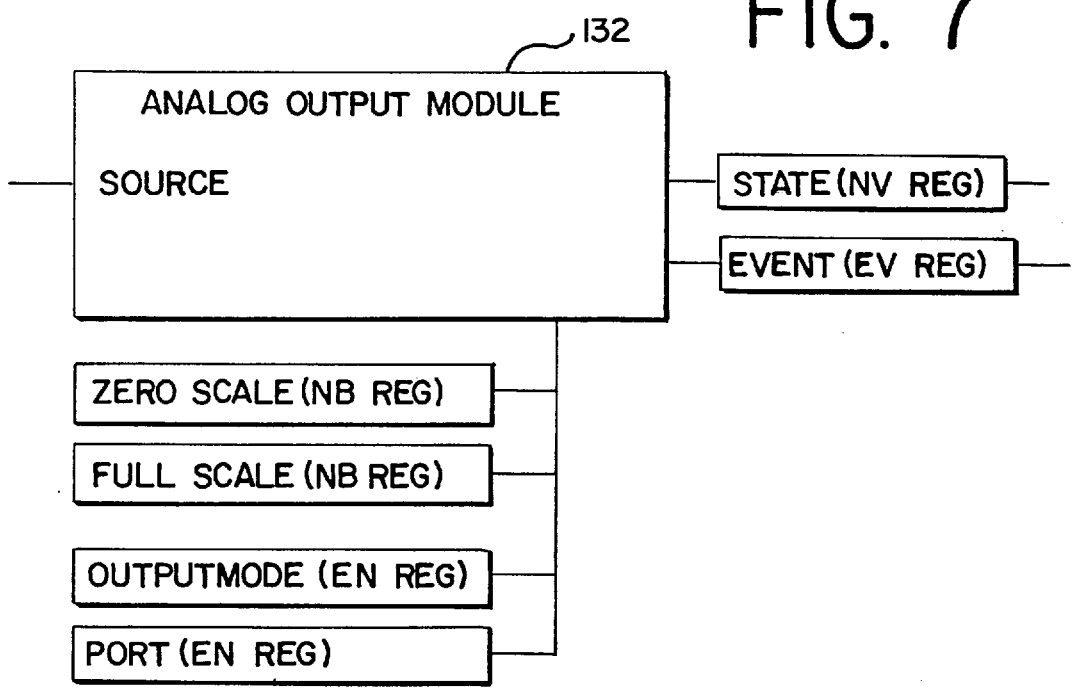
FIG. 7 schematically illustrates a preferred embodiment of the analog output module and its respective registers.
Figure 6A:
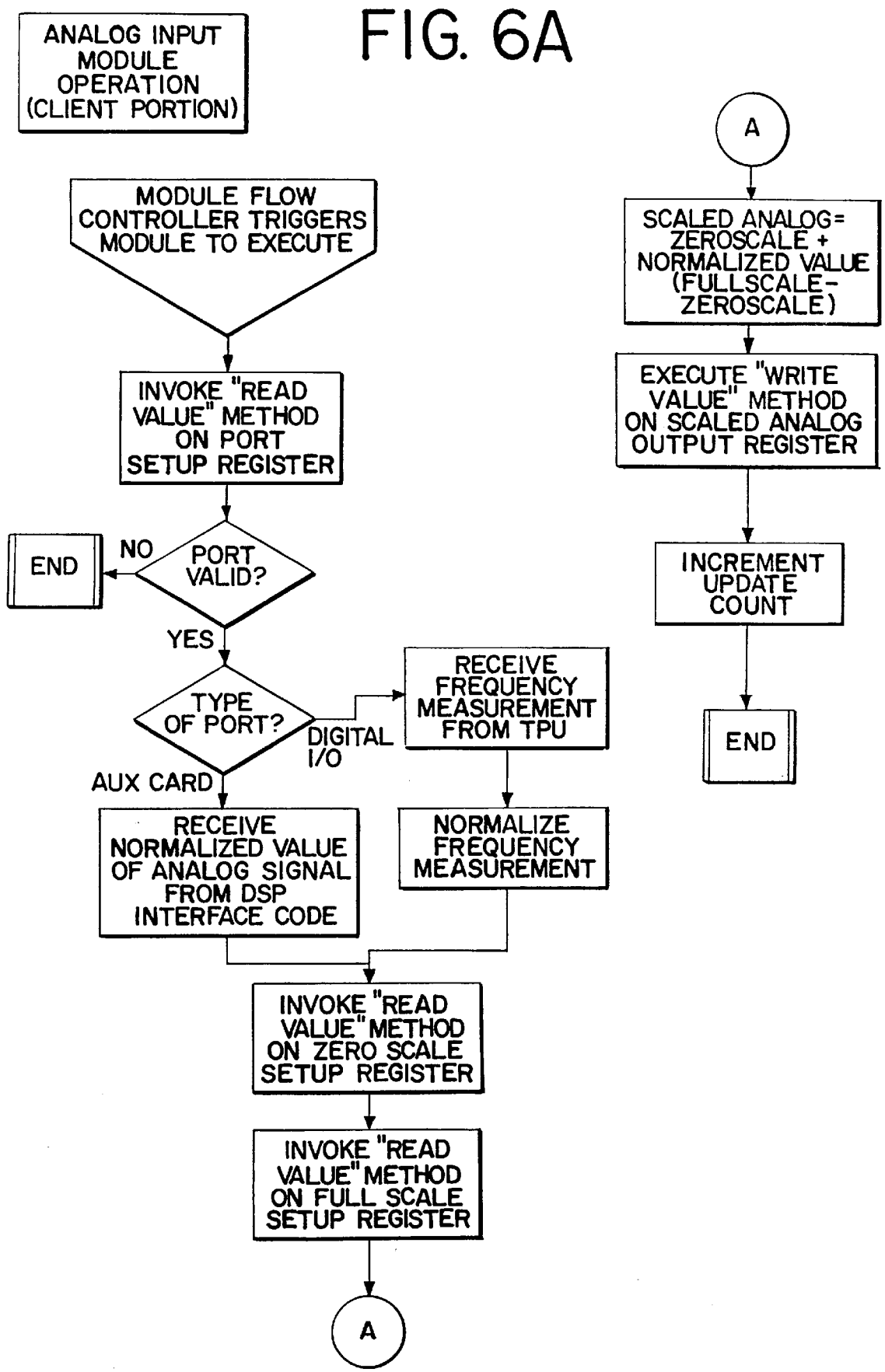
FIG. 6A shows a flowchart of a preferred embodiment of the logic for the client portion of the analog input module.

The module called the analog input module is an example of a module which connects to a physical signal in a different way. A preferred embodiment of the analog input module 128 is illustrated schematically in FIG. 6. An exemplary embodiment of the logic for the client portion of the analog input module of FIG. 6 is illustrated in flowchart form in FIG. 6A. The analog input module 128 owns a port setup register 130 which defines which of the auxiliary input signals 20 the module is associated with. Analog input modules can also be connected to digital I/O signals 44 (FIG. 2). In this configuration, the Digital I/O transceiver 49 operates in input mode and the analog input module converts the frequency of the digital signal into a number. In this embodiment, an external voltage to frequency converter is connected to the digital input signal line.

Figure 7A:
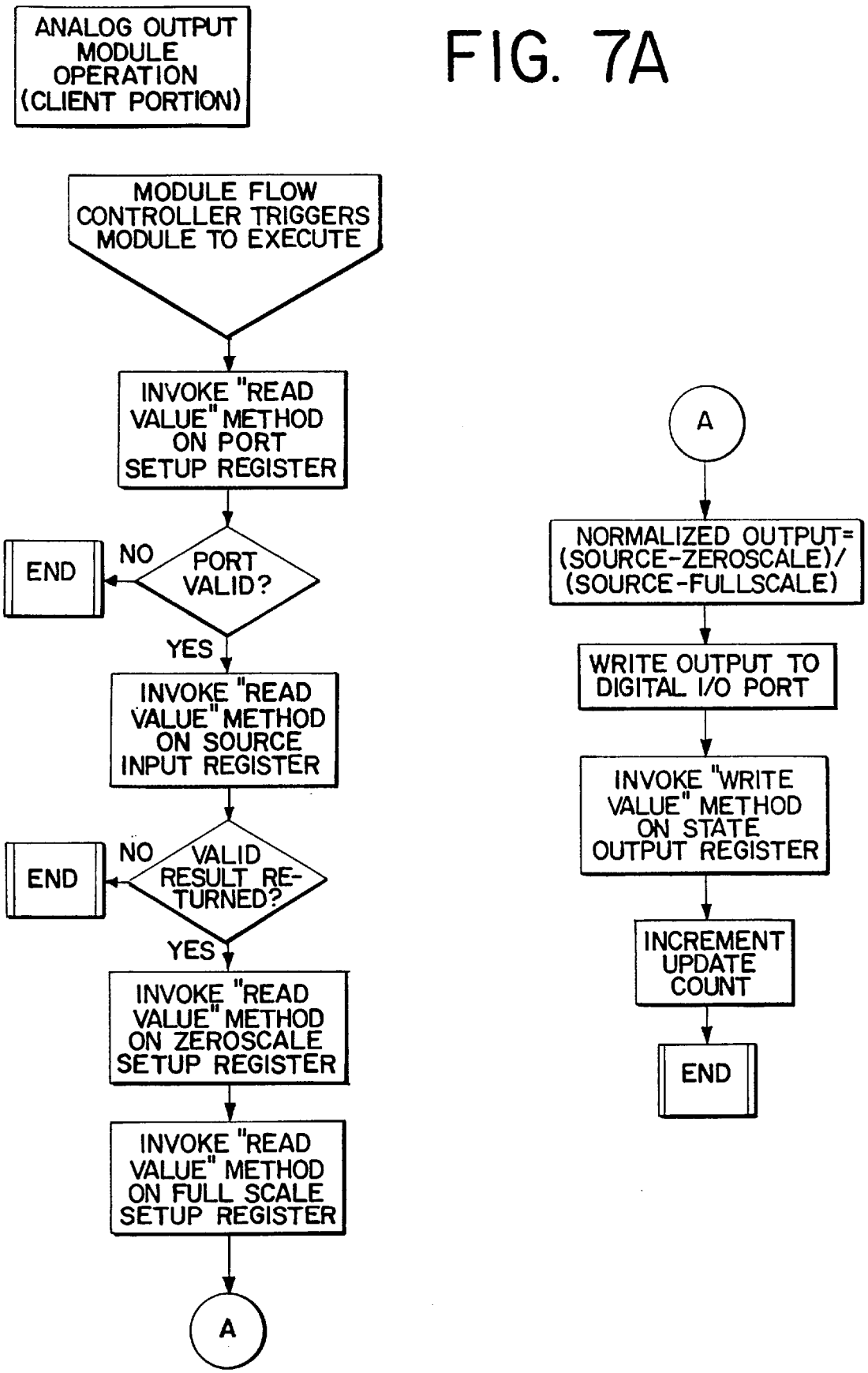
FIG. 7A shows a flowchart of a preferred embodiment of the logic for the client portion of the analog output module.
Figure 9:
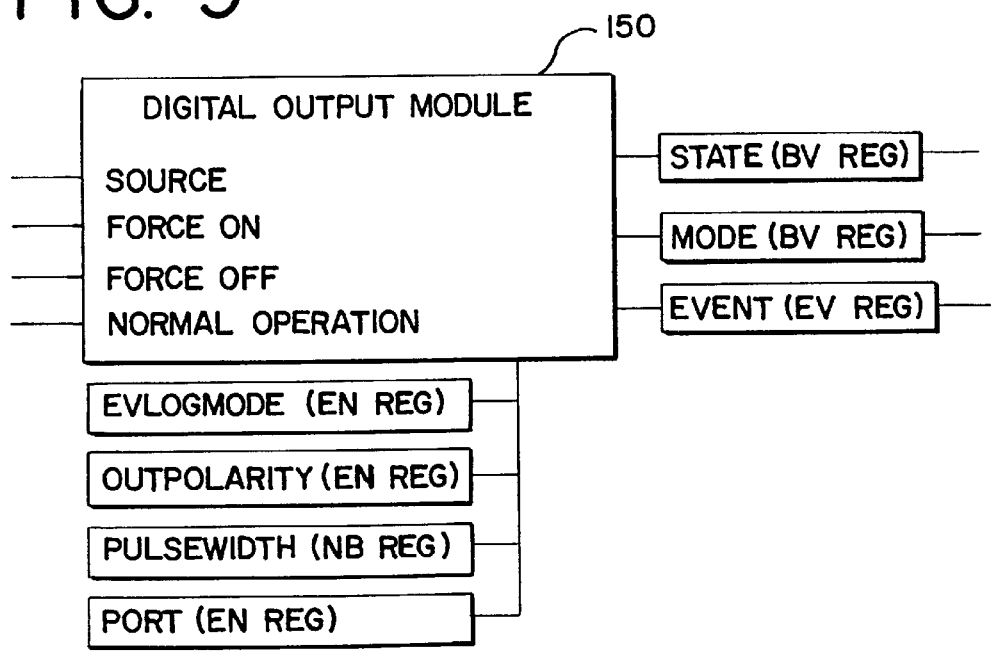
FIG. 9 schematically illustrates a preferred embodiment of the digital output module and its respective registers.

Analog output modules can also be connected to the Digital I/O Signals 44. In this configuration, an external device is connected to the I/O line which converts the digital signals coming from the analog output module 130 to an analog signal. A preferred embodiment of the analog output module 130 is illustrated schematically in FIG. 7. An exemplary embodiment of the logic for the client portion of the analog output module 130 is illustrated in FIG. 7A in flowchart form.

Figure 8:
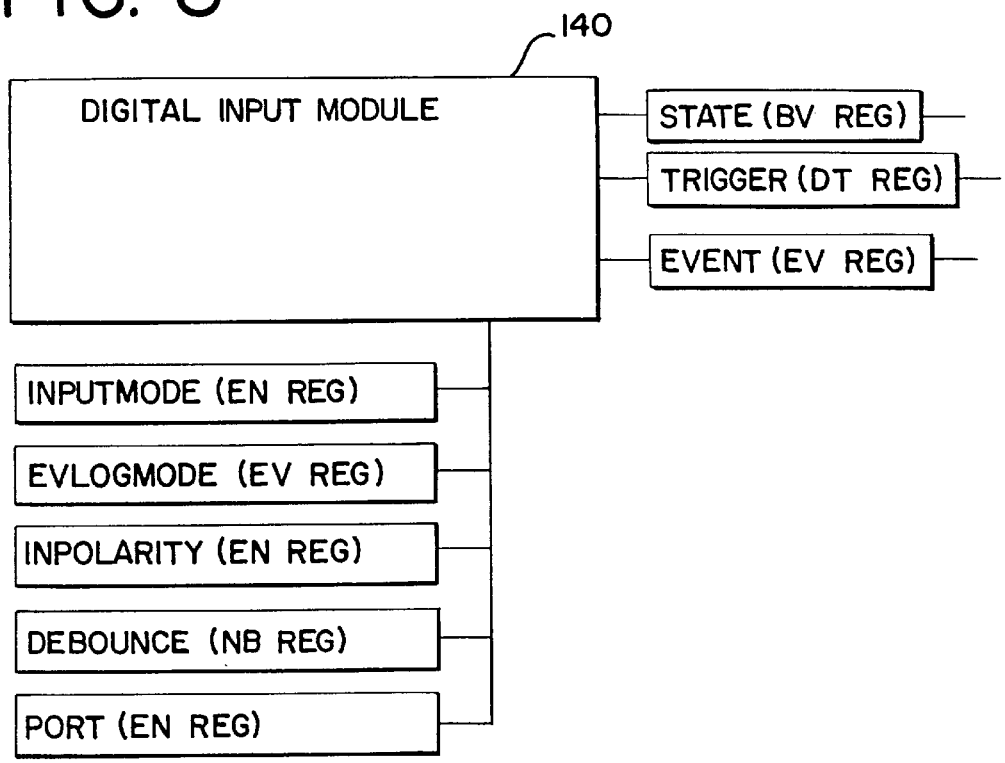
FIG. 8 schematically illustrates a preferred embodiment of the digital input module and its respective registers.
Figure 8A:
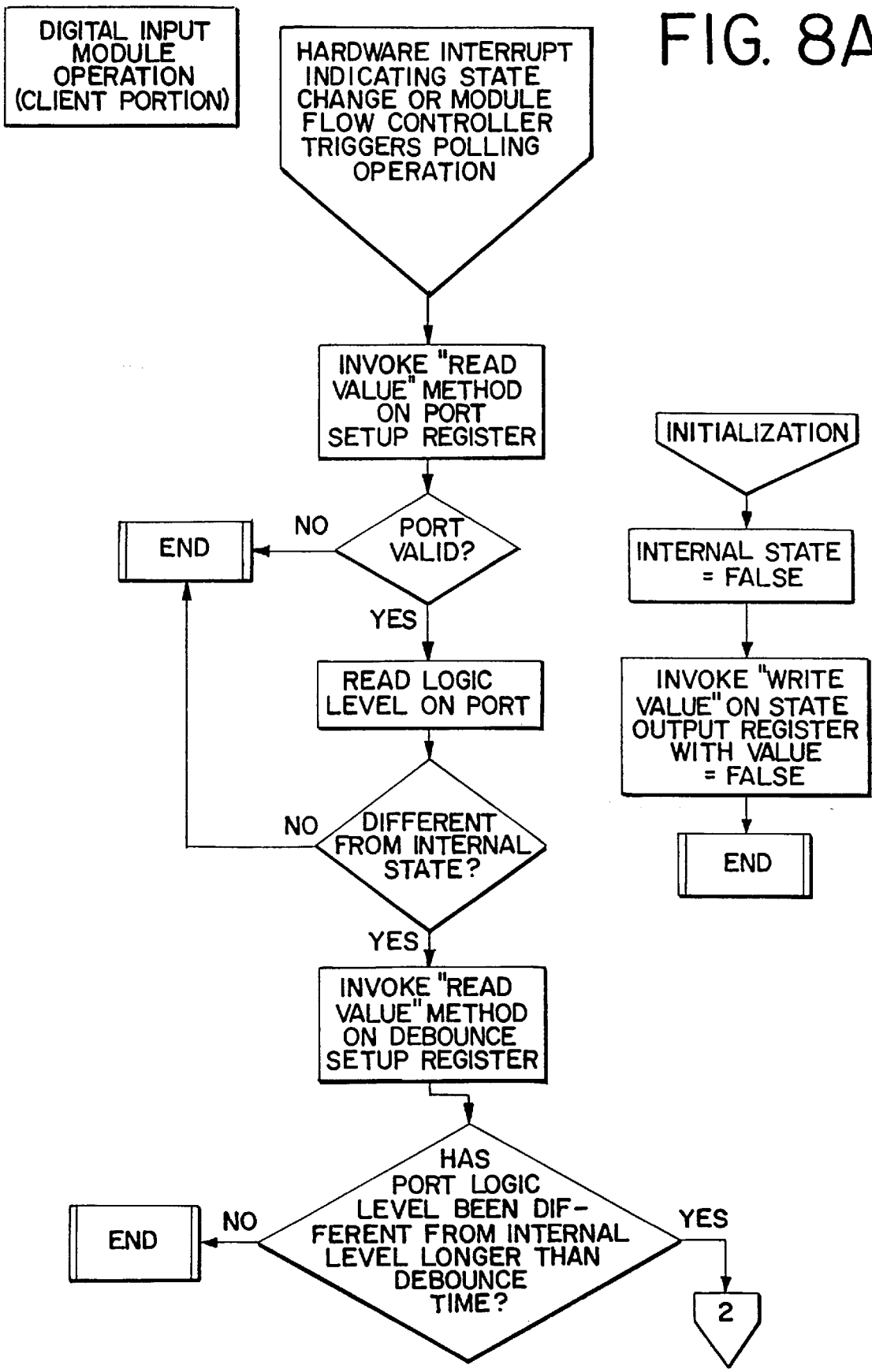
FIGS. 8A–8B show a flowchart of a preferred embodiment of the logic for the client portion of the digital input module.
Figure 8B:
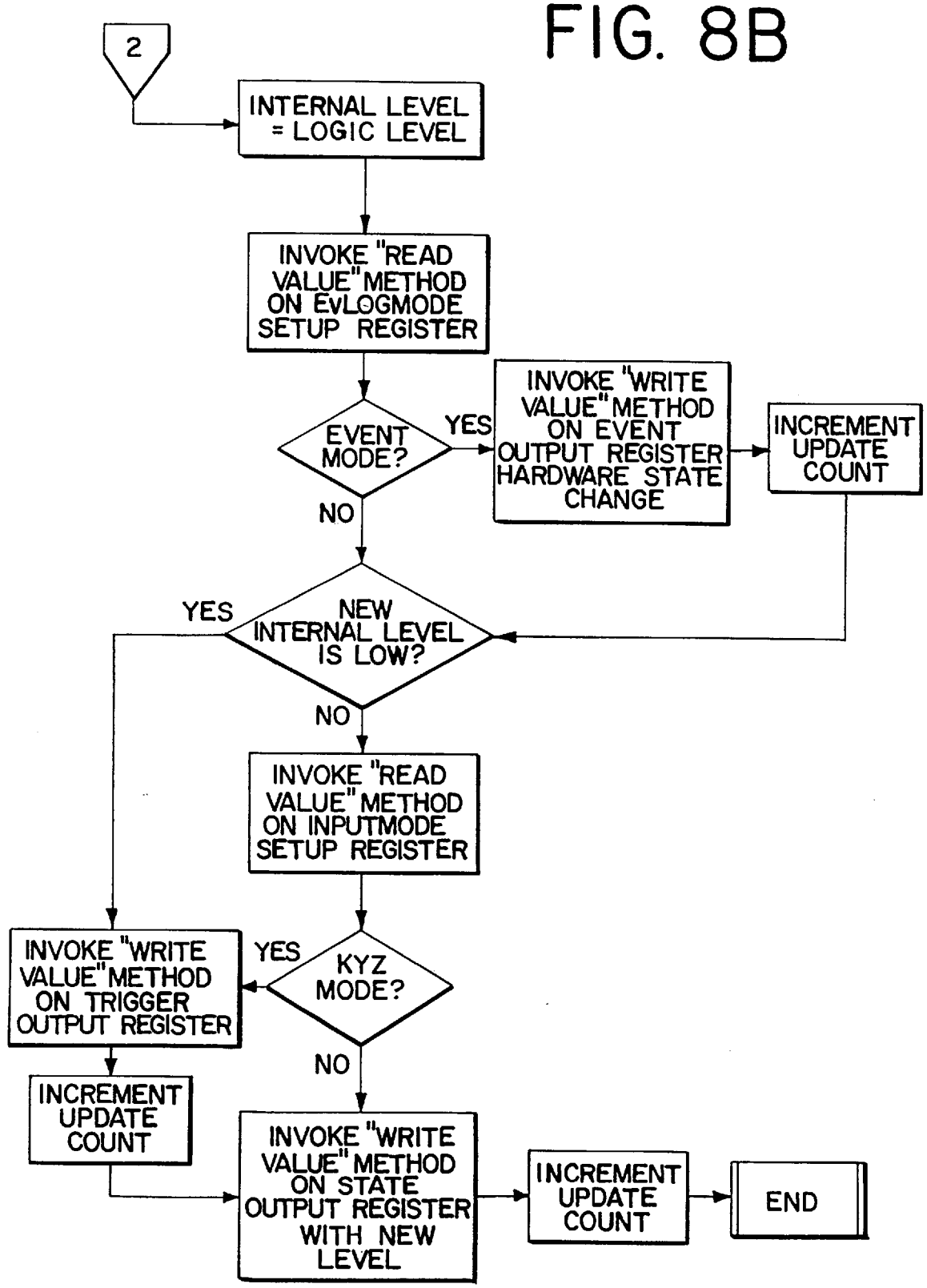
Figure 9A:
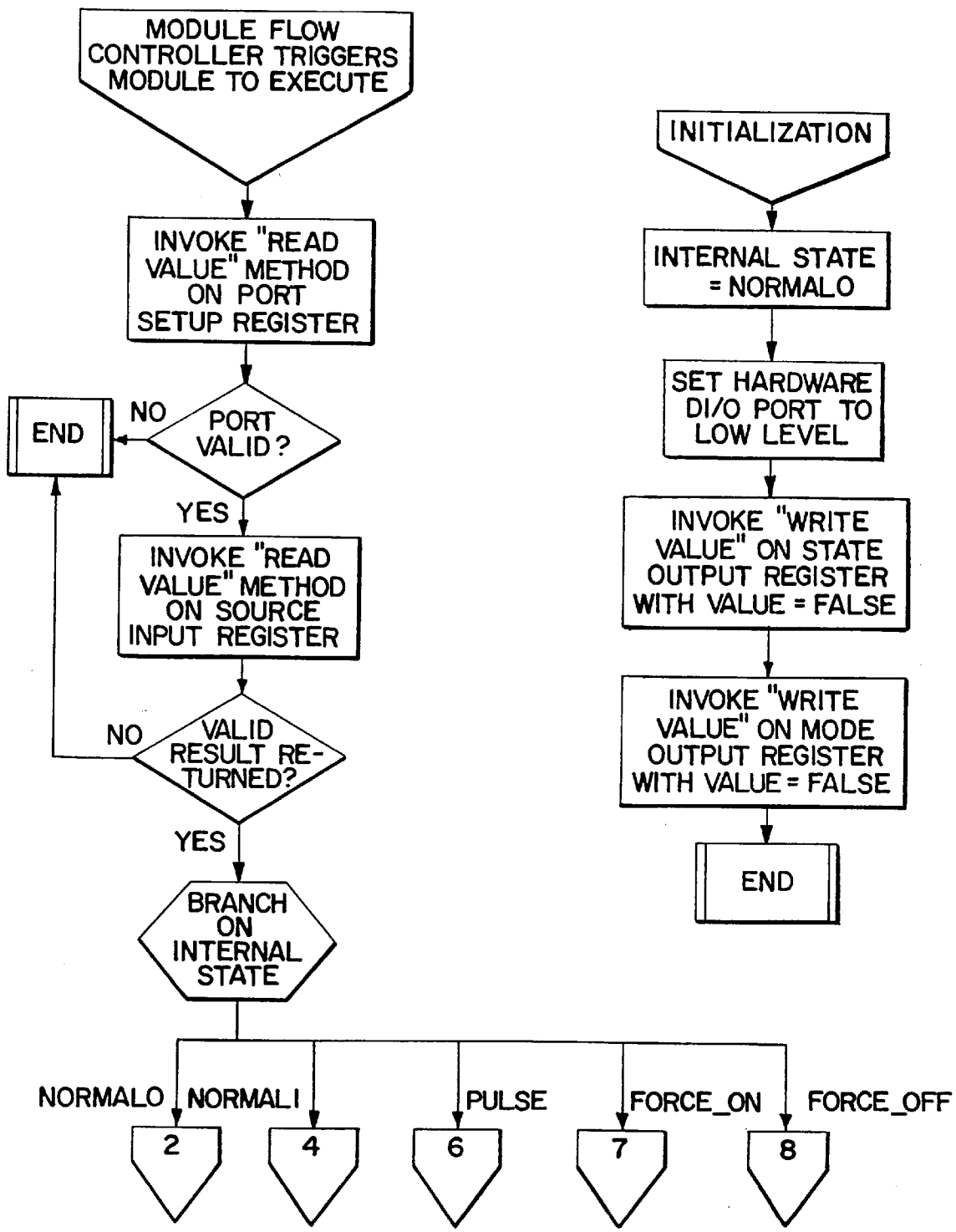
FIGS. 9A–9H show a flowchart of a preferred embodiment of the logic for the client portion of the digital output module.
Figure 9B:
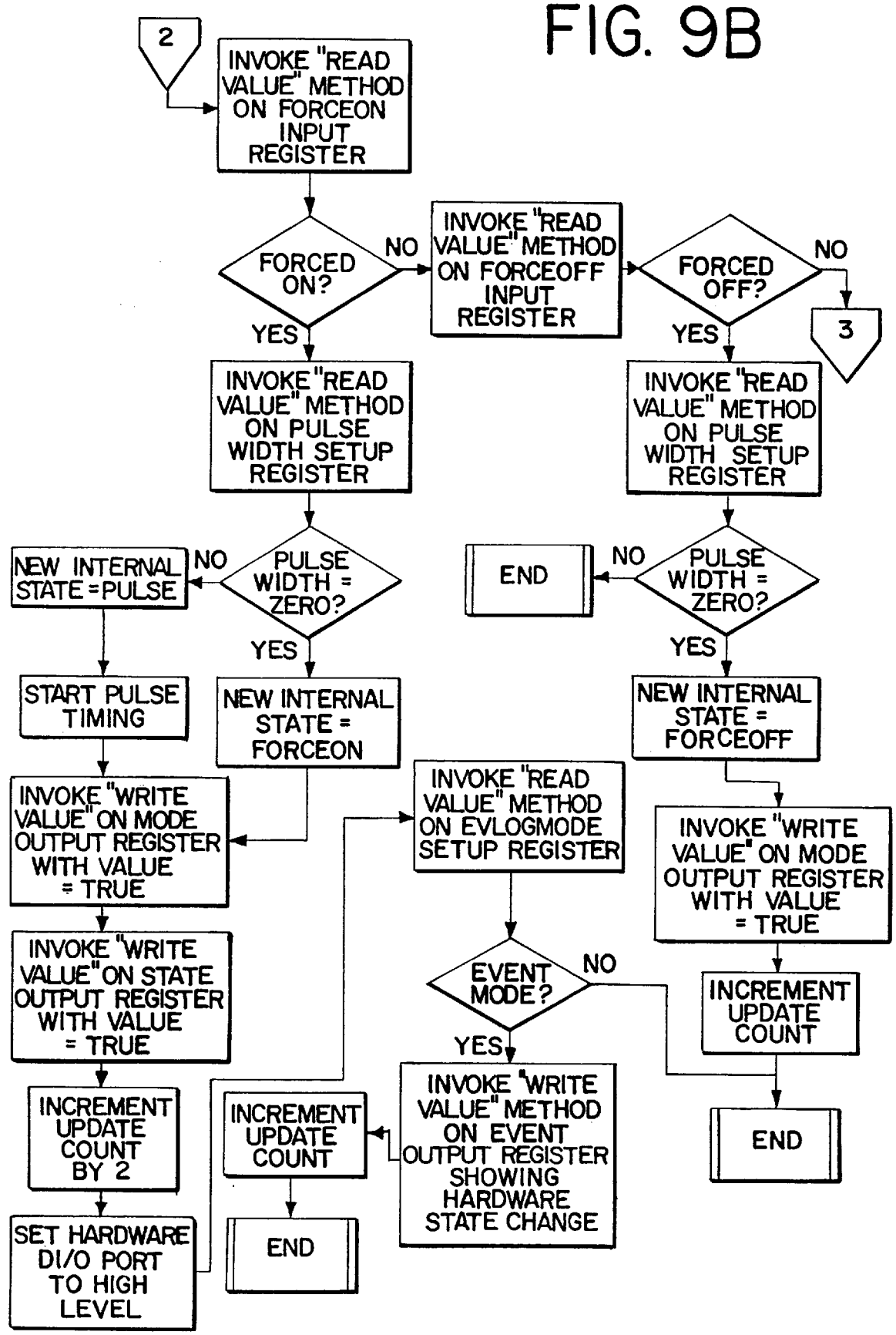
Figure 9C:
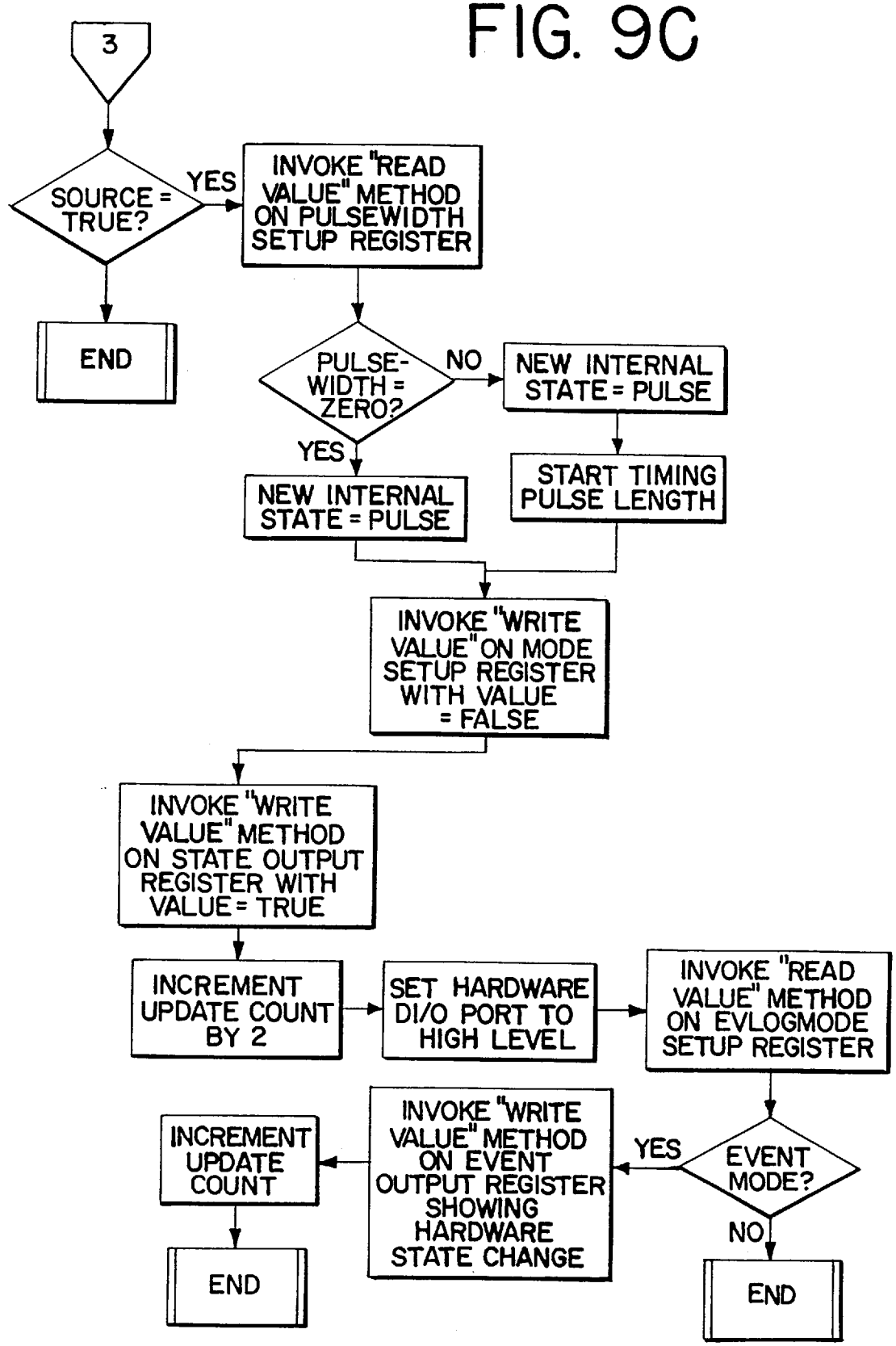
Figure 9D:
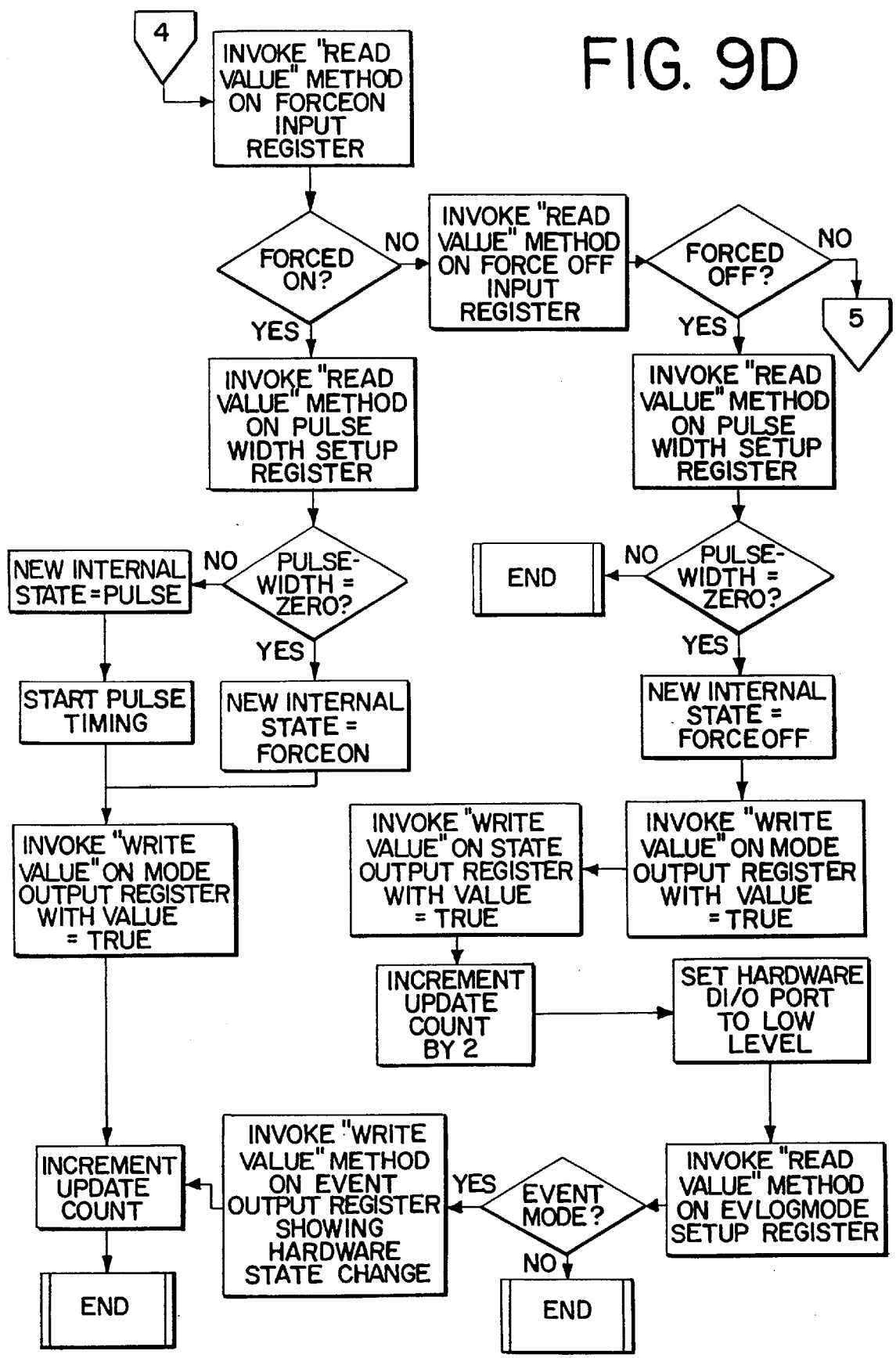
Figure 9E:
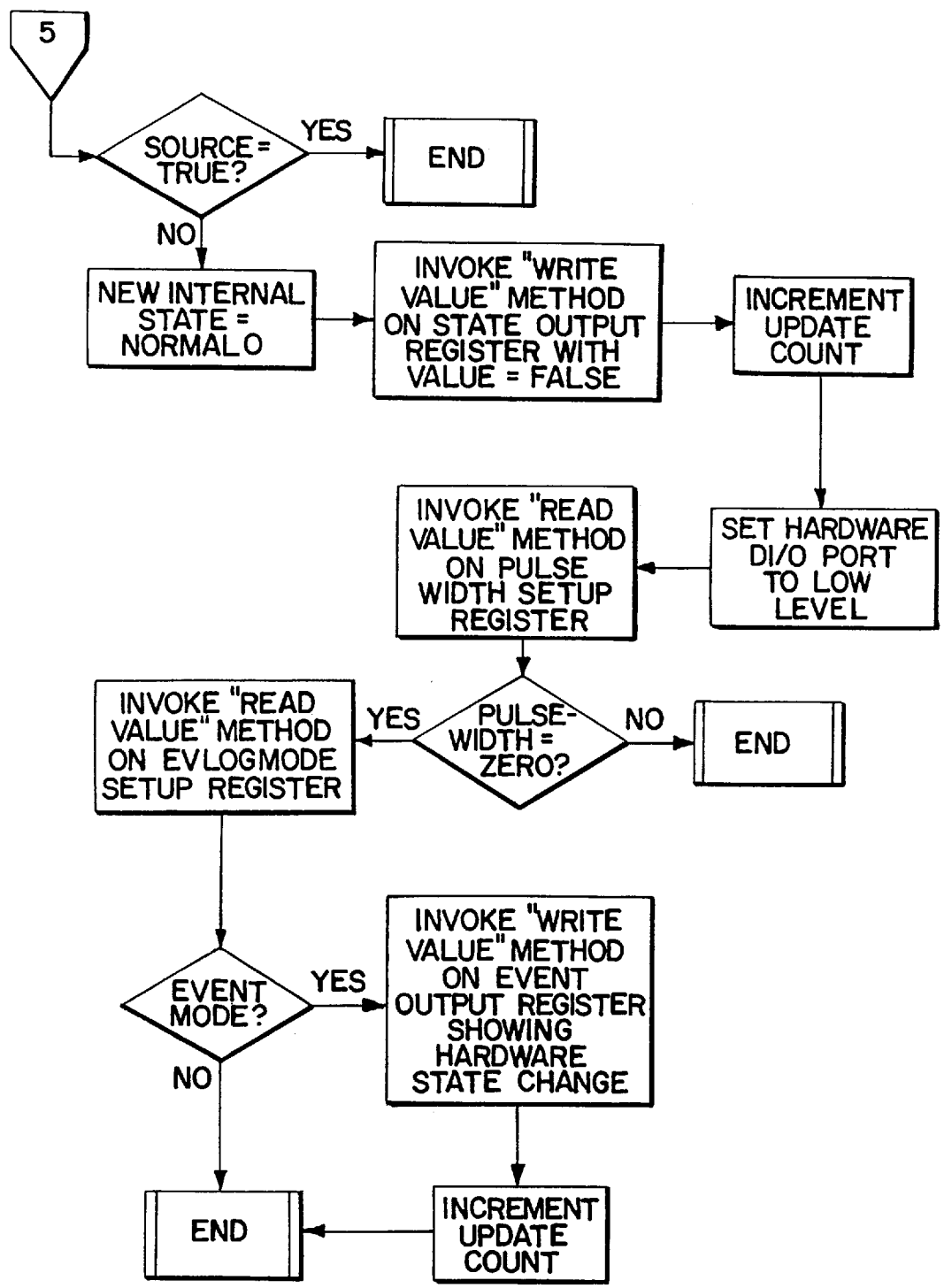
Figure 9F:
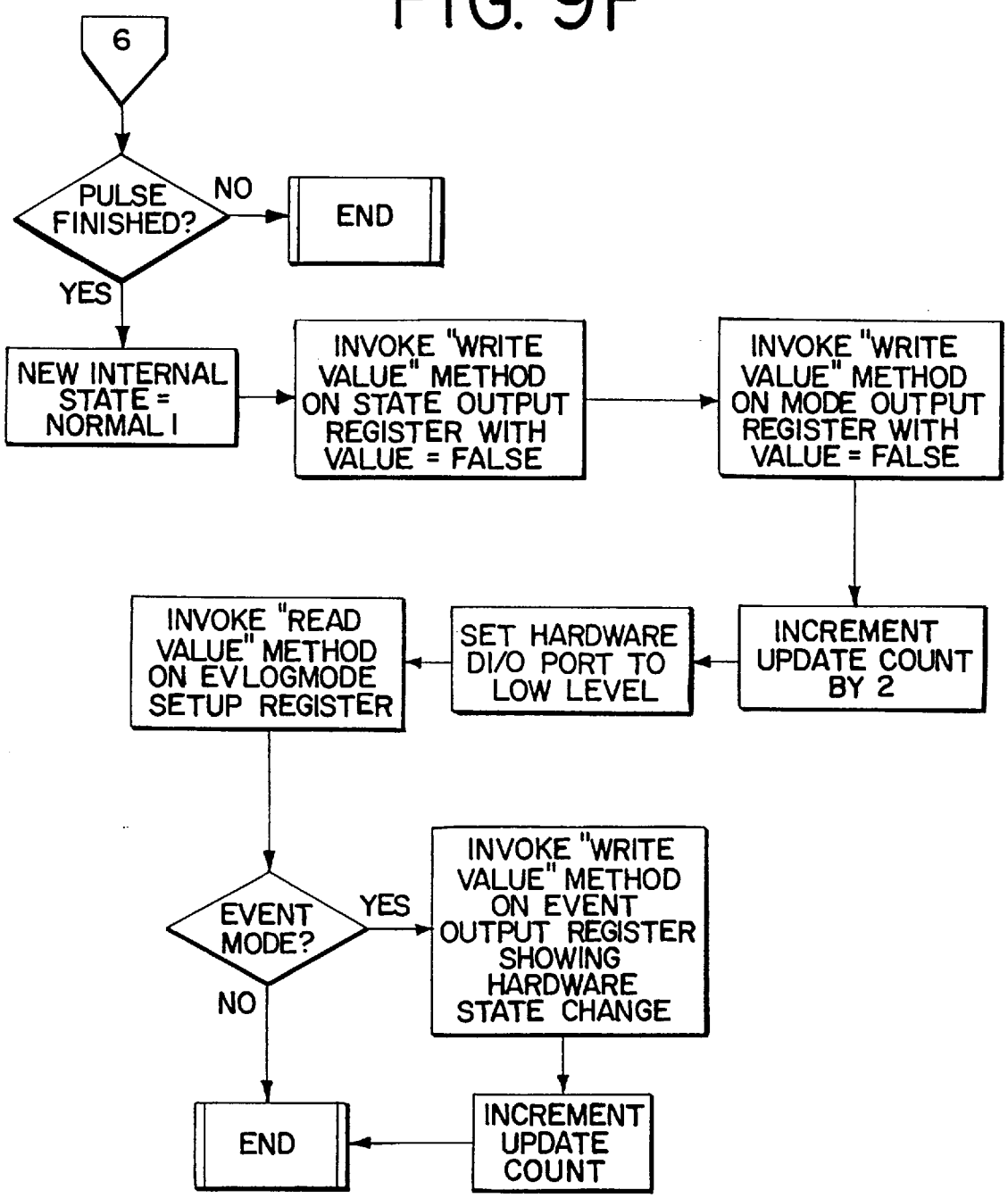
Figure 9G:
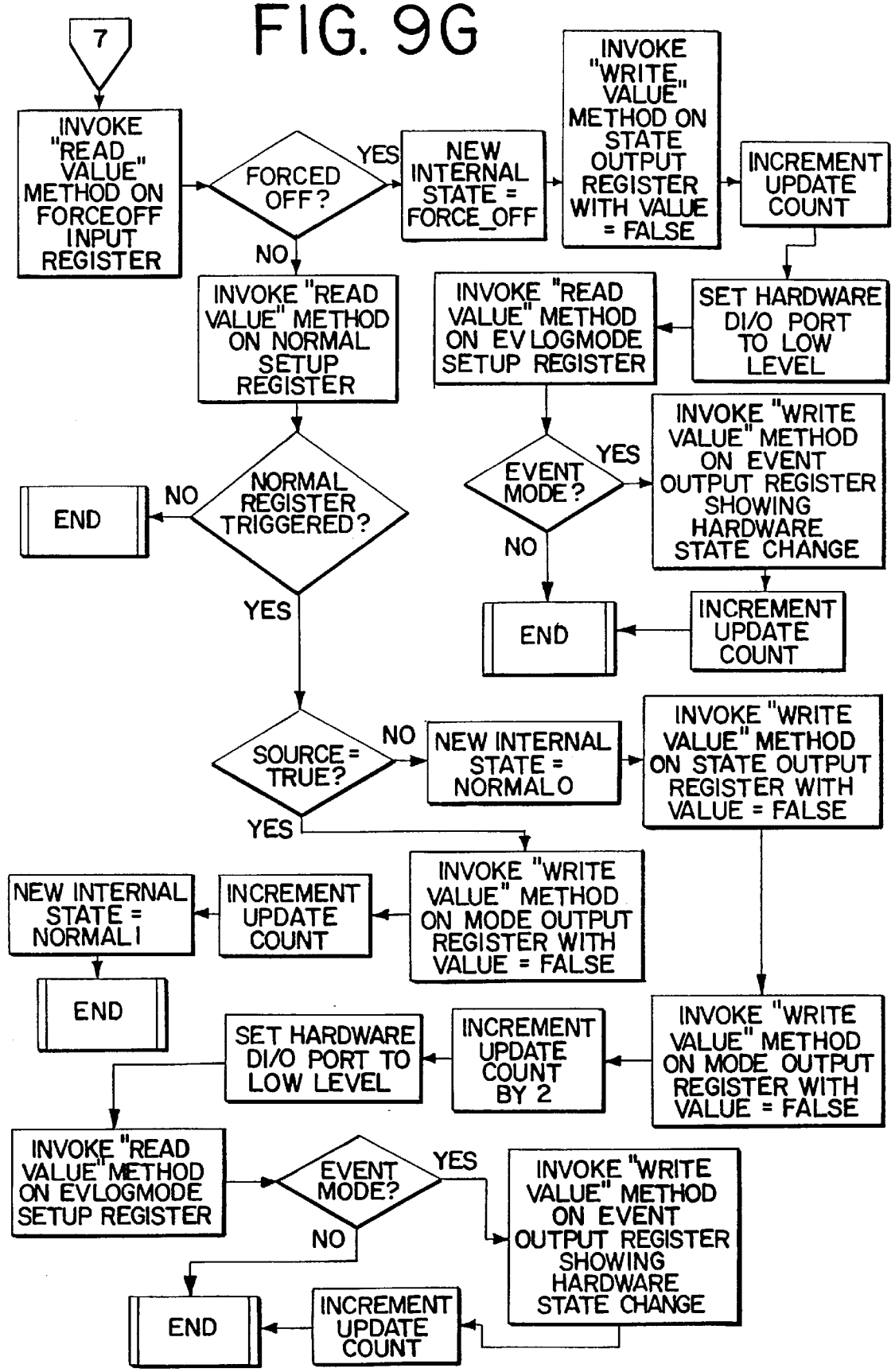
Figure 9H:
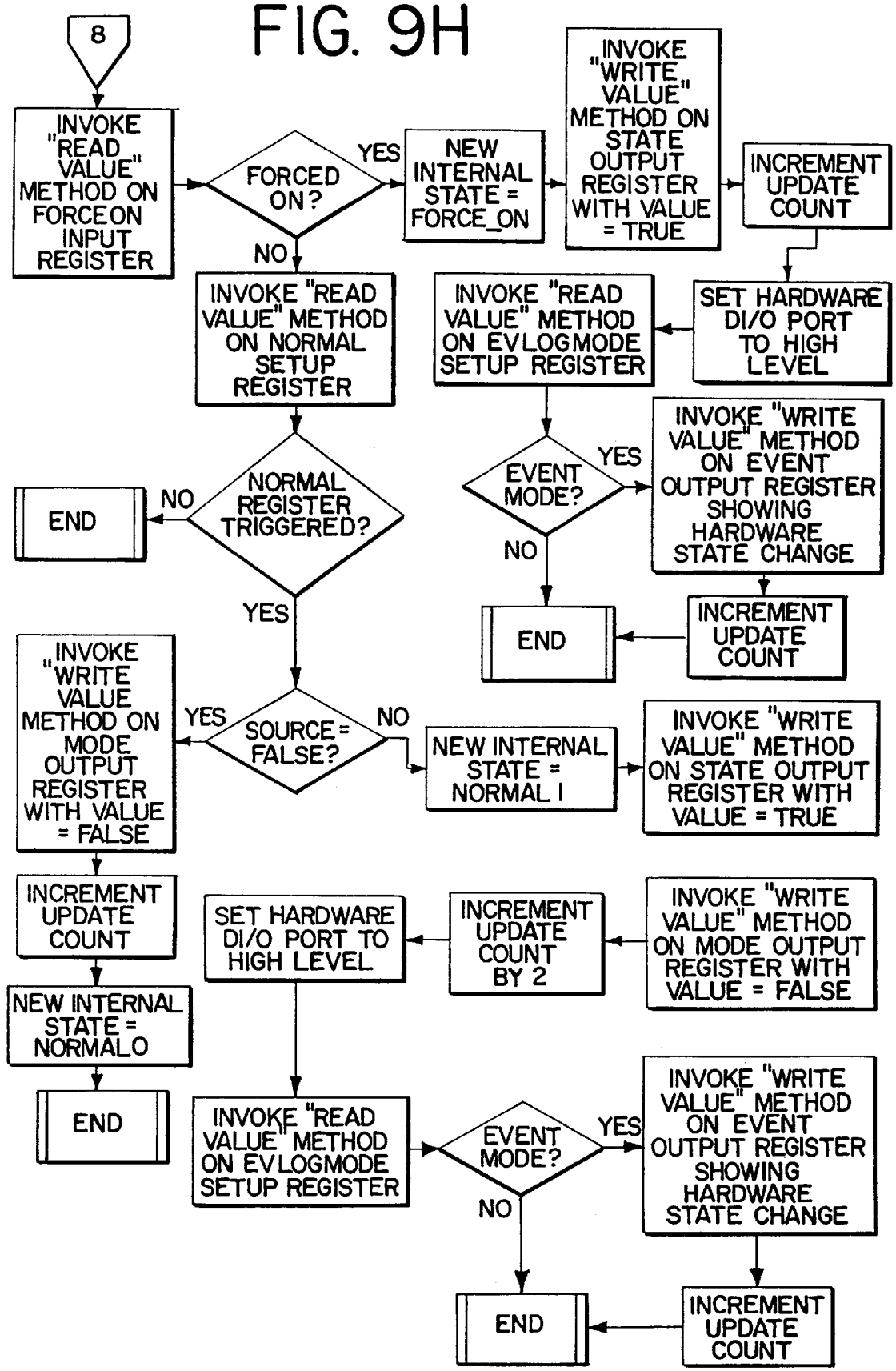

The digital input module 140 transforms a digital I/O signal 44 into a form that can be used as an input to other modules. A preferred embodiment of the digital input module 140 is illustrated schematically in FIG. 8. An exemplary embodiment of the logic for the client portion of the digital input module 140 is illustrated in FIGS. 8A–8B in flowchart form.

The digital output module 150 transforms the output from another module into a signal on a digital I/O signal line 44. A preferred embodiment of the digital output module 150 is illustrated schematically in FIG. 9. An exemplary embodiment of the logic for the client portion of the digital output module 150 is illustrated in FIGS. 9A–9H in flowchart form.

Figure 13:
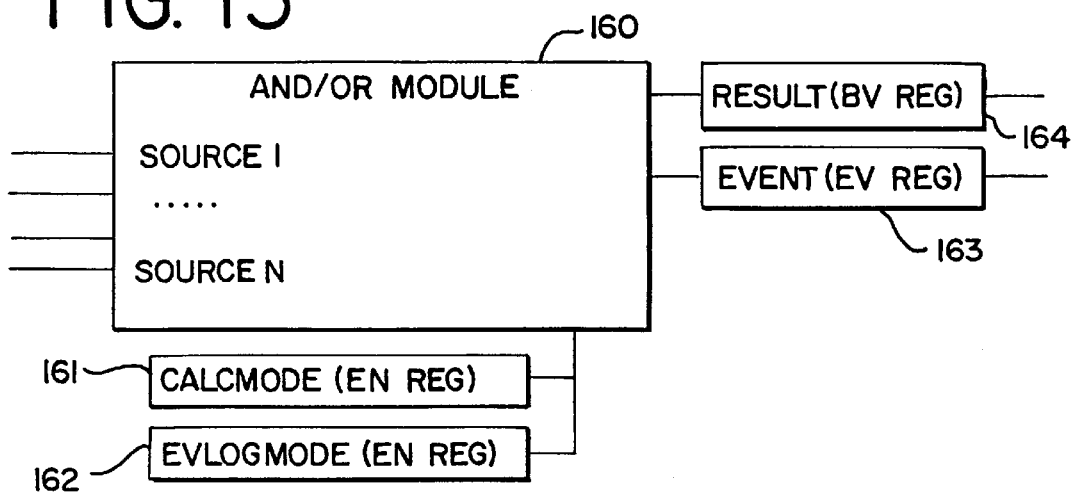
FIG. 13 schematically illustrates a preferred embodiment of the AND/OR module and its respective registers.
Figure 13A:
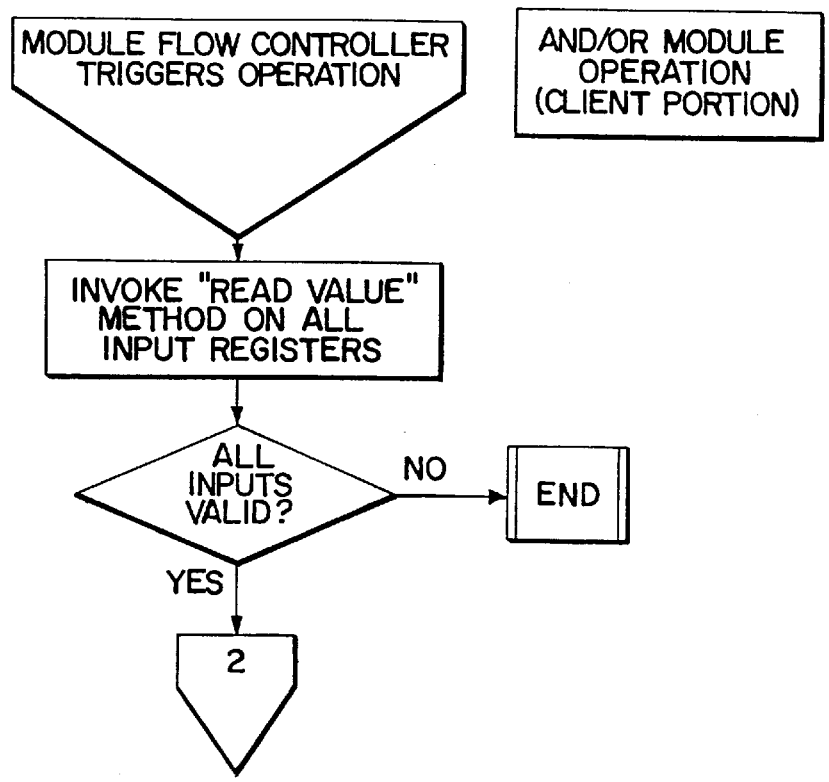
FIGS. 13A–13B show a flowchart of a preferred embodiment of the logic for the client portion of the AND/OR module.
Figure 14:
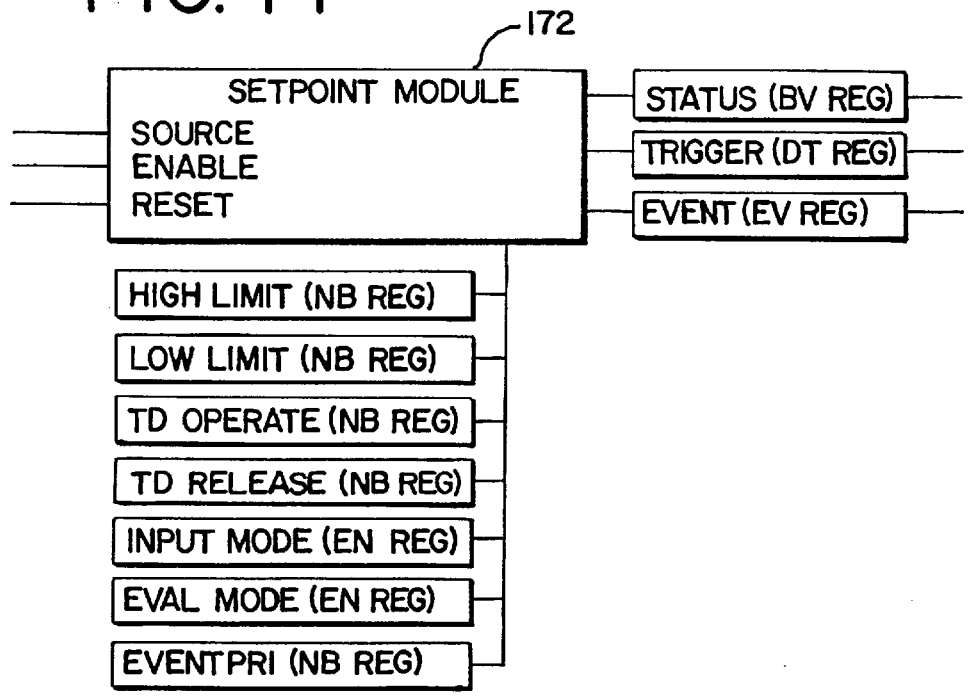
FIG. 14 schematically illustrates a preferred embodiment of the Setpoint module and its respective registers.
Figure 13B:
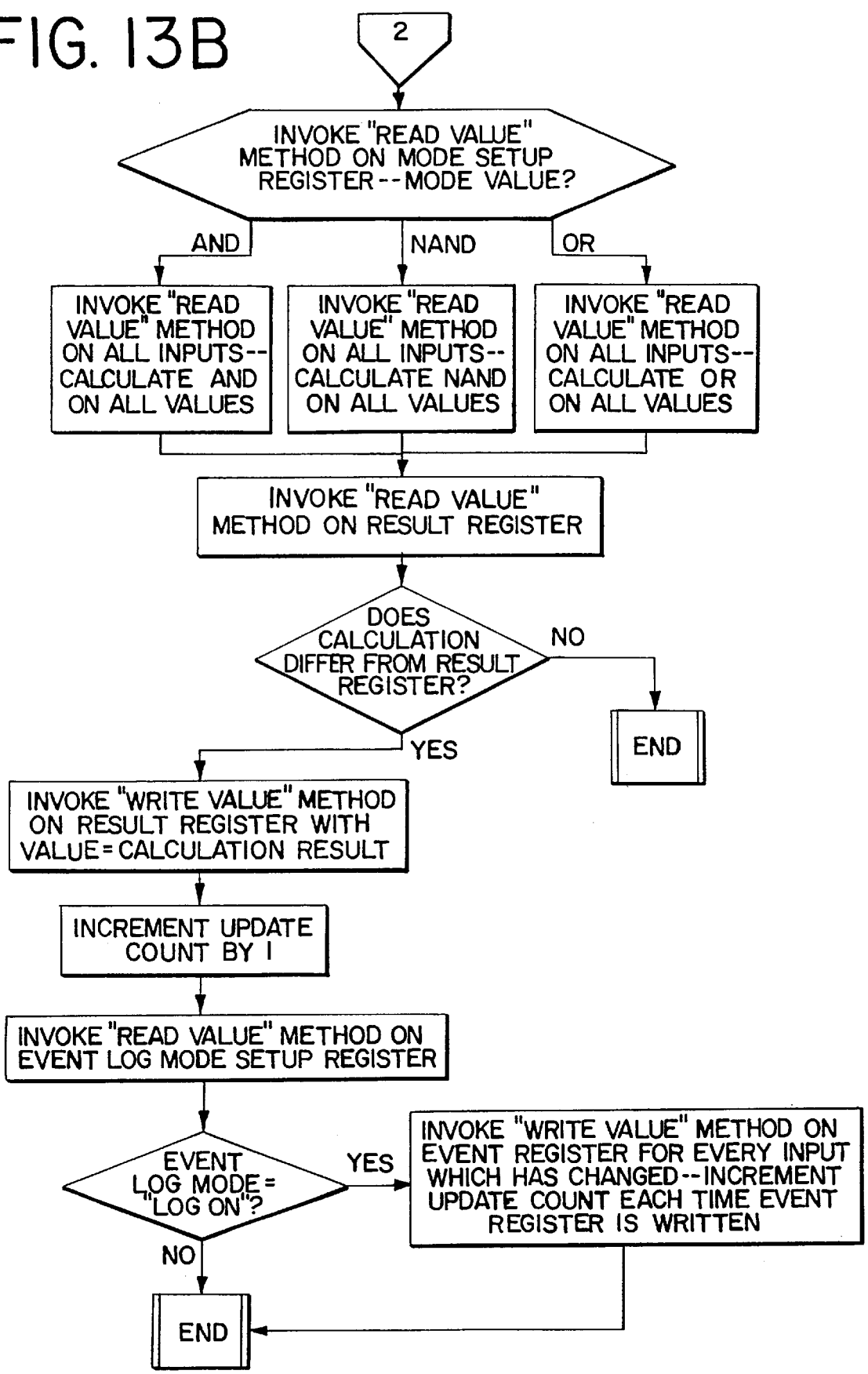
Figure 14A:
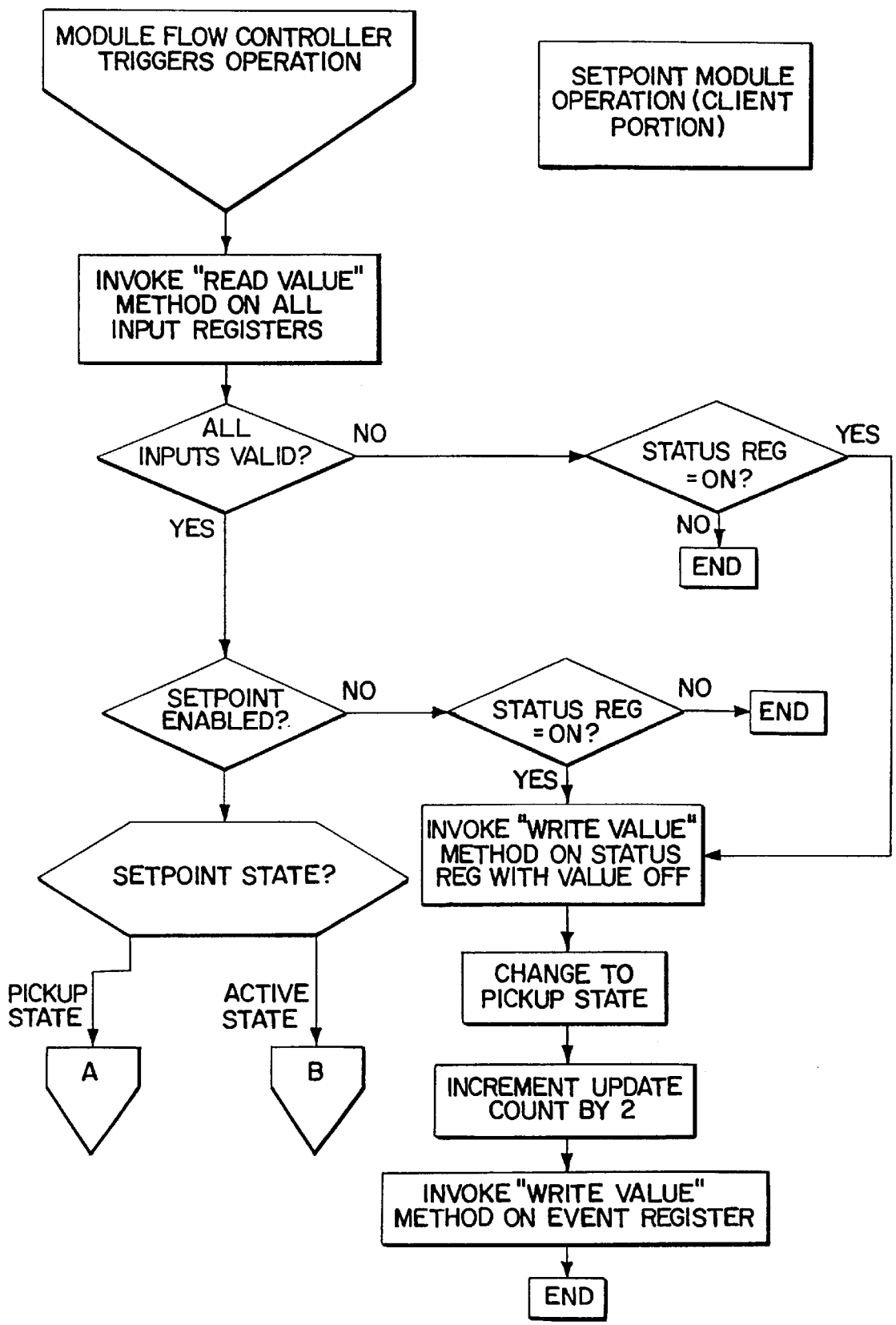
Figure 14C:
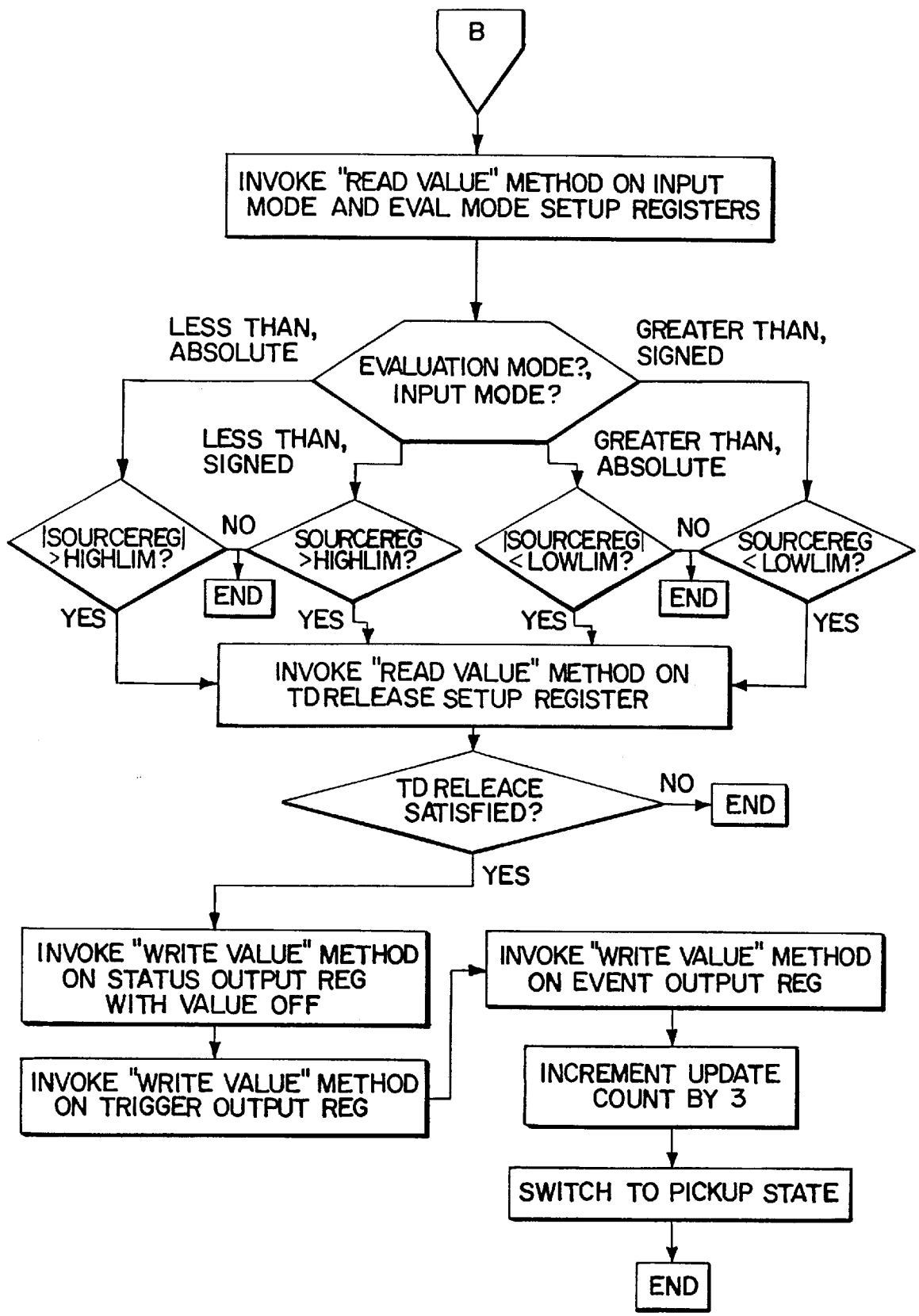

Additional modules that operate only on the results of other modules are also possible. An example of one of these modules is the AND/OR module 160 illustrated schematically in FIG. 13. The AND/OR module 160 takes a number of boolean variable register inputs and performs a logical AND or OR on them to create a result. The CalcMode setup register 161 determines which AND or OR function is being executed. The EvLogMode setup register 162 determines whether events will be generated in the Event output register 163 when the Result 164 register changes. The logic for a preferred embodiment of the client portion of the AND/OR module 160 is illustrated in FIGS. 13A–13B in flowchart form. The setpoint module 172 is shown schematically in FIG. 14. The logic for a preferred embodiment of the client portion of the setpoint module 172 is shown in FIGS. 14A–14C. These modules do not interface to the outside world.

Figure 15A:
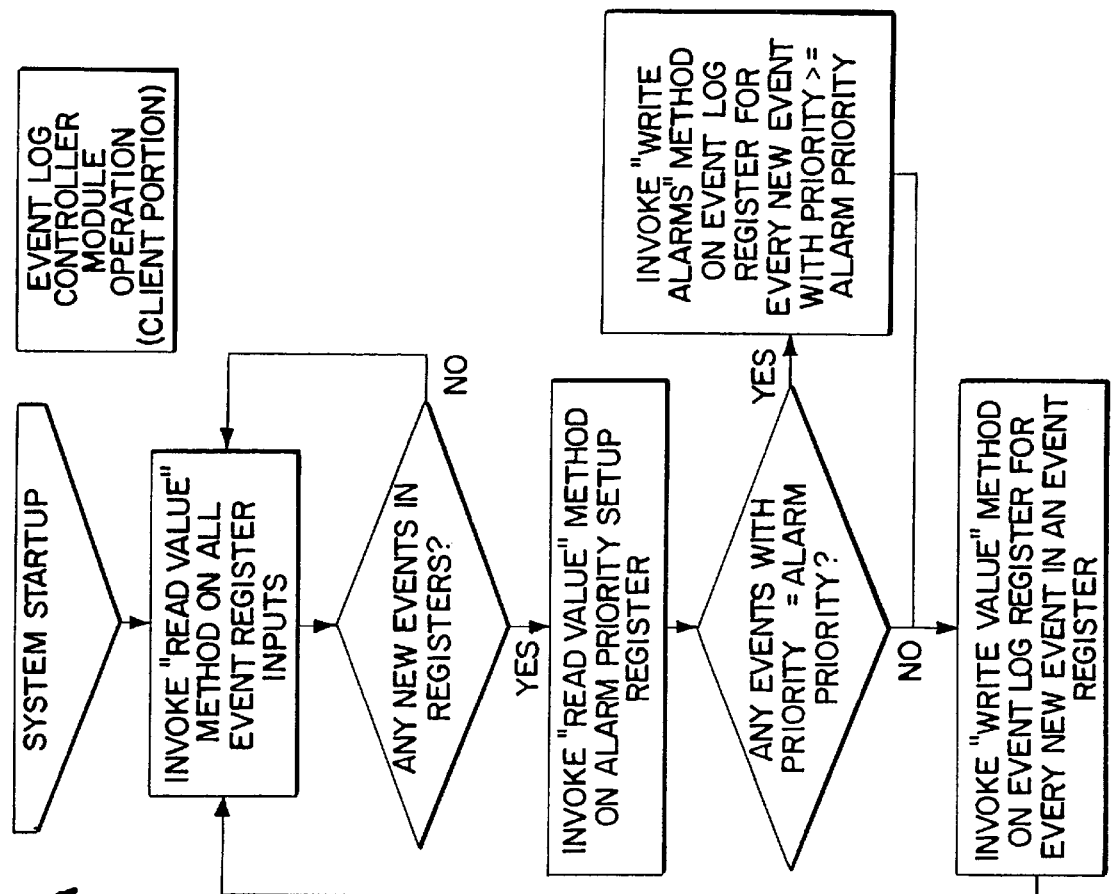
FIG. 15A shows a flowchart of a preferred embodiment of the logic for the client portion of the EventLog module.
Figure 15:
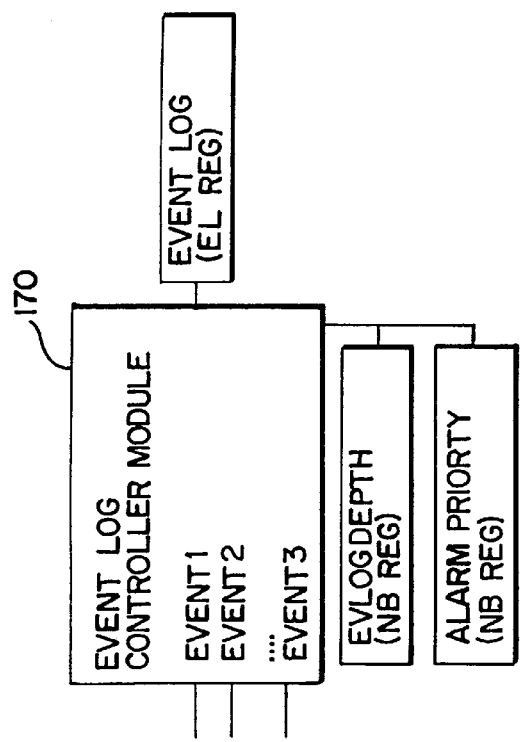
FIG. 15 schematically illustrates a preferred embodiment of the EventLog module and its respective registers.

Another module of note is the EventLog module 170. The EventLog module is shown schematically in FIG. 15. A flowchart of a preferred embodiment for the client portion of the EventLog module is shown in FIG. 15A. Nearly all other modules within the device are connected to an event output register. When an unusual state arises within a module, it may send an event message to the event register. The EventLog module 170 takes event registers as an input and invokes a method to write the "event" into its event log output register. The result is that the Event Log register then contains a list of all the significant occurrences that have happened on the device. In this manner, the time as well as the effects which occur in the IED may be recorded.

An example of the events that may be generated on the power meter of the present invention can be seen in Table 24.

TABLE 24

| Event # | Time | Cause Label | Cause Value | Effect Label | Effect Value |
|---|---|---|---|---|---|
| 1 | Dec. 15/94 @ 800 | None | External | Motor 4 | Powered Down |
| 2 | Dec. 15/94 @ 800 | Motor 4 | Powered Down | Cooler 7 | Shutdown |
| 3 | Dec. 15/94 @ 923 | kW Phase A | 1000 | Over kWa | True |
| 4 | Dec. 15/94 @ 923 | Over kWa | True | Relay 6 | Closed |

In table 24 a number of events in the system are shown. Event #1 is an event that a digital input module might create if its hardware changed state. In this case, the digital input is connected to the status output of a motor. There is no cause label in this case since the cause is external to the meter. Event #2 shows an event that a digital output module might create. The source input of this digital output module is connected as the state output of the digital input module. Event #3 is an event that a setpoint module might create. The setpoint module has detected that the amount of power being consumed is too great so its status output register is set to true. This status output register is connected as the source input register to another digital output module. In Event #4 the digital output module is shown to close a relay. Therefore, the fact that kW Phase A has exceeded a certain bounds has caused an external relay to close (hopefully rectifying the problem).

A significant feature of the disclosed architecture is that the modules can be linked in arbitrary fashions to form arbitrary functional blocks comprised of networked objects.

Figure 16:
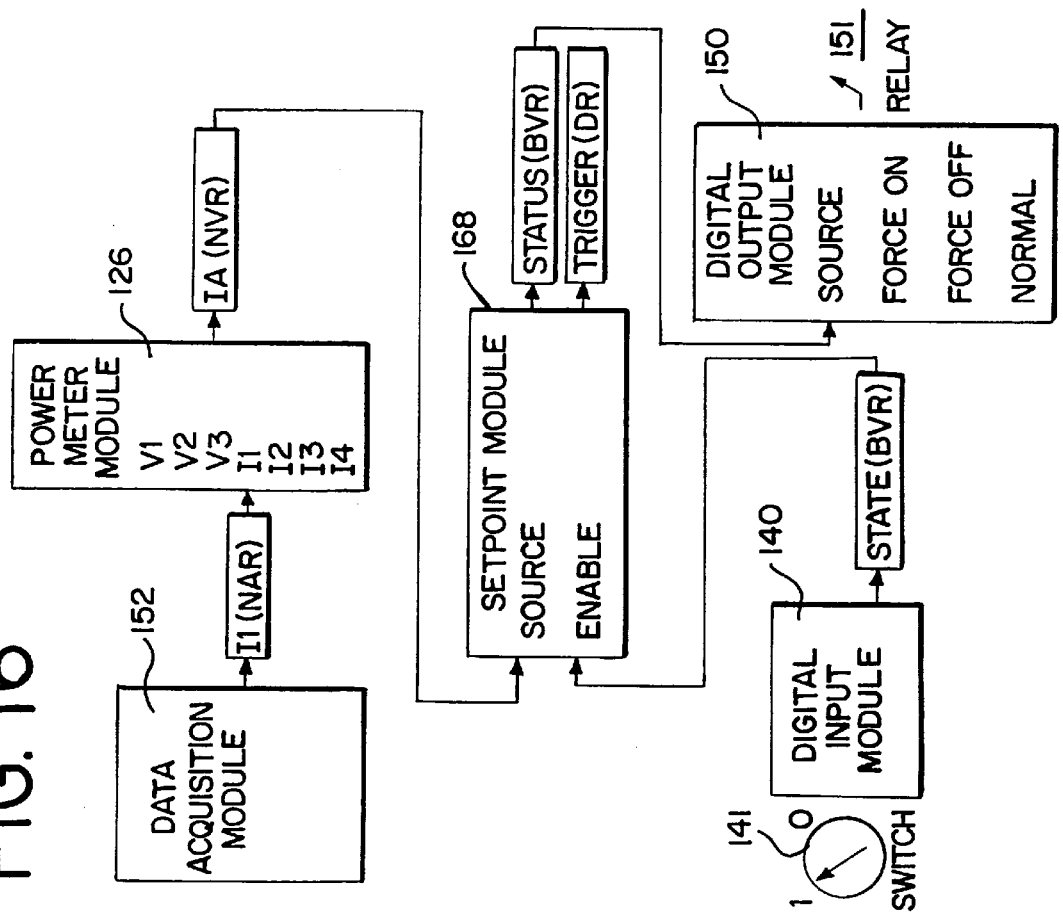
FIG. 16 shows an example application using the object oriented structure of this invention.

An example application using the architecture of this invention is shown in FIG. 16. In this example, a setpoint module 172 is used to monitor Phase A current from the power meter module 126. The setpoint is enabled using a digital input module 140 which is driven by the manual switch 141. The setpoint setup registers are configured so that the setpoint goes ON when the current exceeds 100

Amps. The setpoint status output controls the digital output module 150, which drives a relay 151 which could control a motor (not shown). Whenever the phase A current exceeds 100 Amps and the manual switch 141 is closed, the relay 151 will be closed causing the motor to turn off. (Note: in this example setup registers and other registers that are not needed for the example are not shown.) It will be appreciated by those skilled in the art that the number and variety of possible additional modules and applications is unlimited.

Figure 17A:
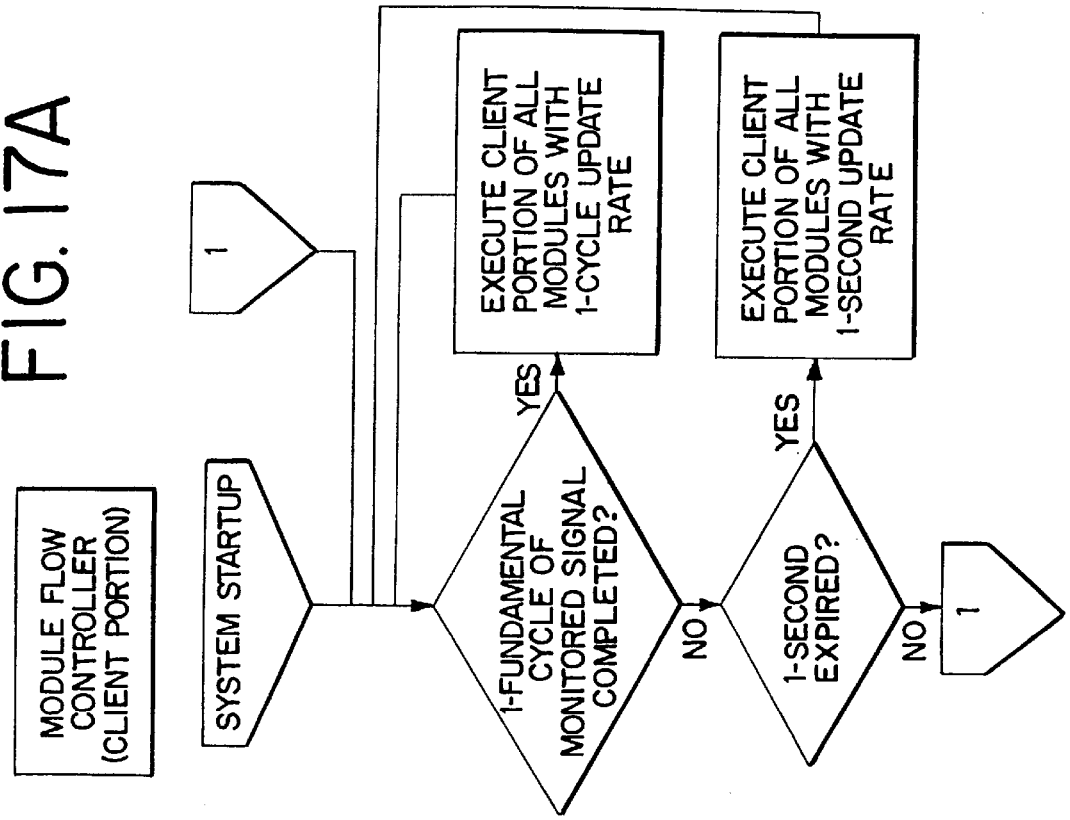
FIGS. 17A–17B show the operation of the Module Flow Controller.
Figure 17B:
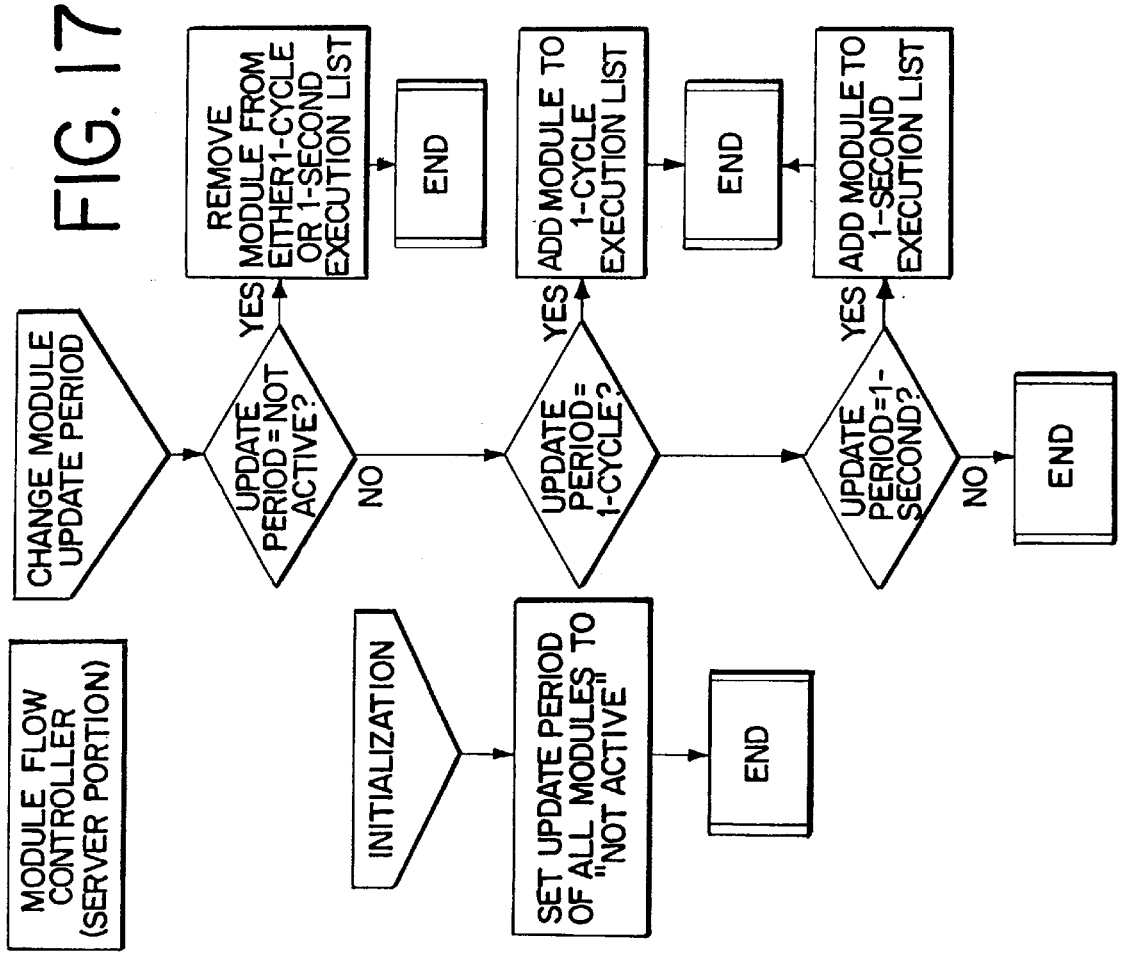

The operation of most of the modules in the IED is governed by the client portion of the module flow controller. A flow chart for the execution of the client portion of the module flow controller is shown in FIG. 17A. The module flow controller causes different modules within the device to execute. The module flow controller only triggers modules to execute that have valid input registers. Therefore, any modules that do not meet this requirement do not use any of the processing power available to the device. The server portion of the module flow controller is executed when a module has the write input handles method invoked on it. A flow chart for the operation of the server portion of the module flow controller is shown in FIG. 17B. The server portion of the module flow controller records whether the input handles being written are valid or not. The client portion then uses this information when it makes its decision on whether to execute the module or not.

Figure 18:
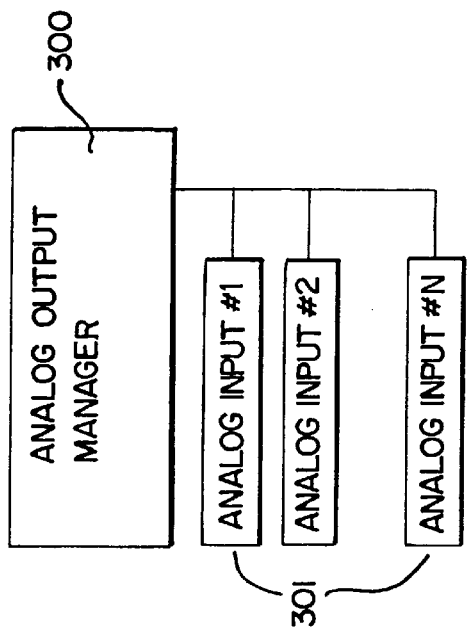
FIG. 18 schematically illustrates a preferred embodiment of the analog output manager.
Figure 18A:
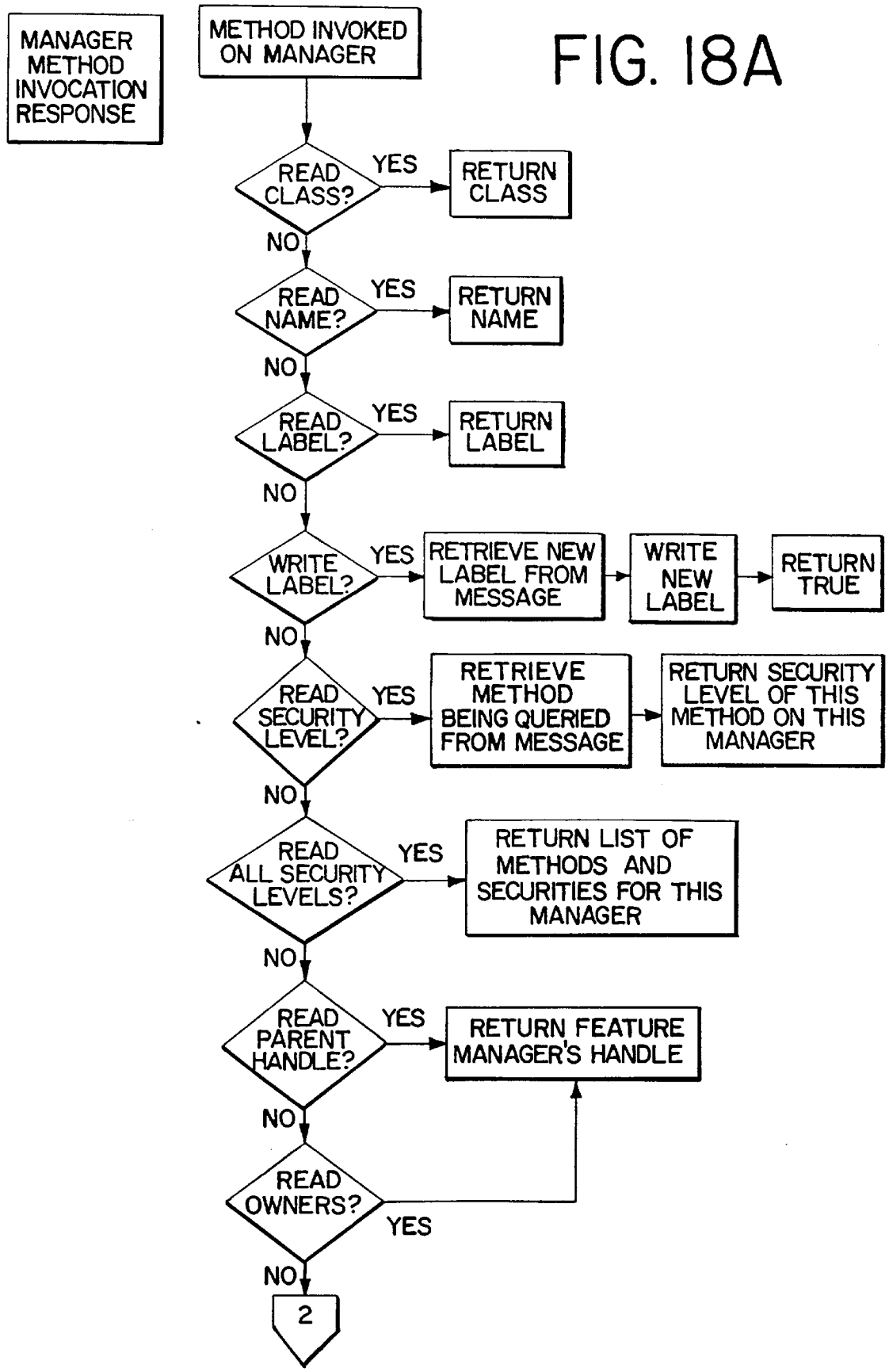
FIGS. 18A–18B show a flowchart of a preferred embodiment of the logic for the application of a manager.
Figure 18B:
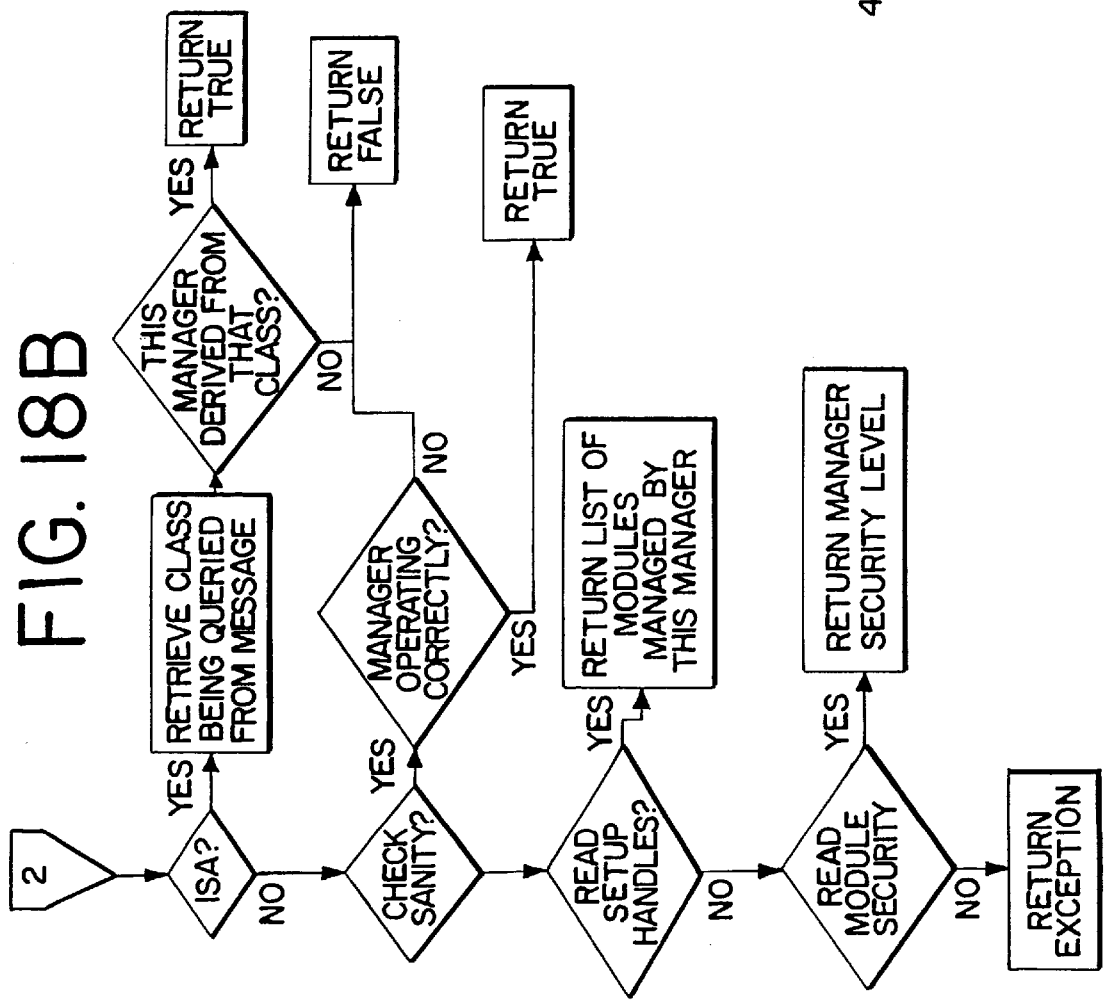

FIG. 18 schematically illustrates a preferred embodiment of a manager, the analog output manager 300. A flow chart for the logic for the server portion of a manager is shown in FIGS. 18A–18B. In the present embodiment, managers have no client portion. There is one resource manager 300 for each type of module. Each resource manager 300 may have many modules below it.

Figure 19:
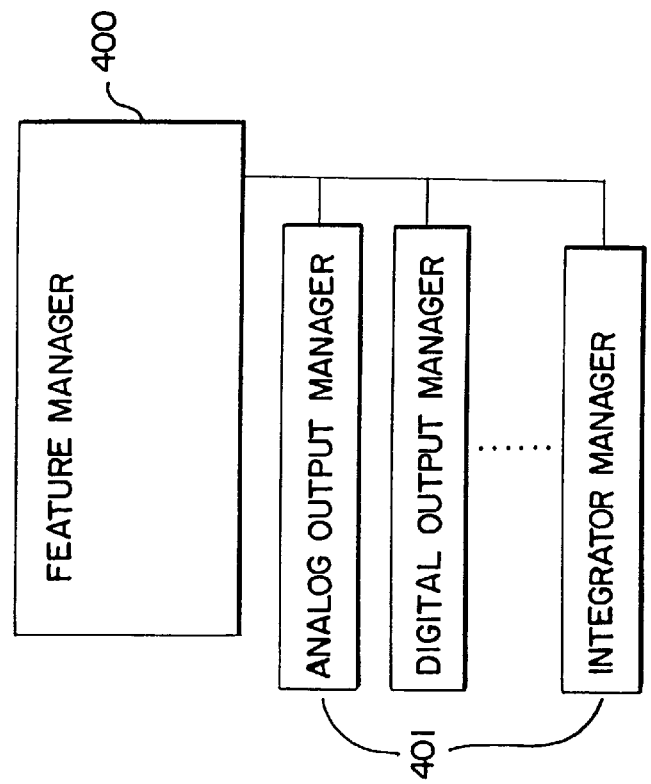
FIG. 19 schematically illustrates a preferred embodiment of the feature manager.
Figure 19A:
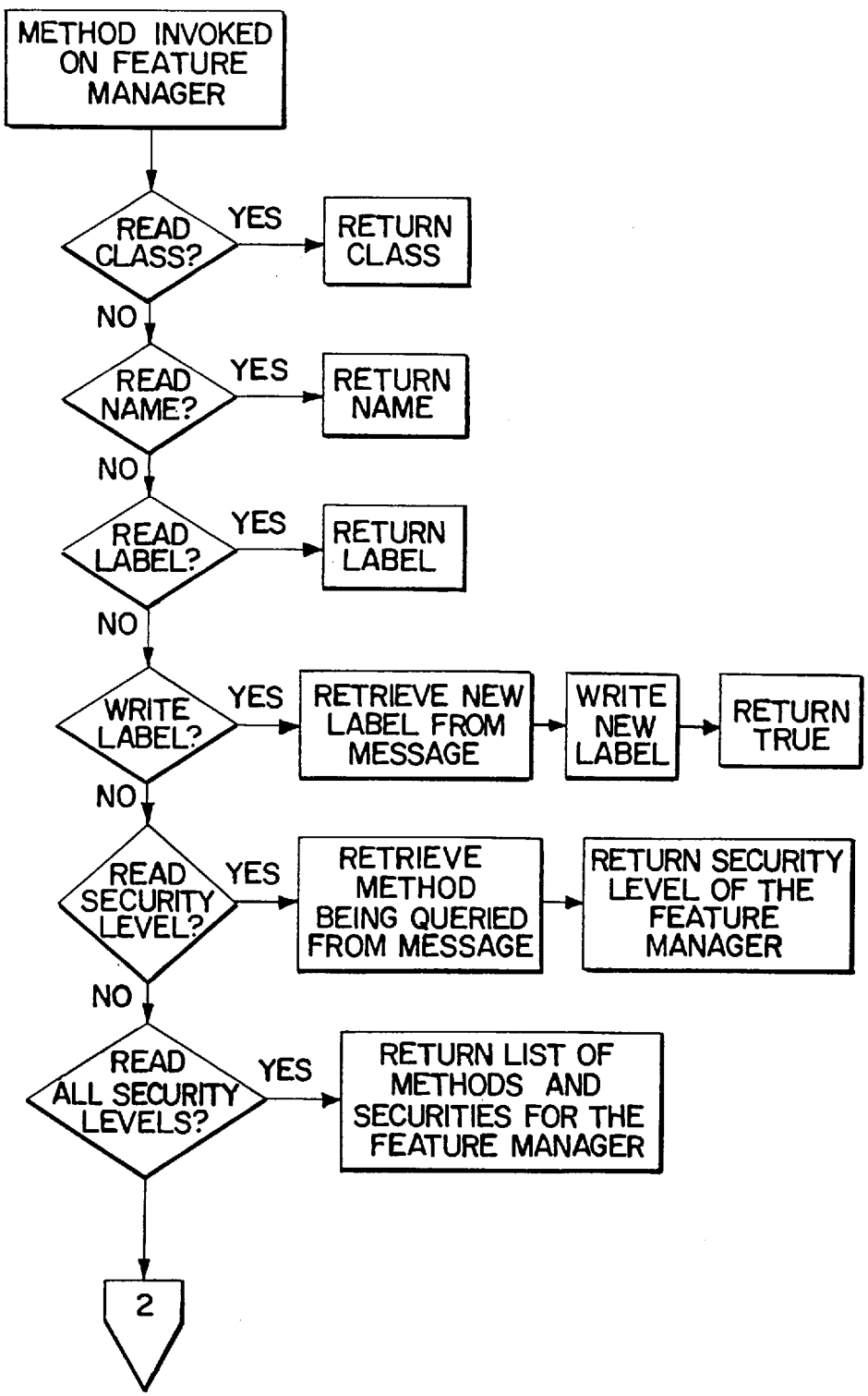
FIGS. 19A–19B show a flowchart of a preferred embodiment of the logic for the server portion of the feature manager.
Figure 19B:
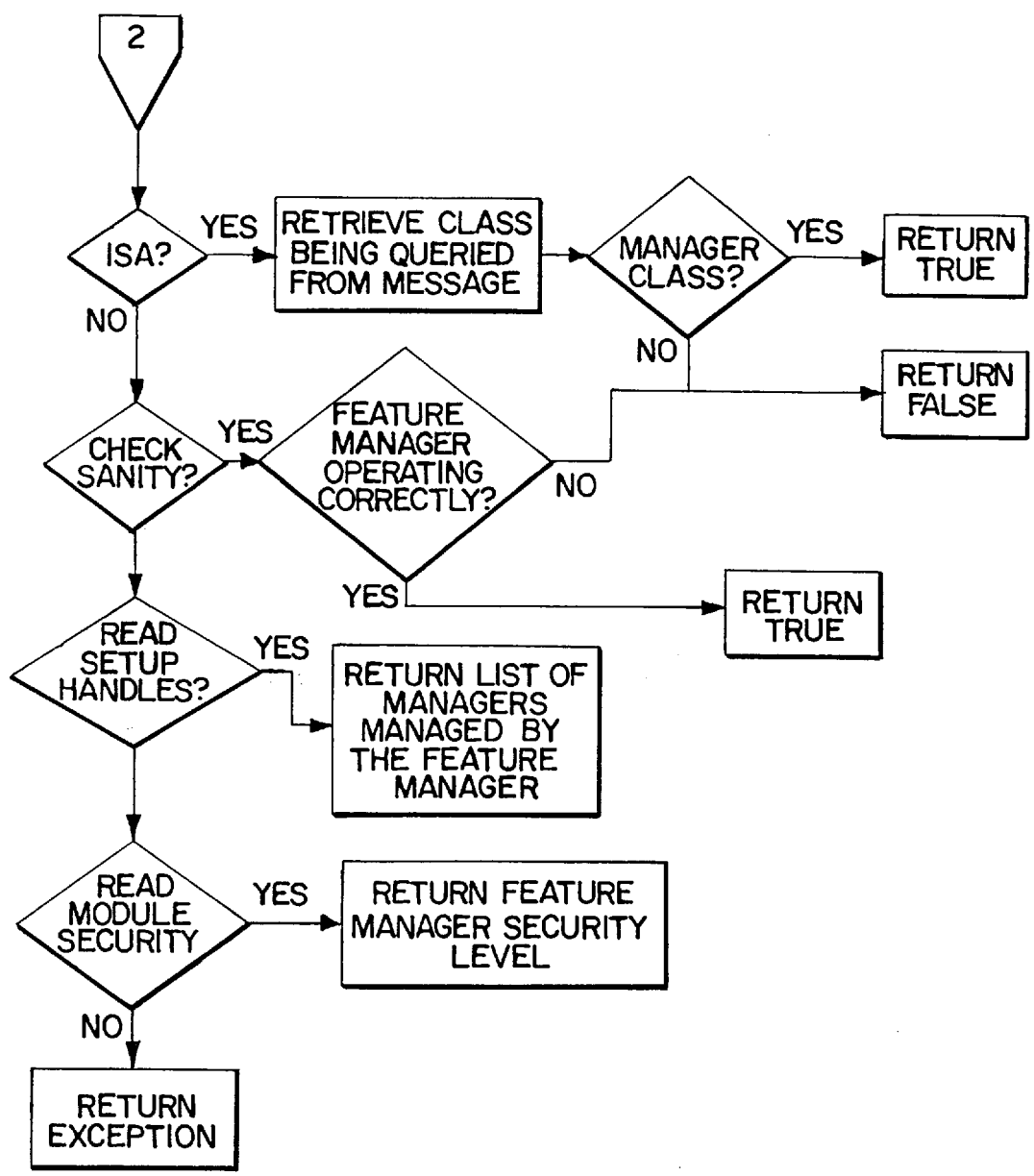

Every manager 300 in an IED resides beneath the feature manager for the device. A preferred embodiment of feature manager 400 is schematically shown in FIG. 19. A flow chart for the logic of the server portion of the feature manager is show in FIGS. 19A–19B. All the managers on the device appear as setup registers 401 to the feature manager 400. The feature manager 400 controls access to the entire device 100. Starting from the feature manager 400, a master device, such as PC 114, can determine all input, output and setup registers for every module on the IED device 100.

Each manager is said to own all the modules that appear as its setup registers. The feature manager is said to own the resource managers that appear as setup registers to it. Therefore, a hierarchy of modules exists with the feature manager on top.

In order for a master device, such as PC 114, to access the information in a slave device, such as the IED 100, it invokes methods on the managers, modules or registers. In order for a master to execute a method on a slave, it must have a handle. The handle indicates which manager, module or register the method is to be acted on. For example, the handle for the feature manager for any type of slave device is 2 in the current embodiment. This is the only thing that is fixed in the architecture and every type of device has a feature manager with a handle of 2. From this handle, the entire configuration of the device can be determined.

With the configuration of the present invention, the slave device, such as the IED's 100 may have the capability to execute many different objects, but only a limited number of objects can be executed at any one time due to processing power constraints. The flow control client controls the operation of modules. Therefore, only the modules that have valid input, output and setup registers connected to them are executed.

In order for a master device, such as a PC 114, to determine the configuration of a slave device without the master device having any previous knowledge of the configuration, the master device invokes certain methods on the feature manager. These methods are fixed in the architecture. In other words, every feature manager for every different type of slave device will interpret these methods in the same way. For instance, the master device may invoke the method Read Setup Handles on the feature manager which requests a list of the managers that reside beneath it. From this list, the master device can then go to each individual manager and request the operating modules beneath them by again executing the method Read Setup Handles. Once the master device knows which modules are operating, it can request of each module its currently connected input, output and setup registers using the appropriate methods and thus determine the entire configuration of the device. Thus, without any prior knowledge of the slave device, or its configuration, the master device can determine all characteristics of the device. The master device can then invoke other methods to change the configuration of the device. The slave devices, however can operate autonomously without the involvement of the master devices.

Thus, the slave devices, such as power monitors, can be readily configured to exactly match a user's unique requirements and to provide the ability to do so without interrupting the operation of the rest of the functions the device is performing. The slave devices, such as the IEDs, can be networked to one or more computers and the slave devices can be configured or reconfigured via the communications network.

Further, with the present invention, it is not necessary to change the software on a master device when a slave device is upgraded.

The modules are independent or autonomous. Thus, when a module is modified, there is no need to modify the other modules. As used herein the term "independent modules" means that modifications or changes can be made to one or more modules without a need to modify the remaining modules (i.e. a modification to one module has no effect on the operation or functionality of the other modules.

The feature manager keeps a count of how many times the configuration of the device has been changed. A master can invoke a the method Read Module setups counter on the feature manager to request this count. If there are multiple masters changing the configuration of the device, each master need only request this count from the feature manager to determine if the configuration of the device has been changed.

The feature manager also contains a count of how many times the modules below it have updated their output registers. Each individual manager has a count of how many times the modules below it have updated their output registers and each individual module has a count as well. Therefore, if a master device executes the method Read Module Updates Counter and finds that none of the modules under a certain manager have updated their output registers since the last time the master read the values in the registers, the master does not need to waste communications bandwidth reading the same values again.

Methods and Modules are preferably assigned a security level. This permits the system to be configured such that certain users have access to all of the system functions while other users have access to only selected functions.

The Read Security Level, Read All Security Levels and Read Module Security methods can be used to determine what level of authorization is necessary to access the various methods and modules in the system.

The foregoing description of the preferred embodiments of the present invention has been presented for purposes of illustration and description. The described embodiments are not intended to be exhaustive or to limit the invention to the precise forms disclosed. Obviously many modifications and variations are possible in light of the above teachings. The embodiments which were described were chosen in order to best explain the principles of the invention and its practical applications. It is intended that the scope of the invention be defined by the following claims, including all equivalents.

We claim:

1. A digital device comprising:
   a processor;
   object logic operatively connected to be executed by the processor, the object logic comprising a plurality of independent modules, each module defined by an active object which receives a message and executes a predefined method and which can invoke methods on other objects;
   the object logic comprising a plurality of manager modules, each of the manager modules organizing a plurality of objects into a hierarchical structure and providing access to all objects below the manager in the hierarchy; and
   one of the manager modules comprising a feature manager which organizes the other manager modules into a hierarchical structure from which the entire configuration of the digital device can be ascertained.

2. The digital electronic device of claim 1 wherein the manager modules can create other modules.

3. The digital device of claim 1 wherein the object logic further comprises a plurality of registers defining server objects which can respond to method invocations from the modules.

4. The digital device of claim 3 wherein the registers are linked to respective modules and wherein at least one link between one of the modules and one of the registers is programmable.

5. The digital device of claim 3 wherein the manager module can destroy modules.

6. The intelligent electronic device of claim 3 wherein a method can be invoked on the manager module to determine the addresses of the module which exist in the hierarchy.

7. The intelligent electronic device of claim 1 wherein a method can be invoked on the manager module to determine what modules exist in the hierarchy of the manager module.

8. The intelligent electronic device of claim 1 wherein the object logic comprises logic to determine if any module in the manager's hierarchy has been reconfigured, and wherein a method can be invoked on the manager module to determine if any module in the manager's hierarchy has been reconfigured.

9. The intelligent electronic device of claim 1 wherein the object logic comprises logic to determine if any module in the manager's hierarchy has been updated, and wherein a method can be invoked on the manager module to determine if any module in the the manager's hierarchy has been updated.

10. The digital device of claim 1 wherein the object logic comprises an event log module, with associated event log registers which record the cause of events which occur in the digital device.

11. The digital device of claim 7 wherein the event log module and associated event log registers record the time of events which occur in the digital device.

12. The digital device of claim 10 wherein the event log module and associated event log registers record the effect of the events.

13. The digital device of claim 1 wherein the modules are configured such that a plurality of modules can be arbitrarily linked to form arbitrary functional blocks.

14. The digital device of claim 1 wherein at least one of the modules comprises a module operatively connected to receive a digital signal as an input and generate measured parameters therefrom.

15. A monitoring system for monitoring a plurality of parameters, the system comprising;
   a plurality of digital devices, each including a processor, object logic operatively connected to be executed by the processor, the object logic comprising a plurality of independent modules, each module defined by an active object which receives input data and generates data according to a predefined function and which can invoke methods on other output objects, and at least one of the modules comprising a module operatively connected to receive a message as input data and generate parameters therefrom;
   a computer including a processor and object logic comprising a plurality of independent modules, each module defined by an active object which receives input data and generates output data according to a predefined function and which can invoke methods on other objects including the modules on the plurality of digital devices, the object logic defining a virtual digital device; and
   a communication network connecting the plurality of digital devices to the central computer.

16. A digital device comprising:
   a processor;
   object logic operatively connected to be executed by the processor, the object logic comprising a plurality of independent modules, each module defined by an active object which receives input data and generates output data according to a predefined function and which can invoke methods on other objects;
   at least one of the modules comprising a manager module which organizes objects into a hierarchical structure.

17. The digital device of claim 16 wherein the object logic further comprises a plurality of manager modules, each of the manager modules organizing a plurality of objects into a hierarchical structure and providing access to all objects below the manager in the hierarchy.

18. The digital device of claim 16 wherein said manager module comprises a feature manager which organizes other manager modules into a hierarchical structure from which the entire configuration of the digital device can be ascertained.

* * * * *

UNITED STATES PATENT AND TRADEMARK OFFICE
CERTIFICATE OF CORRECTION

PATENT NO. : 5,828,576
DATED : October 27, 1998
INVENTOR(S) : Gregory R. Loucks et al.

It is certified that error appears in the above-identified patent and that said Letters Patent is hereby corrected as shown below:

On the Title Page

In column 1, item [73], please change "measurement" to --Measurement--.

In claim 9, line 5, please delete "the" (second occurrence).

Signed and Sealed this

Tenth Day of April, 2001

Attest:

NICHOLAS P. GODICI

Attesting Officer     Acting Director of the United States Patent and Trademark Office